US011095843B2

(12) United States Patent
Mostafalu et al.

(10) Patent No.: US 11,095,843 B2
(45) Date of Patent: Aug. 17, 2021

(54) IMAGING DEVICES AND IMAGING APPARATUSES, AND METHODS FOR THE SAME

(71) Applicant: Sony Semiconductor Solutions Corporation, Kanagawa (JP)

(72) Inventors: Pooria Mostafalu, Penfield, NY (US); Sungin Hwang, Pittsford, NY (US); Frederick Brady, Webster, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/700,660

(22) Filed: Dec. 2, 2019

(65) Prior Publication Data

US 2021/0168316 A1 Jun. 3, 2021

(51) Int. Cl.
*H04N 5/378* (2011.01)
*H01L 27/146* (2006.01)

(52) U.S. Cl.
CPC ....... *H04N 5/378* (2013.01); *H01L 27/14605* (2013.01); *H01L 27/14612* (2013.01)

(58) Field of Classification Search
CPC .......................... H04N 5/378; H01L 27/14605
See application file for complete search history.

(56) References Cited

U.S. PATENT DOCUMENTS

2020/0084403 A1* 3/2020 Suh .................. H04N 5/379

OTHER PUBLICATIONS

Son et al., "4.1 A 640×480 dynamic vision sensor with a 9μm pixel and 300Meps address-event representation," 2017 IEEE International Solid-State Circuits Conference (ISSCC), Feb. 5-9, 2017, pp. 66-67. Abstract only.

* cited by examiner

*Primary Examiner* — Christopher K Peterson
(74) *Attorney, Agent, or Firm* — Sheridan Ross P.C.

(57) ABSTRACT

An imaging device includes a first pixel including a first photoelectric conversion region disposed in a first substrate and that converts incident light into first electric charges, and a first readout circuit including a first converter that converts the first electric charges into a first logarithmic voltage signal. The first converter includes a first transistor coupled to the first photoelectric conversion region and a second transistor coupled to the first transistor. The imaging device includes a wiring layer on the first substrate and includes a first level of wirings arranged in a first arrangement overlapping the first photoelectric conversion region and in a second arrangement overlapping the first and second transistors, the second arrangement being different than the first arrangement.

20 Claims, 40 Drawing Sheets

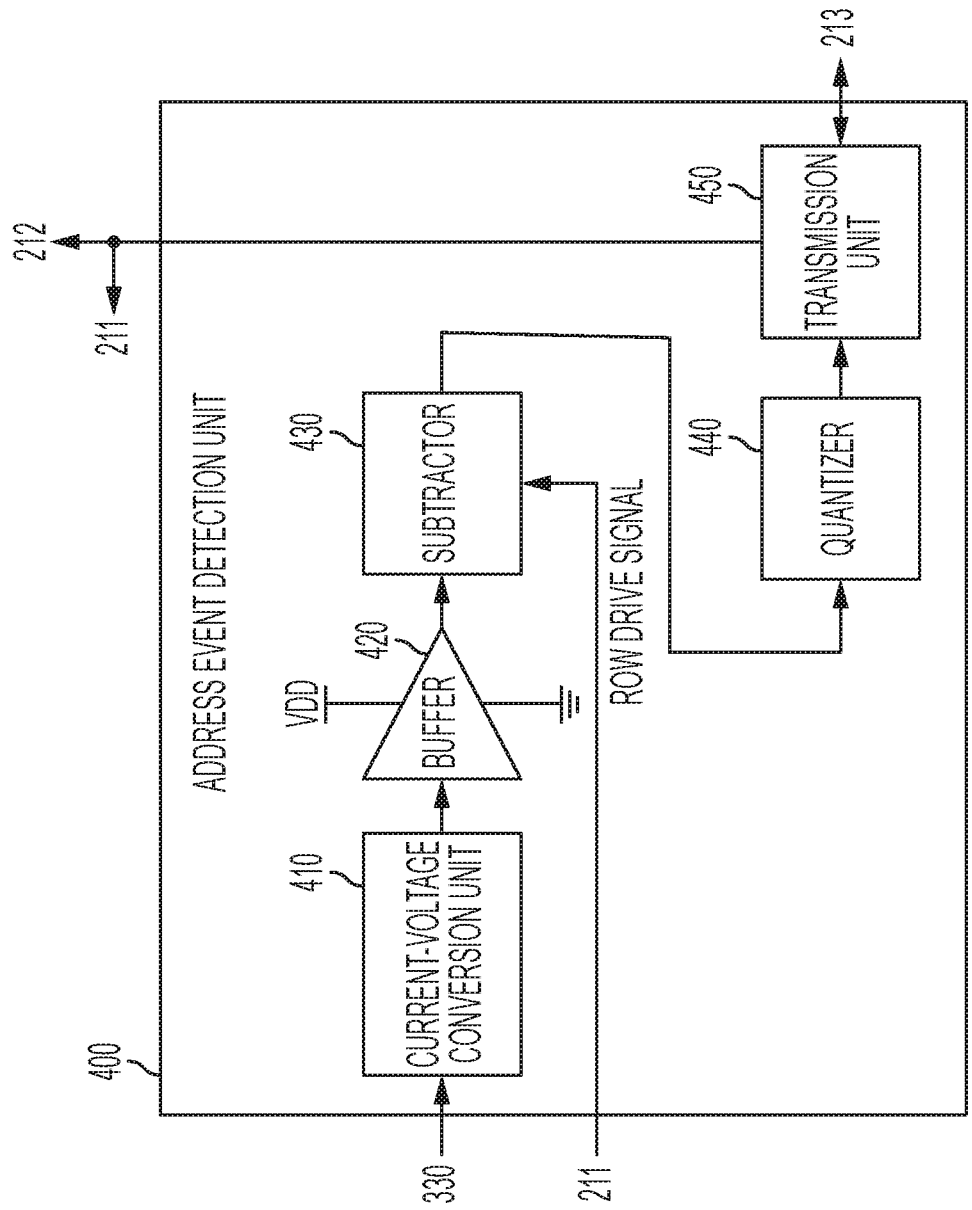

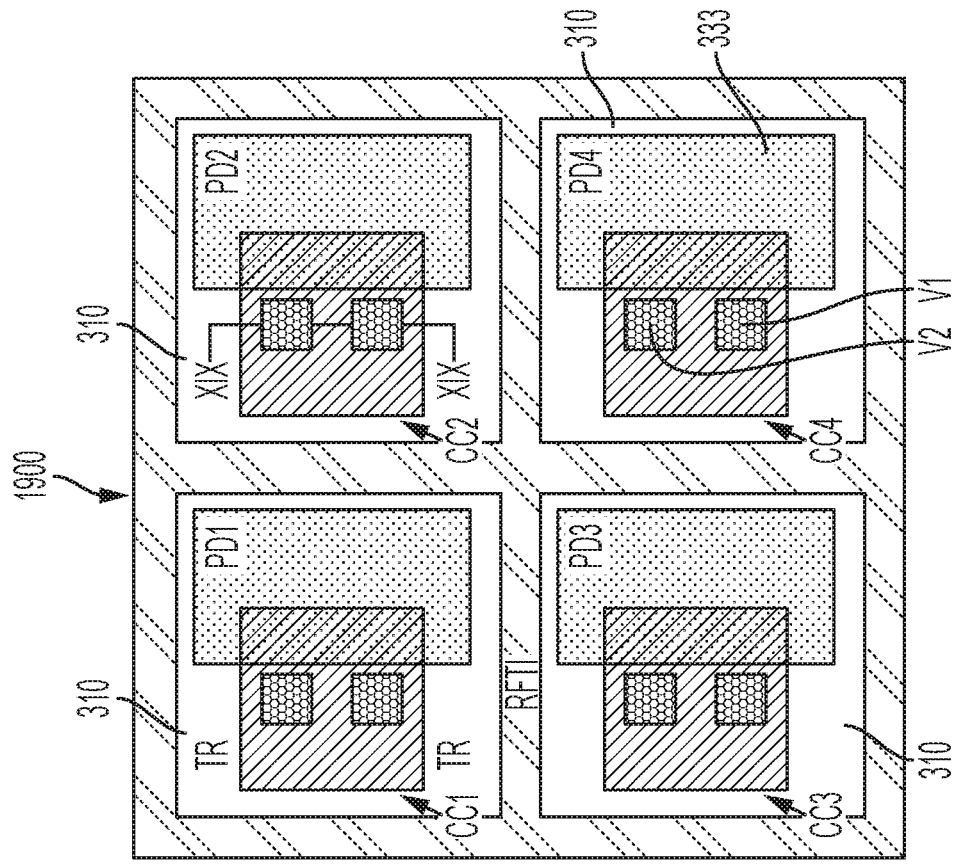
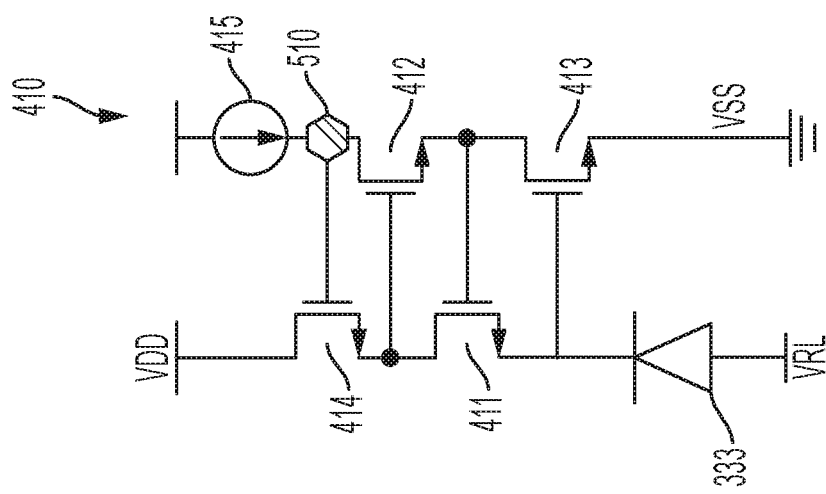
FIG. 19A

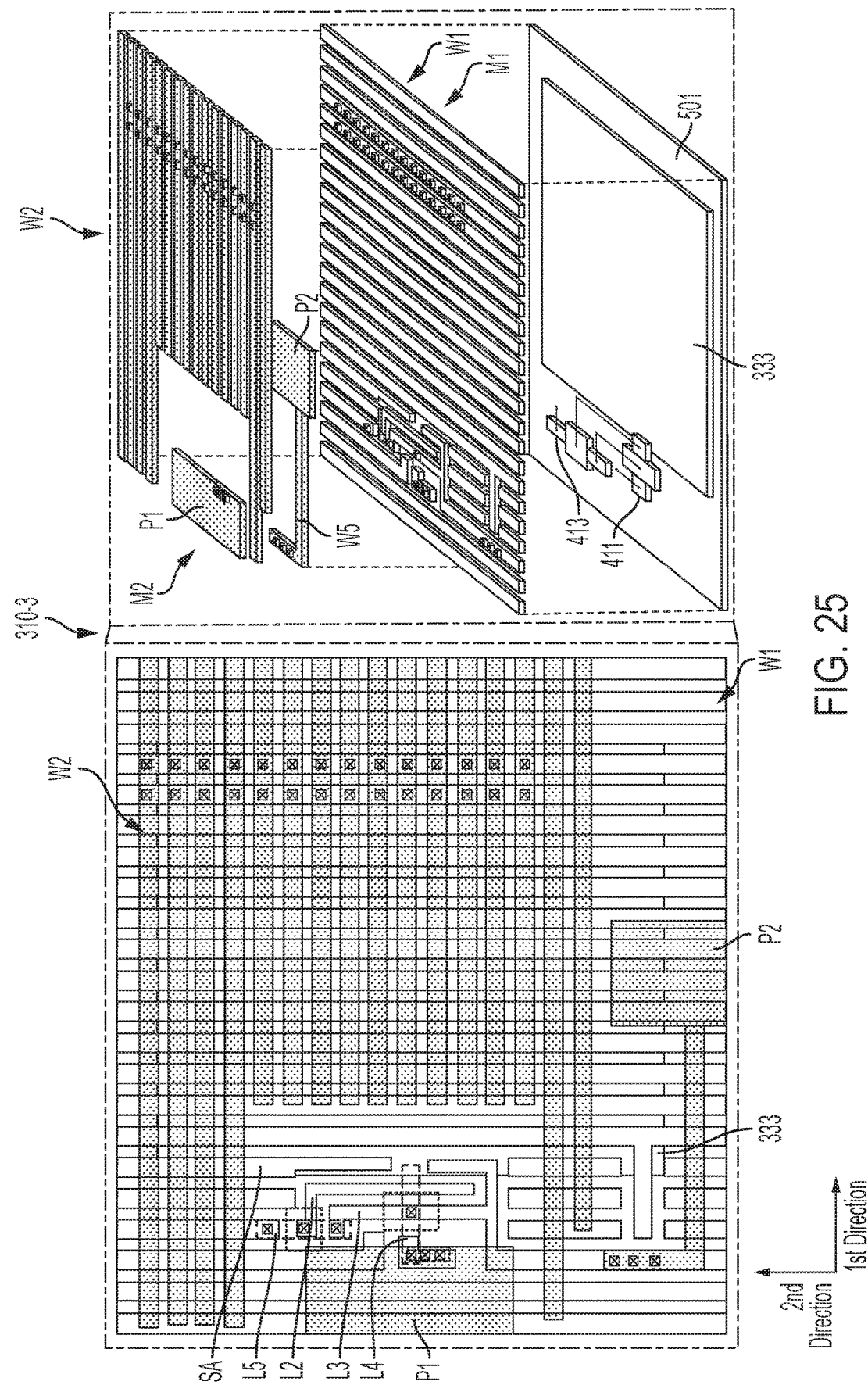

IMAGING DEVICES AND IMAGING APPARATUSES, AND METHODS FOR THE SAME

TECHNICAL FIELD

The present disclosure relates to an imaging device with dynamic vison sensor capabilities.

BACKGROUND

In the related art, a synchronization-type imaging device that captures image data in synchronization with a synchronization signal such as a vertical synchronization signal has been used in an imaging device and the like. In the typical synchronization-type imaging device, it is difficult to acquire image data for every period of the synchronization signal (for example, for every 1/60 seconds), and thus it is difficult to cope with cases in which relatively high-speed processing is demanded, such as in fields demanding high speed (e.g. real time) processing, such as autonomous vehicles, robotics, and the like.

SUMMARY

Technical Problem

At least one example embodiment provides a non-synchronization-type imaging device in which a detection circuit is provided for every pixel to detect a situation in which a light contrast exceeds a threshold value as an address event in real time. The non-synchronization-type imaging device that detects the address event for every pixel is also referred to as a dynamic vision sensor (DVS). A DVS system uses a circuit configuration for detecting the address event in addition to a circuit configuration for reading out a pixel signal of a voltage value corresponding to a light-reception amount, and thus an occupation ratio of a light-receiving element on a light-receiving surface decreases because these two circuit configurations are formed in the same substrate as the light-receiving element. Such 2-D architecture results in bottlenecks due to wiring congestion that causes reduced design flexibility, increased dark noise, and/or limited sensitivity and speed.

Therefore, example embodiments provide imaging devices which are capable of reducing noise, providing more design flexibility, and/or improving sensitivity and speed.

Solution to Problem

According to an aspect of the present technology, an imaging device includes a first pixel including a first photoelectric conversion region disposed in a first substrate and that converts incident light into first electric charges, and a first readout circuit including a first converter that converts the first electric charges into a first logarithmic voltage signal. The first converter includes a first transistor coupled to the first photoelectric conversion region and a second transistor coupled to the first transistor. The imaging device includes a wiring layer on the first substrate and a first level of wirings arranged in a first arrangement overlapping the first photoelectric conversion region and in a second arrangement overlapping the first and second transistors, the second arrangement being different than the first arrangement.

A first capacitance exists between a first node coupled to the first photoelectric conversion region and a second node coupled to the first photoelectric conversion region, a second capacitance exists at least between the first node and a third node that is coupled to the first and second transistors, and the second arrangement achieves a desired ratio of the second capacitance to the first capacitance.

The desired ratio of the second capacitance to the first capacitance is about 0.32.

The first node is between a cathode of the photoelectric conversion region and the first transistor, the second node is between an anode of the photoelectric conversion region and a common node that receives a potential, and the third node is between a gate of the first transistor and the second transistor.

The potential is a negative potential, a source of the first transistor is coupled to the first photoelectric conversion region, and the source is wider than a drain of the first transistor in a plan view.

The first arrangement includes linear wiring segments positioned at regular intervals that extend in a first direction or a second direction perpendicular to the first direction, and the second arrangement includes one or more non-linearly shaped wiring segments.

The one or more non-linearly shaped segments include a first non-linearly shaped segment overlapping a gate of the first transistor and a drain of the second transistor, and a second non-linearly shaped segment overlapping a drain of the first transistor and a gate of the second transistor.

The wiring layer further comprises a second level of wirings that overlap the first pixel. The second level of wirings include third wirings that overlap the first photoelectric conversion region and that extend in the first direction or the second direction.

The imaging device includes a second substrate bonded to the first substrate and including a logic circuit for processing the first logarithmic voltage signal. The first wirings of the first level of wirings and the third wirings of the second level of shield the second substrate from light that has passed through the photoelectric conversion region.

In a plan view, the third wirings exist in spaces between the first wirings.

The first converter further comprises a third transistor and a fourth transistor.

The first level of wirings and the second level of wirings receive at least one signal for the first converter.

The at least one signal includes one or more of a power supply signal, a ground signal, and a common signal with a negative potential.

The imaging device includes a second pixel including a second photoelectric conversion region disposed in the first substrate and that converts incident light into second electric charges, and a second readout circuit including a second converter that converts the second electric charges into a second logarithmic voltage signal. The second converter includes a third transistor coupled to the second photoelectric conversion region and a fourth transistor coupled to the third transistor. A third capacitance exists between a fourth node coupled to the second photoelectric conversion region and a fifth node coupled to the second photoelectric conversion region, and a fourth capacitance exists between the fourth node and a sixth node that is coupled to the third and fourth transistors. The imaging device includes an isolation structure between the first pixel and the second pixel. The first level of wirings overlap the second pixel and are arranged to achieve a desired ratio of the third capacitance to the fourth capacitance.

According to an aspect of the present technology, an imaging device includes a first pixel including a first photoelectric conversion region disposed in a first substrate and that converts incident light into first electric charges, and a first readout circuit including a first converter that converts the first electric charges into a first logarithmic voltage signal. The first converter includes a first transistor coupled to the first photoelectric conversion region and a second transistor coupled to the first transistor. The imaging device includes a wiring layer on the first substrate and including a first level of wirings, and the first level of wirings include a first wiring arrangement including linearly shaped wiring segments overlapping the first photoelectric conversion region. The imaging device includes a second wiring arrangement including one or more non-linearly shaped wiring segments overlapping the first and second transistors.

The linearly shaped wiring segments are arranged at regular intervals and extend in a first direction or a second direction perpendicular to the first direction.

The wiring layer further comprises a second level of wirings further away from the first photoelectric conversion region than the first level of wirings and overlapping spaces between the first level of wirings.

The second wiring arrangement makes electrical connections to the first and second transistors.

The imaging device includes a second substrate bonded to the first substrate. The second substrate includes a logic circuit electrically connected to the first converter through the first level of wirings.

An imaging device includes a first substrate including a first pixel. The first pixel includes a first photoelectric conversion region disposed in the first substrate and that converts incident light into first electric charges, and a first readout circuit including a first converter that converts the first electric charges into a first logarithmic voltage signal. The first converter includes a first transistor coupled to the first photoelectric conversion region and a second transistor coupled to the first transistor. The imaging device includes a wiring layer on the first substrate and including a first level of wirings arranged in a first arrangement overlapping the first photoelectric conversion region and in a second arrangement overlapping the first and second transistors, where the second arrangement is different than the first arrangement. The imaging device includes a second substrate bonded to the first substrate and including a logic circuit for processing the first logarithmic voltage signal.

BRIEF DESCRIPTION OF DRAWINGS

FIG. 6 is a block diagram illustrating a schematic configuration example of an address event detection unit according to at least one example embodiment.

FIG. 19A illustrates an example schematic of the converter in FIG. 5B and an example layout of a bonding pad configuration to electrically connect circuitry in the logic chip to a node according to at least one example embodiment.

FIG. 25 illustrates a plan view and an exploded view of a pixel having an example wiring layout according to at least one example embodiment.

DESCRIPTION OF EMBODIMENTS

Figure 1:
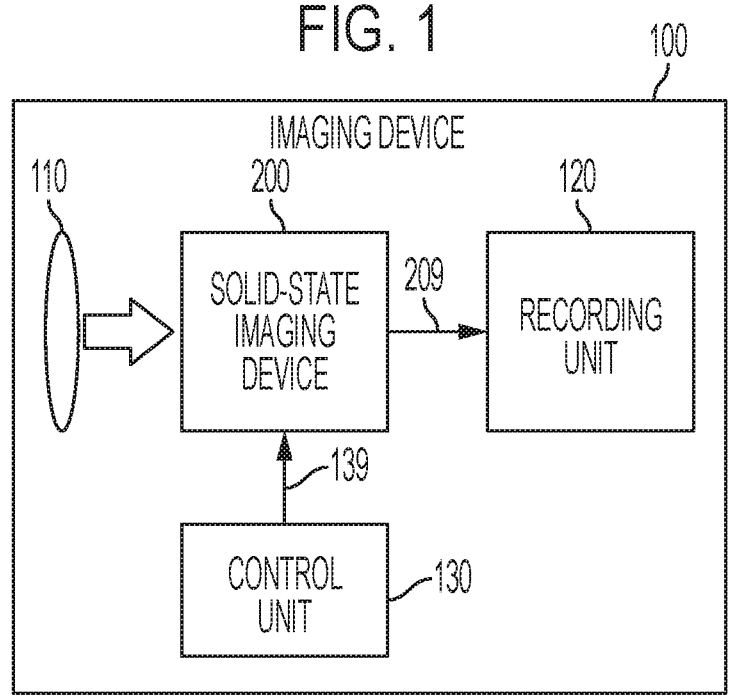
FIG. 1 is a block diagram illustrating a schematic configuration example of an imaging device according to at least one example embodiment.

Hereinafter, an embodiment of the present disclosure will be described in detail on the basis of the accompanying drawings. Furthermore, in the following embodiments, the same reference numeral will be given to the same portion, and redundant description thereof will be omitted.

A typical dynamic vision sensor (DVS) employs a so-called event-driven type driving method in which the existence or nonexistence of address event ignition is detected for every unit pixel, and a pixel signal is read out from a unit pixel in which the address event ignition is detected.

Furthermore, the unit pixel in this description represents a minimum unit of a pixel including one photoelectric conversion element (also referred to as "light-receiving element"), and can correspond to each dot in image data that is read out from an image sensor as an example. In addition, the address event represents an event that occurs for every address that is allocable to each of a plurality of the unit pixels which are arranged in a two-dimensional lattice shape. An example of an address event includes an event in which a current value of a photocurrent based on a charge generated in the photoelectric conversion element or a variation amount thereof exceeds a desired constant threshold value. That is, a DVS device may respond to changes in intensity of light asynchronously. The change in intensity of light is correlated with a change in photocurrent, and if the change in photocurrent exceeds a desired threshold, an event may be detected.

FIG. 1 is a block diagram illustrating a schematic configuration example of an imaging device according to at least some embodiments of the present disclosure. As illustrated in FIG. 1, for example, a device 100 includes an imaging lens 110, a solid-state imaging device (or imaging device) 200, a recording unit (or memory) 120, and a control unit (or controller) 130. As examples, the device 100 can be provided as or as part of a camera that is mounted in an industrial robot, an in-vehicle camera, and the like are assumed.

The imaging lens 110 can include an optical system that condenses incident light and images an image of the incident light on a light-receiving surface of the imaging device 200. The light-receiving surface is a surface on which photoelectric conversion elements in the imaging device 200 are arranged. The imaging device 200 photoelectrically converts the incident light to generate image data. In addition, the imaging device 200 can execute predetermined signal processing such as noise removal and white balance adjustment with respect to the generated image data. A result obtained by the signal processing and a detection signal indicating the existence or nonexistence of an address event ignition (or event) is output to the recording unit 120 through a signal line 209. Furthermore, a method of generating the detection signal indicating the existence or nonexistence of the address event ignition will be described later.

The recording unit 120 is, for example, constituted by a flash memory, a dynamic random access memory (DRAM), a static random access memory (SRAM), or the like, and records data input from the imaging device 200.

The control unit 130 is, for example, constituted by a central processing unit (CPU) and the like, and outputs various instructions through a signal line 139 to control respective units such as the imaging device 200 in the device 100.

Next, a configuration example of the imaging device 200 will be described in detail with reference to the accompanying drawings.

Figure 2:
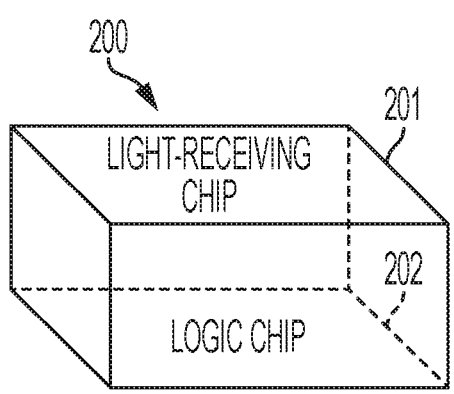
FIG. 2 is a view illustrating a lamination structure example of an imaging device according to according to at least one example embodiment.

FIG. 2 is a view illustrating a lamination structure example of an imaging device in accordance with at least some embodiments of the present disclosure. As illustrated in FIG. 2, the imaging device 200 can have a structure in which a light-receiving chip (or substrate) 201 and a logic chip (or substrate) 202 are vertically laminated. In joining of the light-receiving chip 201 and the logic chip 202, for example, so-called direct joining in which joining surfaces of the chips are planarized, and the chips are laminated with an inter-electron force can be used. However, there is no limitation thereto, and for example, so-called Cu—Cu joining in which copper (Cu) electrode pads formed on joining surfaces are bonded, bump joining, and the like can also be used.

In addition, the light-receiving chip 201 and the logic chip 202 are electrically connected to each other, for example, through a connection portion such as a through-silicon via (TSV) that penetrates through a semiconductor substrate. In the connection using the TSV, for example, a so-called twin TSV method in which two TSVs including a TSV that is formed in the light-receiving chip 201 and a TSV that is formed from the light-receiving chip 201 to the logic chip 202 are connected to each other on chip external surfaces, a so-called shared TSV method in which the light-receiving chip 201 and the logic chip 202 are connected with a TSV that penetrates through both the chips, and the like can be employed.

However, in the case of using the Cu—Cu joining or the bump joining in the joining of the light-receiving chip 201 and the logic chip 202, both the light-receiving chip 201 and the logic chip 202 are electrically connected to each other through a Cu—Cu joint or a bump joint.

Figure 3A:
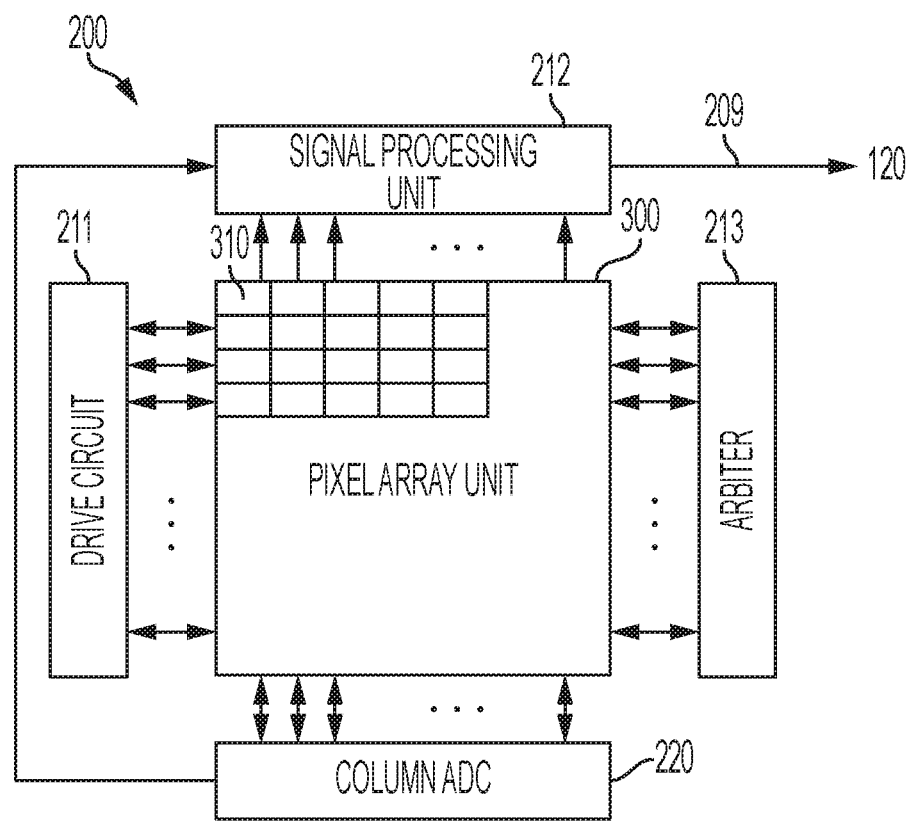
FIG. 3A is a block diagram illustrating a functional configuration example of an imaging device according to at least one example embodiment.

FIG. 3A is a block diagram illustrating a functional configuration example of the imaging device according to at least some embodiments of the present disclosure. As illustrated in FIG. 3A, the imaging device 200 includes a drive circuit 211, a signal processing unit (or signal processor) 212, an arbiter 213, a column ADC 220, and a pixel array unit 300.

A plurality of unit cells or unit pixels (or pixels) 310 are arranged in the pixel array unit (or pixel array) 300 in a two-dimensional lattice shape. Details of the unit pixels 310 will be described later. For example, each of the unit pixels 310 includes a photoelectric conversion element (or photoelectric conversion region) such as a photodiode, and a circuit that generates a pixel signal of a voltage value corresponding to the amount of charges generated in the photoelectric conversion element (hereinafter, referred to as a pixel circuit or a pixel imaging signal generation readout circuit). Here, the pixel circuit may be shared by a plurality of photoelectric conversion elements. In this case, the unit pixels 310 each includes one photoelectric conversion element and a pixel circuit that is shared.

The plurality of unit pixels 310 are arranged in the pixel array unit 300 in a two-dimensional lattice shape. The plurality of unit pixels 310 may be grouped into a plurality pixel blocks, each including a desired number of unit pixels. Hereinafter, an assembly of unit pixels which are arranged in a horizontal direction is referred to as "row", and an assembly of unit pixels which are arranged in a direction orthogonal to the row is referred to as "column".

Each of the unit pixels 310 generates charges corresponding to an amount of light received at the respective photoelectric conversion element. In addition, the unit pixels 310, alone or in combination with one or more other unit pixels 310 in the same group, can be operated to detect the existence or nonexistence of address event ignition on the basis of whether or not a value of a current (hereinafter, referred to as a photocurrent) by charges generated in the photoelectric conversion element or a variation amount thereof exceeds a predetermined threshold value. In addition, when the address event is ignited, a request for reading out a pixel signal of a voltage value corresponding to the light-reception amount of the photoelectric conversion element is output to the arbiter 213.

The drive circuit 211 drives each of the unit pixels 310, and allows each of the unit pixels 310 to output a pixel signal to the column ADC 220.

The arbiter 213 arbitrates a request from each of the unit pixels, and transmits a predetermined response to the unit pixel 310 which issues the request on the basis of the arbitration result. The unit pixel 310 which receives the response supplies a detection signal indicating the existence or nonexistence of the address event ignition (hereinafter, simply referred to as "address event detection signal") to the drive circuit 211 and the signal processing unit 212.

For every unit pixel 310 column, the column ADC 220 converts an analog pixel signal from the column into a digital signal. In addition, the column ADC 220 supplies a digital signal generated through the conversion to the signal processing unit 212.

The signal processing unit 212 executes predetermined signal processing such as correlated double sampling (CDS) processing (noise removal) and white balance adjustment with respect to the digital signal transmitted from the column ADC 220. In addition, the signal processing unit 212 supplies a signal processing result and an address event detection signal to the recording unit 120 through the signal line 209.

In the configuration illustrated in FIG. 3A, for example, the pixel array unit 300 is constituted by an assembly of unit pixels which receive wavelength components to reconstruct a color. For example, in the case of reconstructing a color on the basis of three primary colors of RGB, in the pixel array unit 300, a unit pixel 310 that receives light of a red (R) color, a unit pixel 310 that receives light of a green (G) color, and a unit pixel 310 that receives light of a blue (B) color are arranged in a predetermined color filter array.

Examples of the color filter array include various arrays such as a Bayer array of 2×2 pixels, a color filter array of 3×3 pixels which is employed in an X-Trans (registered trademark) CMOS sensor (hereinafter, also referred to as "X-Trans (registered trademark) type array"), a Quad Bayer array of 4×4 pixels (also referred to as "Quadra array"), and a color filter of 4×4 pixels in which a white RGB color filter is combined to the Bayer array (hereinafter, also referred to as "white RGB array"). Here, in the following description, a case where the Bayer Array is employed as the color filter array will be exemplified. However, example embodiments are not limited to the pixel array unit 300 having color filters. For example, in the event that color detection is not desired, color filters may be omitted from the pixels 310. In this case, the imaging device 200 may be used for detecting events without color information (see FIG. 3B). In at least one example embodiment, the pixels 310 may include a different type of optical filter, such as an infrared (IR) cut filter.

Figure 3B:
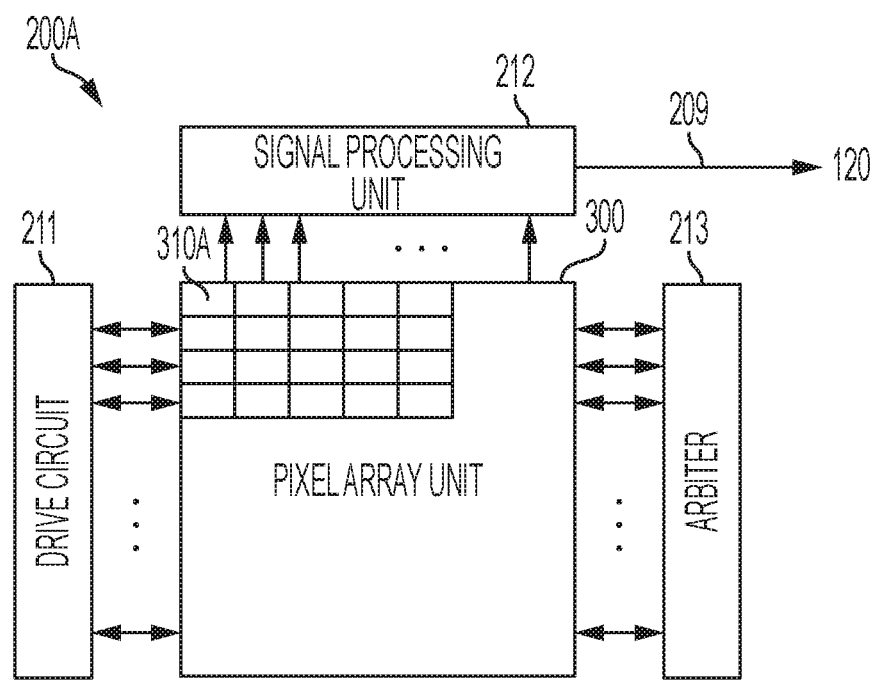
FIG. 3B is a block diagram illustrating a functional configuration example of an imaging device according to at least one example embodiment.
Figure 5A:
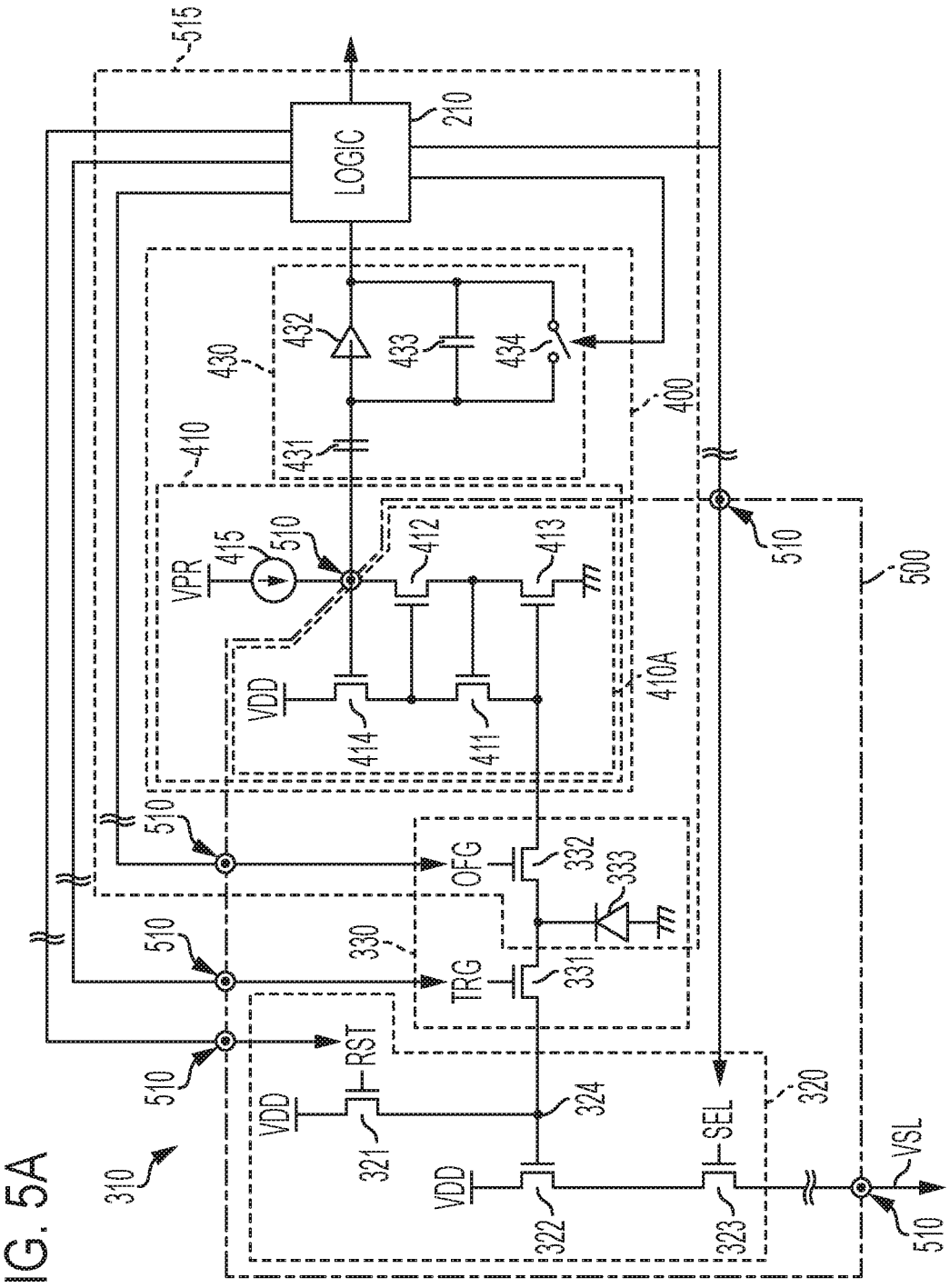
FIG. 5A is a circuit diagram illustrating a schematic configuration example of a unit pixel according to at least one example embodiment.
Figure 5B:
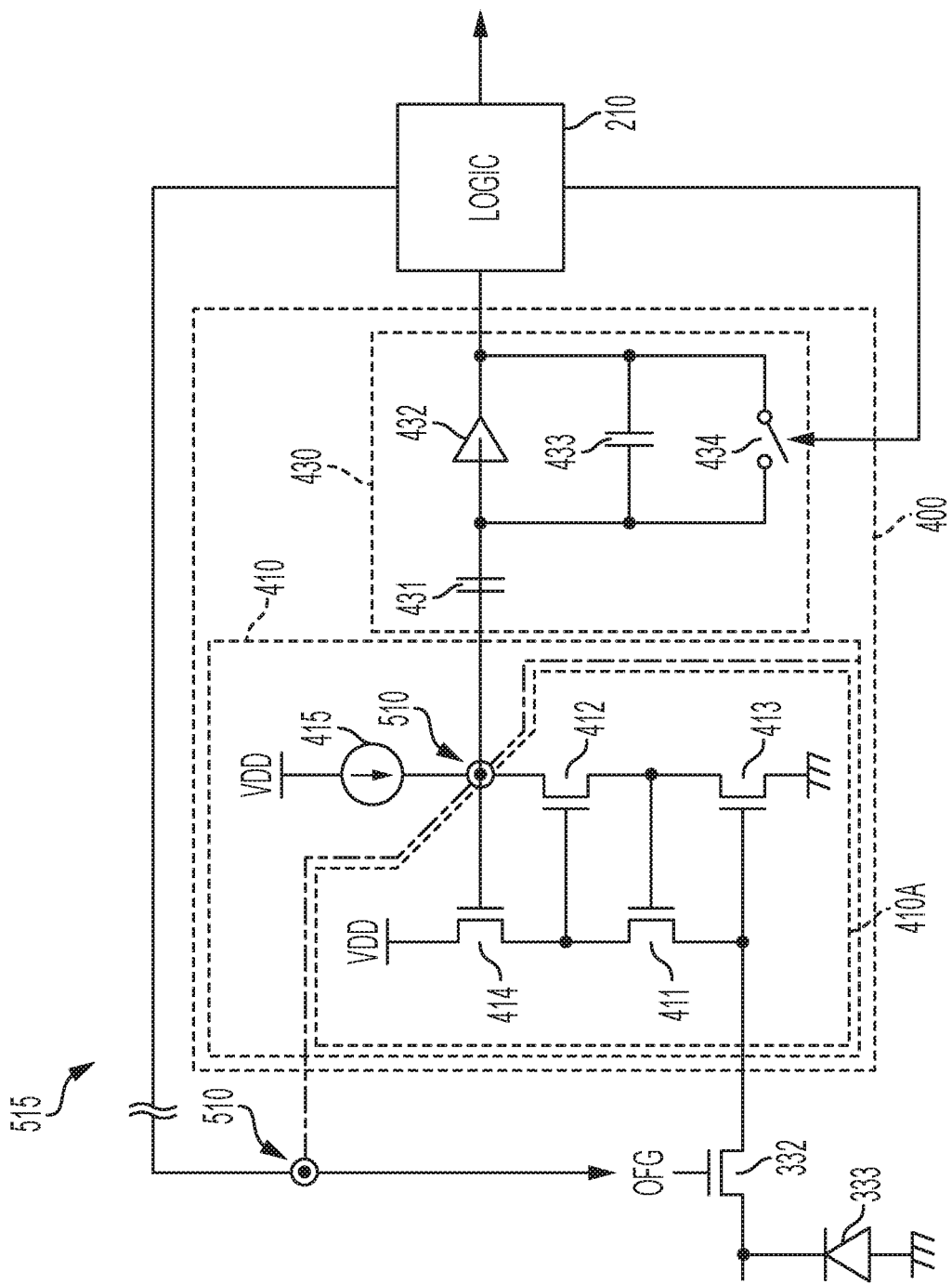
FIG. 5B is a circuit diagram illustrating a schematic configuration example of a unit pixel according to at least one example embodiment.
Figure 10A:
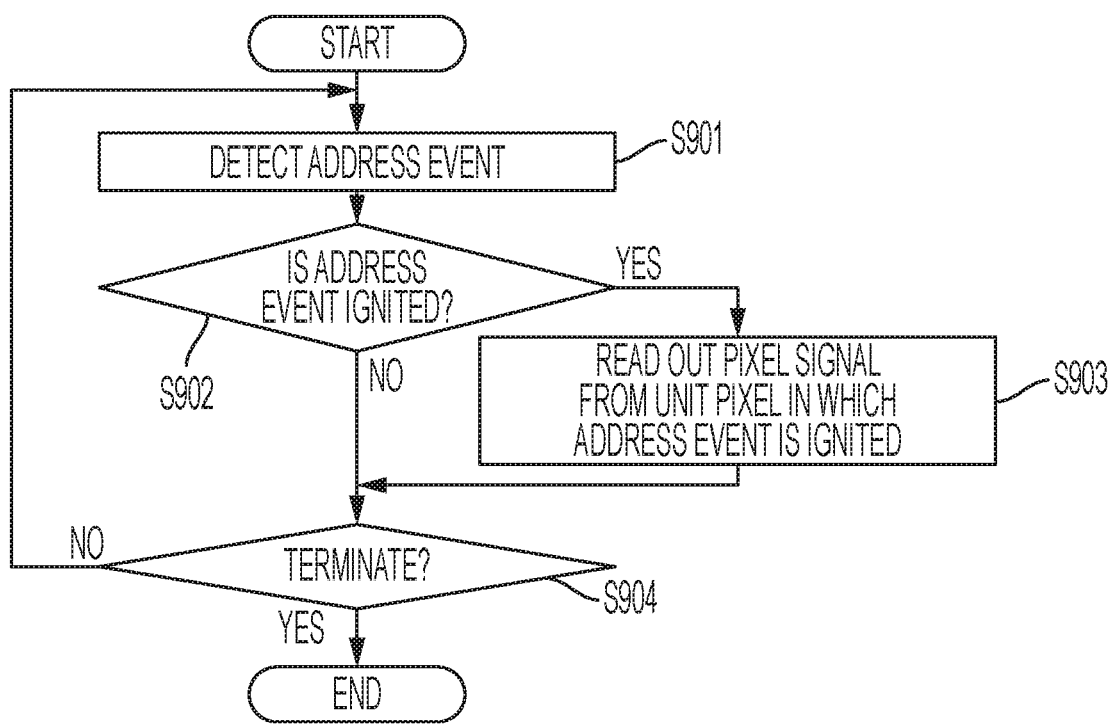
FIG. 10A is a flowchart illustrating an example of the operation of an imaging device according to at least one example embodiment.
Figure 10B:
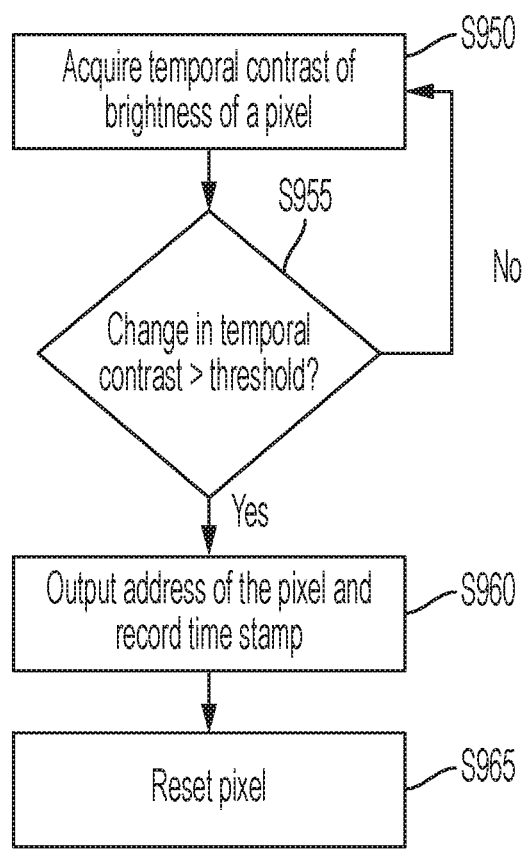
FIG. 10B is a flowchart illustrating an example of the operation of an imaging device according to at least one example embodiment.

FIG. 3B is a block diagram illustrating a functional configuration example of an imaging device 200A according to at least one example embodiment. The imaging device 200A in FIG. 3B is the same as or similar to the imaging device 200 FIG. 3A except that FIG. 3B does not include the column ADC 220. As such, FIG. 3B may be useful for event detection only applications (i.e., applications where color detection is not desired). FIG. 5B illustrates circuitry for a pixel 310A in FIG. 3B, and FIG. 10B illustrates example operations for the imaging device 200A.

Figure 4:
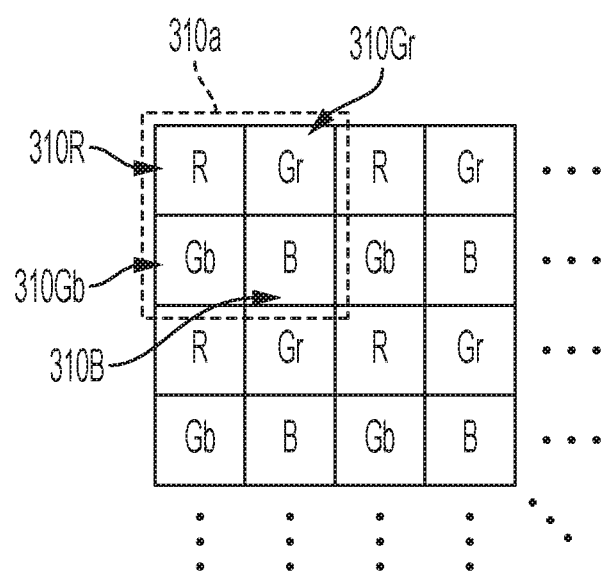
FIG. 4 is a schematic view illustrating an array example of unit pixels according to at least one example embodiment in a case of employing a Bayer array in a color filter array.

FIG. 4 is a schematic view illustrating an array example of unit pixels in the case of employing the Bayer array in the color filter array. As illustrated in FIG. 4, in the case of employing the Bayer array as the color filter array, in the pixel array unit 300, a basic pattern 312 including a total of four unit pixels of 2×2 pixels is repetitively arranged in a column direction and a row direction. For example, the basic pattern 312 is constituted by a unit pixel 310R including a color filter of a red (R) color, a unit pixel 310Gr including a color filter of a green (Gr) color, a unit pixel 310Gb including a color filter of a green (Gb) color, and a unit pixel 310B including a color filter of a blue (B) color.

Next, a configuration example of a unit pixel 310 will be described. FIG. 5A is a circuit diagram illustrating a schematic configuration example of the unit pixel 310 according to at least some embodiments of the present disclosure. As illustrated in FIG. 5A, the unit pixel 310 includes, for example, a pixel imaging signal generation unit (or readout circuit) 320, a light-receiving unit 330, and an address event detection unit (or readout circuit) 400. According to at least one example embodiment, the readout circuit 400 is configured to control the readout circuit 320 based on charge generated by a photoelectric conversion element (or photoelectric conversion region) 333. Furthermore, the logic circuit 210 in FIG. 5A is a logic circuit including, for example, the drive circuit 211, the signal processing unit 212, and the arbiter 213 in FIG. 3A.

For example, the light-receiving unit 330 includes a transmission transistor (first transistor) 331, an overflow gate (OFG) transistor (fifth transistor) 332, and a photoelectric conversion element 333. A transmission signal TRG transmitted from the drive circuit 211 is supplied to a gate of the transmission transistor 331 of the light-receiving unit 330, and a control signal OFG transmitted from the drive circuit 211 is supplied to a gate of the OFG transistor 332. An output through the transmission transistor 331 of the light-receiving unit 330 is connected to the pixel signal generation unit 320, and an output through the OFG transistor 332 is connected to the address event detection unit 400.

For example, the pixel signal generation unit 320 includes a reset transistor (second transistor) 321, an amplification transistor (third transistor) 322, a selection transistor (fourth transistor) 323, and a floating diffusion layer (FD) 324.

The transmission transistor 331 and the OFG transistor 332 of the light-receiving unit 330 are constituted, for example, by using an N-type metal-oxide-semiconductor (MOS) transistor (hereinafter, simply referred to as "NMOS transistor"). Similarly, the reset transistor 321, the amplification transistor 322, and the selection transistor 323 of the pixel signal generation unit 320 are each constituted, for example, by using the NMOS transistor. Here, it should be appreciated that the OFG transistor 332 may be omitted if desired, for example, if color detection is not desired. In this case, an electrical short replaces the OFG transistor 332.

For example, the address event detection unit 400 includes a current-voltage conversion unit (or converter) 410 and a subtractor 430. However, the address event detection unit 400 is further provided with a buffer (e.g., buffer 420 in FIG. 6), a quantizer, and a transmission unit. Details of the address event detection unit 400 will be described in the following description by using FIG. 6 and the like.

In the configuration, the photoelectric conversion element 333 of the light-receiving unit 330 photoelectrically converts incident light to generate a charge. The transmission transistor 331 transmits a charge generated in the photoelectric conversion element 333 to the floating diffusion layer 324 in accordance with the transmission signal TRG. The OFG transistor 332 supplies an electric signal (photocurrent) based on the charge generated in the photoelectric conversion element 333 to the address event detection unit 400 in accordance with the control signal OFG.

The floating diffusion layer 324 accumulates charges transmitted from the photoelectric conversion element 333 through the transmission transistor 331. The reset transistor 321 discharges (initializes) the charges accumulated in the floating diffusion layer 324 in accordance with a reset signal transmitted from the drive circuit 211. The amplification transistor 322 allows a pixel signal of a voltage value corresponding to a charge amount of charges accumulated in the floating diffusion layer 324 to appear in a vertical signal line (VSL). The selection transistor 323 switches connection between the amplification transistor 322 and the VSL in accordance with a selection signal SEL transmitted from the drive circuit 211. Furthermore, the analog pixel signal that appears in the VSL is read out by the column ADC 220, and is converted into a digital pixel signal.

When an instruction for address event detection initiation is given by the control unit 130, the drive circuit 211 in the logic circuit 210 outputs the control signal OFG for setting the OFG transistor 332 of all light-receiving units 330 in the pixel array unit 300 to an ON-state. With this arrangement, a photocurrent generated in the photoelectric conversion element 333 of the light-receiving unit 330 is supplied to the address event detection unit 400 of each unit pixel 310 through the OFG transistor 332.

When detecting address event ignition on the basis of the photocurrent from the light-receiving unit 330, the address event detection unit 400 of each unit pixel 310 outputs a request to the arbiter 213. With respect to this, the arbiter 213 arbitrates the request transmitted from each of the unit pixels 310, and transmits a response to the unit pixel 310 that issues the request on the basis of the arbitration result. The unit pixel 310 that receives the response supplies a detection signal indicating the existence or nonexistence of the address event ignition (hereinafter, referred to as "address event detection signal") to the drive circuit 211 and the signal processing unit 212 in the logic circuit 210.

The drive circuit 211 sets the OFG transistor 332 in the unit pixel 310 that is a supply source of the address event detection signal to an OFF-state. With this arrangement, supply of the photocurrent from the light-receiving unit 330 to the address event detection unit 400 in the unit pixel 310 is stopped.

Next, the drive circuit 211 sets the transmission transistor 331 in the light-receiving unit 330 of the unit pixel 310 to an ON-state by the transmission signal TRG. With this arrangement, a charge generated in the photoelectric conversion element 333 of the light-receiving unit 330 is transmitted to the floating diffusion layer 324 through the transmission transistor 331. In addition, a pixel signal of a voltage value corresponding to a charge amount of charges accumulated in the floating diffusion layer 324 appears in the vertical signal line VSL that is connected to the selection transistor 323 of the pixel signal generation unit 320.

As described above, in the imaging device 200, a pixel signal SIG is output from the unit pixel 310 in which the address event ignition is detected to the column ADC 220.

Furthermore, for example, the light-receiving unit 330, the pixel signal generation unit 320, and two log (LG) transistors (sixth and seventh transistors) 411 and 414 and two amplification transistors (eighth and ninth transistors) 412 and 413 in the current-voltage conversion unit 410 of the address event detection unit 400 are disposed, for example, in the light-receiving chip 201 illustrated in FIG. 2, and other configurations (e.g., logic 210) are disposed, for example, in the logic chip 202 that is joined to the light-receiving chip 201 through the Cu—Cu joining or bonding. However, example embodiments are not limited thereto, and the transistors 411, 412, 413, and 414 may be located in the logic chip 202 if desired (see FIG. 21, for example). FIG. 5A illustrates nodes 510, which indicate points of electrical contact made between the nodes 510 and bonding pads (e.g., copper bonding pads). Here, it should be appreciated that FIG. 5A illustrates a schematic where both event detection and color detection are desired. However, if only event detection is desired, then the schematic of FIG. 5A may be altered to include only event detection components 515 (see FIG. 5B). That is, circuitry related to color detection may be omitted from the schematic of FIG. 5A or bypassed if detecting color information is not desired for the application.

FIG. 5B is a circuit diagram illustrating a schematic configuration example of the unit pixel (or pixel) 310A according to at least some embodiments of the present disclosure. For example, FIG. 5B shows event detection components 515 in FIG. 5A. It should be appreciated that FIG. 5B may be employed when color detection is not desired. That is, FIG. 5B relates to event detection only. FIG. 5B illustrates the inclusion of OFG transistor 332, however, the OFG transistor 332 may be omitted if desired so that the photoelectric conversion element 333 is coupled directly to transistors 411 and 413 (see, e.g., FIGS. 11-18). In this case, the signal line from logic 210 to OFG transistor 332 may also be omitted.

As in FIG. 5A, FIG. 5B shows an example node 510 which represents a location of electrical contact to a bonding pad. FIGS. 19A-52 illustrate various examples of nodes 510 for the converter 410 and bonding pad configurations for bonding pads CC.

Figure 11:
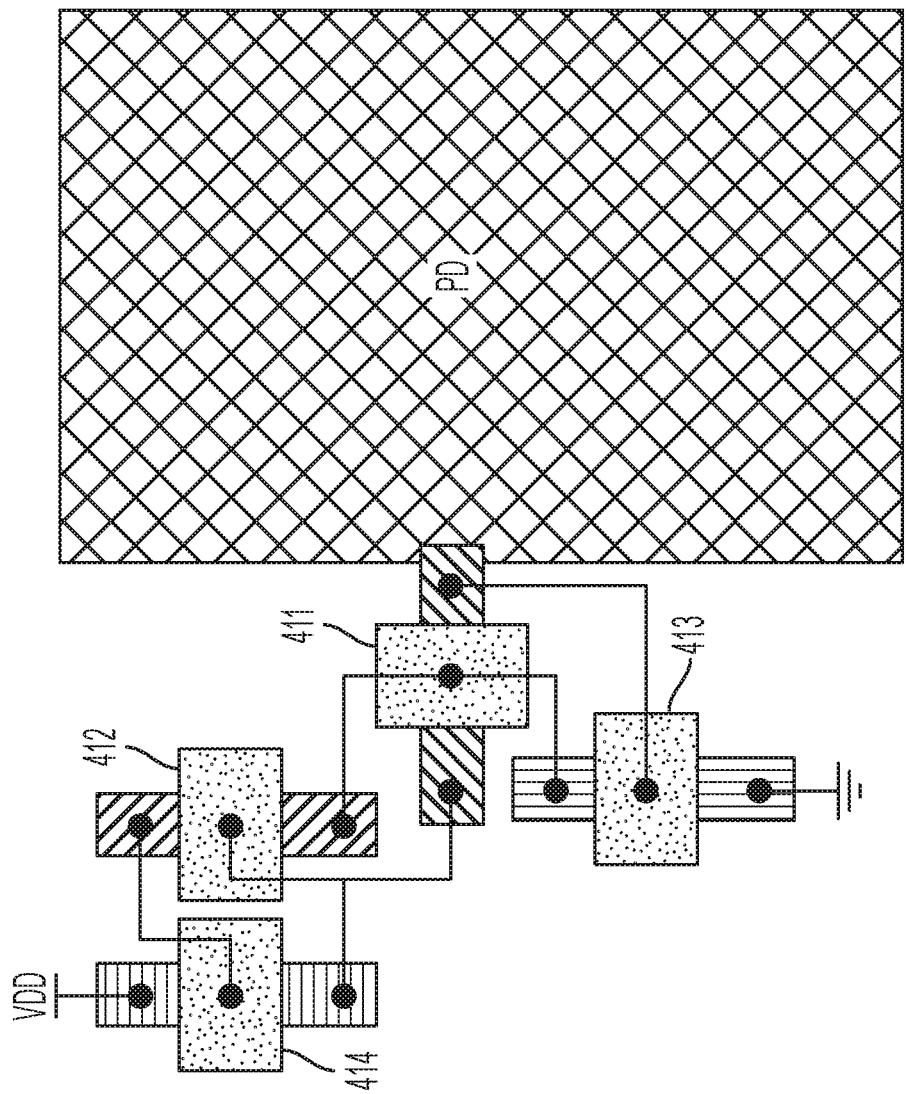
FIG. 11 is a plan view of an example layout for a portion of the converter and the photoelectric conversion region according to at least one example embodiment.
Figure 12:
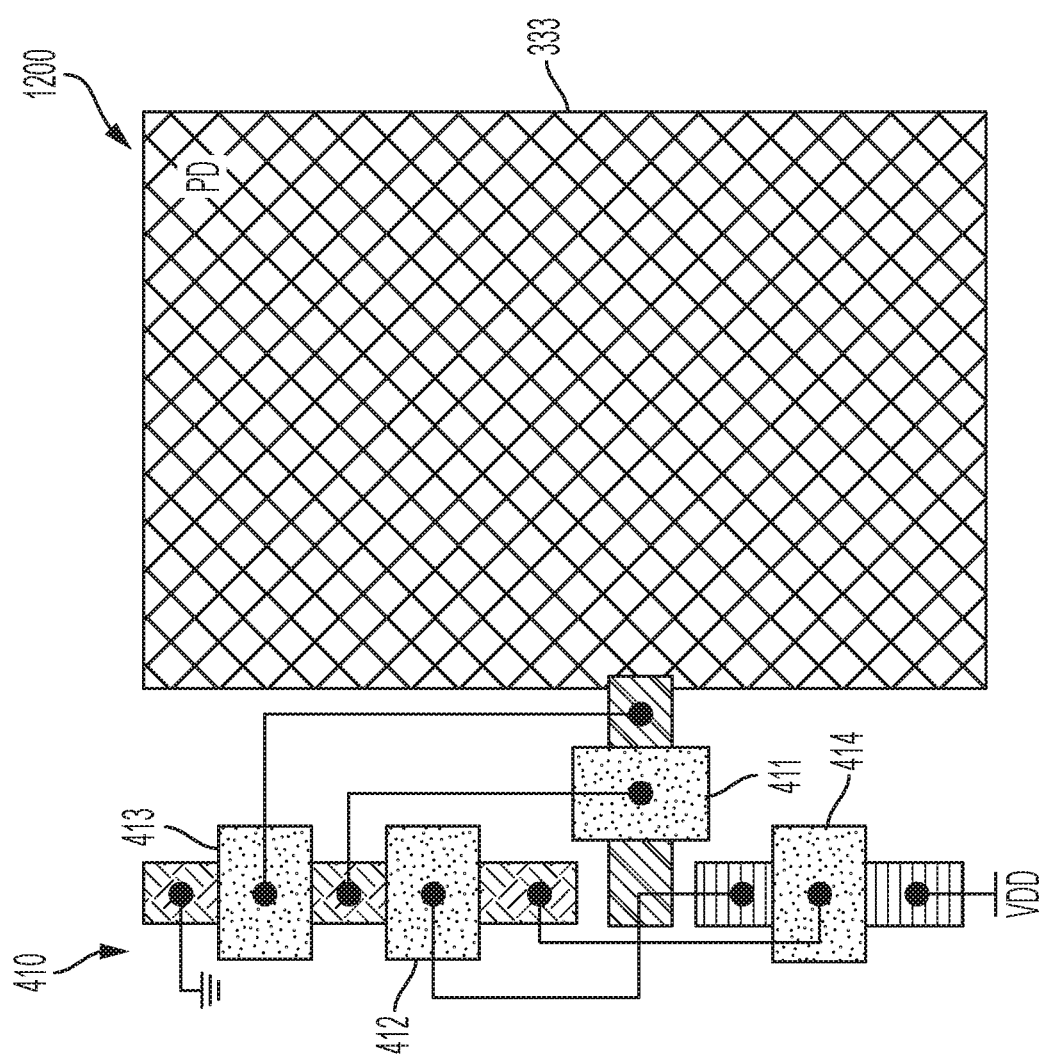
FIG. 12 is a plan view of an example layout for a portion of the converter and the photoelectric conversion region according to at least one example embodiment.
Figure 13:
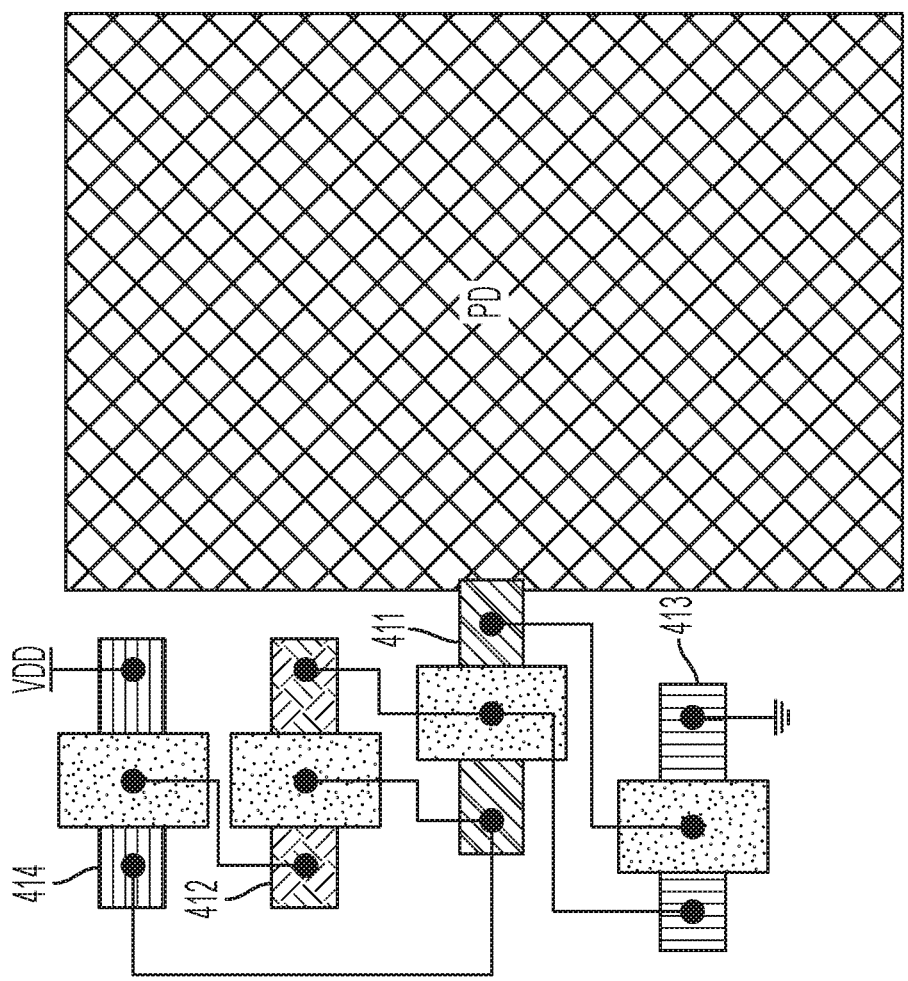
FIG. 13 is a plan view of an example layout for a portion of the converter and the photoelectric conversion region according to at least one example embodiment.

Here, it should also be appreciated that FIGS. 5A and 5B illustrate a four transistor (4T) configuration of the converter 410. FIGS. 11-13 illustrate example layouts of the 4T configuration in further detail. However, example embodiments are not limited thereto. For example, in at least one example embodiment, transistors 414 and 412 may be omitted to form a two transistor (2T) configuration. The 2T configuration may reduce an overall footprint of each unit pixel 310. In a 2T configuration, transistor 411 is coupled to the power supply terminal VDD instead of transistor 414, and transistor 413 is coupled to constant-current circuit 415 instead of transistor 412. FIGS. 14-18 illustrate example layouts of the 2T configuration in more detail.

FIG. 6 is a block diagram illustrating a schematic configuration example of the address event detection unit according to at least some embodiments of the present disclosure. As illustrated in FIG. 6, the address event detection unit 400 includes a current-voltage conversion unit 410, a buffer 420, a subtractor 430, a quantizer 440, and a transmission unit 450.

The current-voltage conversion unit 410 converts the photocurrent from the light-receiving unit 330 into a voltage signal in a logarithm thereof, and supplies the voltage signal generated through the conversion to the buffer 420.

The buffer 420 corrects the voltage signal transmitted from the current-voltage conversion unit 410, and outputs a voltage signal after correction to the subtractor 430.

The subtractor 430 lowers a voltage level of the voltage signal transmitted from the buffer 420 in accordance with a row drive signal transmitted from the drive circuit 211 and, supplies the lowered voltage signal to the quantizer 440.

The quantizer 440 quantizes the voltage signal transmitted from the subtractor 430 into a digital signal, and outputs the digital signal generated through the quantization to the transmission unit 450 as a detection signal.

The transmission unit 450 transmits the detection signal transmitted from the quantizer 440 to the signal processing unit 212 and the like. For example, when address event ignition is detected, the transmission unit 450 supplies a request for transmission of an address event detection signal from the transmission unit 450 to the drive circuit 211 and the signal processing unit 212 to the arbiter 213. In addition, when receiving a response with respect to the request from the arbiter 213, the transmission unit 450 supplies the detection signal to the drive circuit 211 and the signal processing unit 212.

For example, the current-voltage conversion unit 410 in the configuration illustrated in FIG. 6 has a 4T configuration that includes the two LG transistors 411 and 414, the two amplification transistors 412 and 413, and a constant-current circuit 415 as illustrated in FIG. 5A.

For example, a source of the LG transistor 411 and a gate of the amplification transistor 413 are connected to a drain of the OFG transistor 332 of the light-receiving unit 330. In addition, for example, a drain of the LG transistor 411 is connected to a source of the LG transistor 414 and a gate of the amplification transistor 412. For example, a drain of the LG transistor 414 is connected to a power supply terminal VDD.

In addition, for example, a source of the amplification transistor 413 is grounded, and a drain thereof is connected to a gate of the LG transistor 411 and a source of the amplification transistor 412. For example, a drain of the amplification transistor 412 is connected to a power supply terminal VPR through the constant-current circuit 415. For example, the constant-current circuit 415 is constituted by a load MOS transistor such as a p-type MOS transistor. The power supply terminal VPR connected to the constant-current circuit 415 may receive a same or different power supply signal than terminal VDD connected to a drain of transistor 414.

In this connection relationship, a loop-shaped source follower circuit is constructed. With this arrangement, a photocurrent from the light-receiving unit 330 is converted into a voltage signal in a logarithmic value corresponding to a charge amount thereof. Furthermore, the LG transistors 411 and 414, and the amplification transistors 412 and 413 may be each constituted, for example, by an NMOS transistor.

Figure 7:
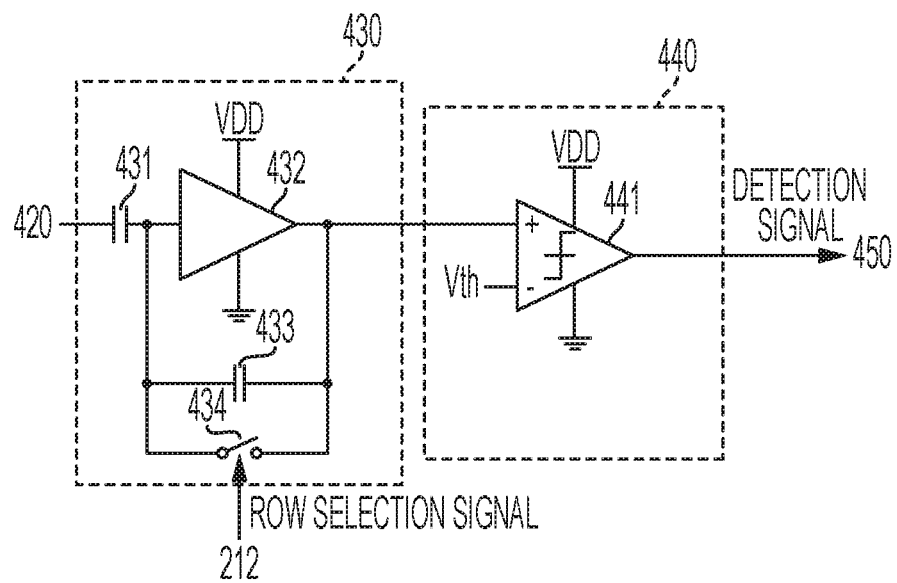
FIG. 7 is a circuit diagram illustrating a schematic configuration example of a subtractor and a quantizer according to at least one example embodiment.

FIG. 7 is a circuit diagram illustrating a schematic configuration example of the subtractor and the quantizer according to at least some embodiments of the present disclosure. As illustrated in FIG. 7, the subtractor 430 includes capacitors 431 and 433, an inverter 432, and a switch 434. In addition, the quantizer 440 includes a comparator 441.

One end of the capacitor 431 is connected to an output terminal of the buffer 420, and the other end is connected to an input terminal of the inverter 432. The capacitor 433 is connected to the inverter 432 in parallel. The switch 434 opens or closes a route connecting both ends of the capacitor 433 in accordance with a row drive signal.

The inverter 432 inverts a voltage signal that is input through the capacitor 431. The inverter 432 outputs an inverted signal to a non-inverting input terminal (+) of the comparator 441.

When the switch 434 is closed, a voltage signal Vinit is input to a buffer 420 side of the capacitor 431. In addition, the opposite side becomes a virtual ground terminal. A potential of the virtual ground terminal is set to zero for convenience. At this time, when a capacity of the capacitor 431 is set as C1, a potential Qinit that is accumulated in the capacitor 431 is expressed by the following Expression (1). On the other hand, both ends of the capacitor 433 are short-circuited, and thus an accumulated charge thereof becomes zero.

$$Q\text{init} = C1 \times V\text{init} \tag{1}$$

Next, when considering a case where the switch 434 is turned off, and a voltage of the capacitor 431 on the buffer 420 side varies and reaches Vafter, a charge Qafter accumulated in the capacitor 431 is expressed by the following Expression (2).

$$Q\text{after} = C1 \times V\text{after} \tag{2}$$

On the other hand, when an output voltage is set as Vout, a charge Q2 accumulated in the capacitor 433 is expressed by the following Expression (3).

$$Q2 = -C2 \times V\text{out} \tag{3}

At this time, a total charge amount of the capacitors 431 and 433 does not vary, and thus the following Expression (4) is established.

$$Q\text{init} = Q\text{after} + Q2 \quad (4)$$

When Expression (1) to Expression (3) are substituted for Expression (4), the following Expression (5) is obtained.

$$V\text{out} = -(C1/C2) \times (V\text{after} - V\text{init}) \quad (5)$$

Expression (5) represents a subtraction operation of a voltage signal, and a gain of the subtraction result becomes C1/C2. Typically, it is desired to maximize (or alternatively, improve) the gain, and thus it is preferable to make a design so that C1 becomes large and C2 becomes small. On the other hand, when C2 is excessively small, kTC noise increases, and thus there is a concern that noise characteristics deteriorate. Accordingly, a reduction in the capacity of C2 is limited to a range capable of permitting noise. In addition, since the address event detection unit 400 including the subtractor 430 is mounted for every unit pixel 310, a restriction on an area is present in capacities C1 and C2. Values of the capacities C1 and C2 are determined in consideration of the restriction.

The comparator 441 compares a voltage signal transmitted from the subtractor 430 and a predetermined threshold voltage Vth that is applied to an inverting input terminal (−). The comparator 441 outputs a signal indicating the comparison result to the transmission unit 450 as a detection signal.

In addition, when a conversion gain by the current-voltage conversion unit 410 is set as $CG_{log}$, and a gain of the buffer 420 is set to "1", a gain A of the entirety of the address event detection unit 400 is expressed by the following Expression (6).

[Mathematical Formula 1]

$$A = \frac{CG_{log} \cdot C1}{C2} \sum_{a=1}^{N} i_{photo\_n} \quad (6)$$

In Expression (6), $i_{photo\_n}$ represents a photocurrent of an nth unit pixel 310, and a unit thereof is, for example, an ampere (A). N represents the number of the unit pixels 310 in a pixel block, and is "1" in this embodiment.

Figure 8:
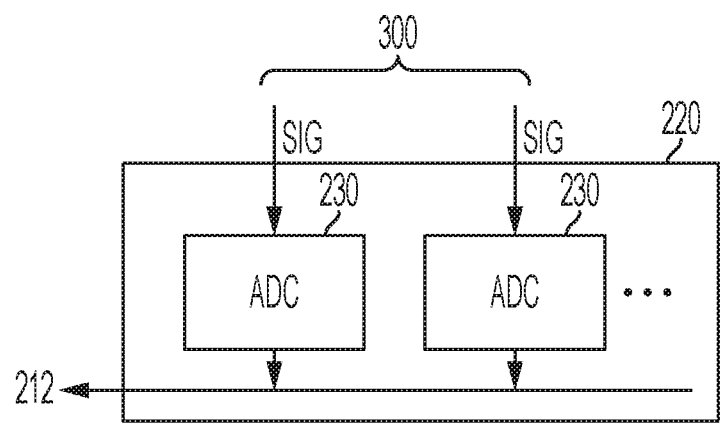
FIG. 8 is a block diagram illustrating a schematic configuration example of a column ADC according to at least one example embodiment.

FIG. 8 is a block diagram illustrating a schematic configuration example of the column ADC according to at least some embodiments of the present disclosure. The column ADC 220 includes a plurality of ADCs 230 which are provided for every column of the unit pixels 310.

Each of the ADCs 230 converts an analog pixel signal that appears in the vertical signal line VSL into a digital signal. For example, the pixel signal is converted into a digital signal in which a bit length is greater than that of a detection signal. For example, when the detection signal is set to two bits, the pixel signal is converted into a digital signal of three or greater bits (16 bits and the like). The ADC 230 supplies a generated digital signal to the signal processing unit 212. Here, it should be appreciated that the column ADC 220 may be omitted (as in FIG. 3B) or unused if, for example, color detection is not desired.

Next, an operation of the imaging device 200 according to at least embodiments of the present disclosure will be described in detail with reference to the accompanying drawings.

Figure 9:
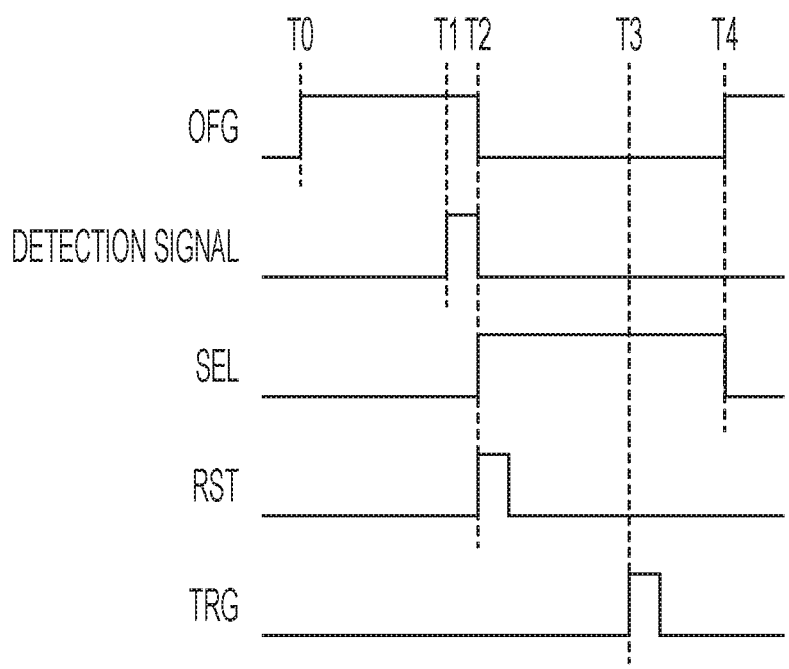
FIG. 9 is a timing chart illustrating an example of an operation of an imaging device according to at least one example embodiment.

First, an example of the operation of the imaging device 200 will be described by using a timing chart. FIG. 9 is a timing chart illustrating an example of the operation of the imaging device according to the first embodiment.

As illustrated in FIG. 9, at a timing T0, when an instruction for address event detection initiation is given by the control unit 130, the drive circuit 211 raises the control signal OFG applied to the gate of the OFG transistor 332 of all of the light-receiving units 330 in the pixel array unit 300 to a high level. With this arrangement, a plurality of the OFG transistors 332 of all of the light-receiving units 330 enter an ON-state, and a photocurrent based on a charge generated in the photoelectric conversion element 333 of each of the light-receiving units 330 is supplied from each the light-receiving units 330 to each of a plurality of the address event detection units 400.

In addition, in a period in which the control signal OFG is in a high level, all of the transmission signals TRG applied to the gate of the transmission transistor 331 in each of the light-receiving units 330 are maintained in a low level. Accordingly, in this period, a plurality of the transmission transistors 331 in all of the light-receiving units 330 are in an OFF-state.

Next, a case where the address event detection unit 400 of an arbitrary unit pixel 310 detects address event ignition in a period in which the control signal OFG is in a high level will be assumed. In this case, the address event detection unit 400 that detects the address event ignition transmits a request to the arbiter 213. With respect to this, the arbiter 213 arbitrates the request, and returns a response for the request to the address event detection unit 400 that issues the request.

The address event detection unit 400 that receives the response raises a detection signal that is input to the drive circuit 211 and the signal processing unit 212 to a high level, for example, in a period of a timing T1 to a timing T2. Furthermore, in this description, it is assumed that the detection signal is a one-bit signal The drive circuit 211 to which a high-level detection signal is input from the address event detection unit 400 at the timing T1 lowers all control signals OFG to a low level at a subsequent timing T2. With this arrangement, supply of a photocurrent from all of the light-receiving units 330 of the pixel array unit 300 to the address event detection unit 400 is stopped.

In addition, at the timing T2, the drive circuit 211 raises a selection signal SEL that is applied to a gate of the selection transistor 323 in the pixel imaging signal generation unit 320 of the unit pixel 310 in which the address event ignition is detected (hereinafter, referred to as "reading-out target unit pixel") to a high level, and raises a reset signal RST that is applied to a gate of the reset transistor 321 of the same pixel imaging signal generation unit 320 to a high level for a constant pulse period, thereby discharging (initializing) charges accumulated in the floating diffusion layer 324 of the pixel imaging signal generation unit 320. In this manner, a voltage, which appears in the vertical signal line VSL in a state in which the floating diffusion layer 324 is initialized, is read out by the ADC 230 connected to the vertical signal line VSL in the column ADC 220 as a reset-level pixel signal (hereinafter, simply referred to as "reset level"), and is converted into a digital signal.

Next, at a timing T3 after reading out the reset level, the drive circuit 211 applies a transmission signal TRG of a constant pulse period to the gate of the transmission transistor 331 of the light-receiving unit 330 in the reading-out target unit pixel 310. With this arrangement, a charge generated in the photoelectric conversion element 333 of the light-receiving unit 330 is transmitted to the floating diffusion layer 324 in the pixel signal generation unit 320, and a voltage corresponding to charges accumulated in the floating diffusion layer 324 appears in the vertical signal line VSL. In this manner, the voltage that appears in the vertical signal line VSL is read out by the ADC 230 connected to the vertical signal line VSL in the column ADC 220 as a signal-level pixel signal of the light-receiving unit 330 (hereinafter, simply referred to as "signal level") of the light-receiving unit 330, and is converted into a digital value.

The signal processing unit 212 executes CDS processing in which a difference between the reset level and the signal level which are read out as described above is obtained as a net pixel signal corresponding to a light-reception amount of the photoelectric conversion element 333.

Next, at a timing T4, the drive circuit 211 lowers the selection signal SEL that is applied to the gate of the selection transistor 323 in the pixel imaging signal generation readout circuit 320 of the reading-out target unit pixel 310 to a low level, and raises the control signal OFG that is applied to the gate of the OFG transistor 332 of all of the light-receiving units 330 in the pixel array unit 300 to a high level. With this arrangement, address event ignition detection in all of the light-receiving units 330 in the pixel array unit 300 is restarted.

Next, an example of the operation of the imaging device 200 will be described by using a flowchart. FIG. 10A is a flowchart illustrating an example of the operation of the imaging device according to at least some embodiments of the present disclosure. For example, this operation is initiated when a predetermined application for detecting an address event is executed.

As illustrated in FIG. 10A, in this operation, first, each of the unit pixels 310 in the pixel array unit 300 detects existence or nonexistence of address event ignition (step S901). In addition, the drive circuit 211 determines whether or not address event ignition is detected in any one of the unit pixels 310 (step S902).

In a case where the address event ignition is not detected (NO in step S902), this operation proceeds to step S904. On the other hand, in a case where the address event ignition is detected (YES in step S902), the drive circuit 211 executes reading-out of a pixel signal with respect to the unit pixel 310 in which the address event ignition is detected (step S903), and proceeds to step S904.

In step S904, it is determined whether or not to terminate this operation. In a case where this operation is not terminated (NO in step S904), this operation returns to step S901, and the subsequent operations are repeated. On the other hand, in a case where this operation is terminated (YES in step S904), this operation is terminated.

FIG. 10B is a flowchart illustrating an example of the operation of the imaging device 200A in FIG. 3B according to at least some embodiments of the present disclosure. FIG. 10B illustrates operations for event detection only, for example, by the imaging device 200A.

In step S950, the temporal contrast of brightness of a pixel (e.g., a pixel 310A) is monitored. For example, a change in light intensity of the pixel is monitored by the event detection components 515 in accordance with the description provided above. In this case, transistor 332 (if included) and transistors 411, 412, 413, and 414 are all simultaneously on in order to monitor the change in light intensity.

In step S955, it is determined whether a change in the temporal contrast is greater than a threshold. If not, the method returns to step S950. If so, the method proceeds to step S960 where an event is detected so that the address of the pixel is output and a time stamp of when the event occurred is recorded.

In step S965, the pixel is reset (e.g., by closing switch 434).

FIGS. 11-18 illustrate various example layouts for the photoelectric conversion region 333 and the converter 410. Although not explicitly shown, it should be understood that the transistors (e.g., the source/drain regions) of the converter 410 and the photoelectric conversion region 333 are formed in a semiconductor substrate, for example, a semiconductor substrate having p-type conductivity or a p-well. In addition, it should be further appreciated that FIGS. 11-18 have omitted the OFG transistor 332 between the photoelectric conversion region 333 and the transistor 411. However, the OFG transistor 332 may be included if desired.

FIG. 11 is a plan view of an example layout 1100 for a portion of the converter 410 and the photoelectric conversion region 333 according to at least one example embodiment. As shown in FIG. 11, a source of the transistor 411 may be coupled to a central region of one side of the photoelectric conversion region 333. The transistor 411 may extend in a first direction (e.g., a horizontal direction). As further shown, transistor 413 is formed on one side of the drain of the transistor 413 and extends in a second direction (e.g., a vertical direction) that is perpendicular to the first direction. Transistors 412 and 414 are adjacent to one another and located on the other side of the drain of the transistor 413 The layout illustrated in FIG. 11 may be useful for applications that desire smaller footprints for the pixels 310 so as to improve resolution.

FIG. 12 is a plan view of an example layout 1200 for a portion of the converter 410 and the photoelectric conversion region 333 according to at least one example embodiment. As shown, the transistor 411 is coupled to the photoelectric conversion region 333 in a region that is offset from (e.g., below) a central region of the photoelectric conversion region 333. In addition, transistor 414 is located at one side of the drain of transistor 411 while transistors 412 and 413 are located at another side of the drain of transistor 411. As shown, transistors 412 and 413 share a source/drain region, and the transistors 412, 413, and 414 extend in the second direction and are aligned with one another in the second direction. The layout illustrated in FIG. 12 may be useful for applications that are tailored for larger footprints for the pixels 310, or larger photoelectric conversion regions where higher quality images and/or better contrast sensitivity is desired.

FIG. 13 is a plan view of an example layout 1300 for a portion of the converter 410 and the photoelectric conversion region 333 according to at least one example embodiment. As shown in FIG. 13, the transistor 411 is coupled to the photoelectric conversion region 333 at a central region of one side of the photoelectric conversion region 333. As also shown, transistor 413 is on one side of the drain of the transistor 411 while transistors 412 and 414 are on another side of the drain of the transistor 411. The transistors 411, 412, 413, and 414 all extend in a first direction, and transistors 412/414 are aligned with one another in a second direction. Although not explicitly shown, it should be appreciated that transistor 413 may also be aligned with transistors 412/414 if desired. FIG. 13 may be useful for applications that desire to reduce coupling between gates of the transistors 411, 412, 413, and 414.

In FIGS. 11-13, the transistor 411 may have the structure described with reference to FIG. 49 in order to reduce dark current.

Figure 14:
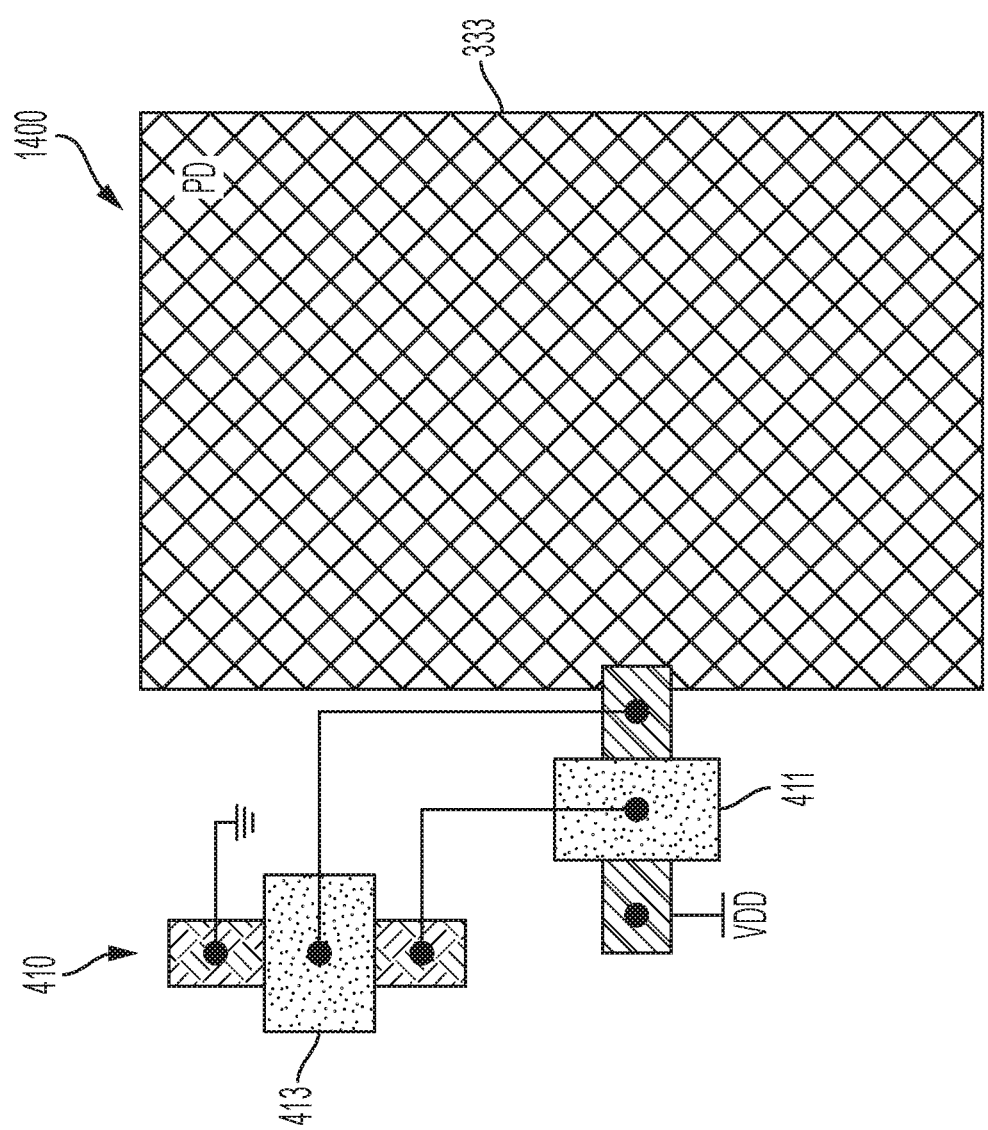
FIG. 14 is a plan view of an example layout for a portion of the converter and the photoelectric conversion region according to at least one example embodiment.

FIG. 14 is a plan view of an example layout 1400 for a portion of the converter 410 and the photoelectric conversion region 333 according to at least one example embodiment. Here, it should be appreciated that FIG. 14 illustrates a 2T configuration for the converter 410 where transistors 412 and 414 are omitted, as described above. As shown, transistor 411 is coupled to one side of the photoelectric conversion region 333 and located at a region that is offset from (e.g., below) a central region of the photoelectric conversion region 333 while transistor 413 is formed on one side of transistor 411 and extends in the second direction. The layout in FIG. 14 may be useful for applications that desire smaller pixels 310. In this case, transistor 411 may have the structure illustrated in FIG. 49.

Figure 15:
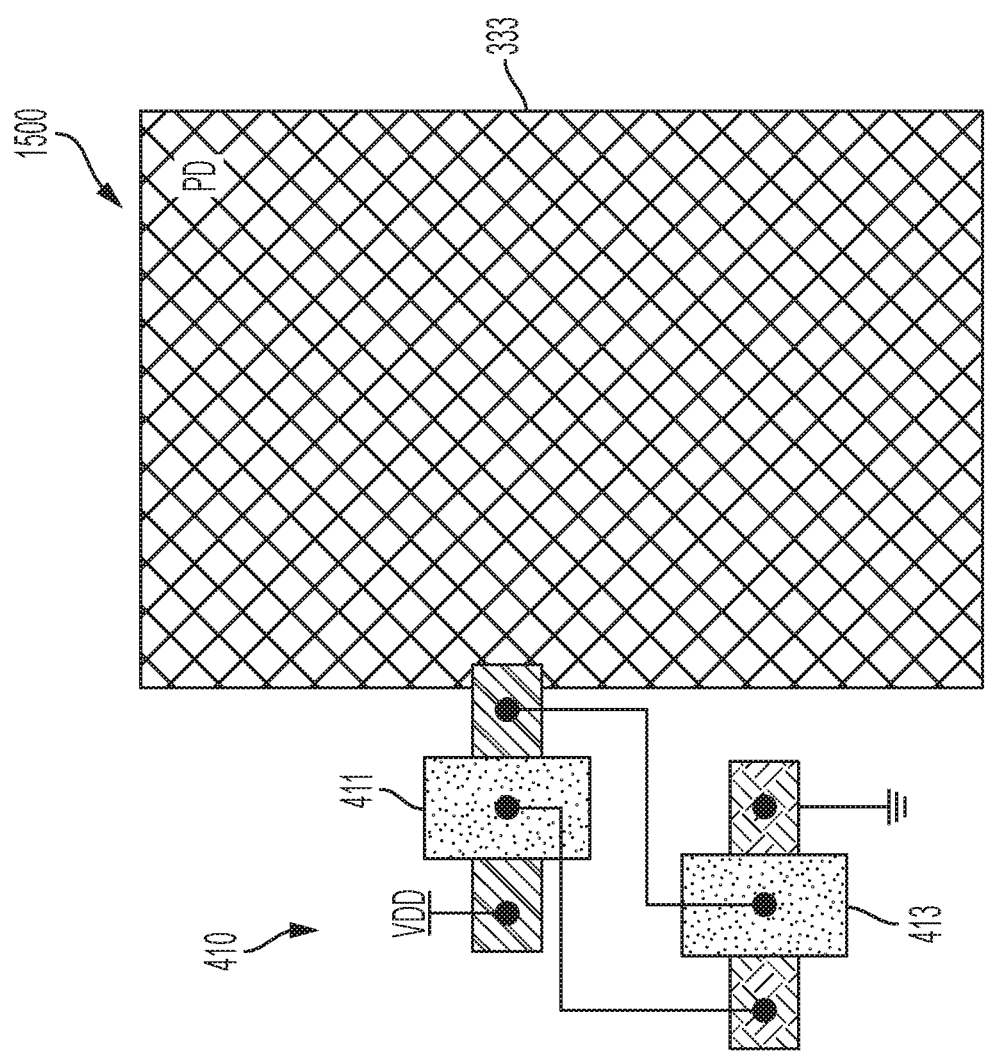
FIG. 15 is a plan view of an example layout for a portion of the converter and the photoelectric conversion region according to at least one example embodiment.

FIG. 15 is a plan view of an example layout 1500 for a portion of the converter 410 and the photoelectric conversion region 333 according to at least one example embodiment. Like FIG. 14, FIG. 15 has a 2T configuration for the converter 410. In FIG. 15, transistor 411 is coupled to one side of the photoelectric conversion region 333 at a location that is offset from (e.g., above) a central region of the photoelectric conversion region 333. The transistor 413 is formed on one side of the transistor 411 and extends in the first direction. The layout in FIG. 15 may be useful for applications that desire flexibility in the metal wirings that make electrical connections to the transistors 411/413 and other components of the pixel 310. In this case, transistor 411 may have the structure illustrated in FIG. 49.

Figure 16:
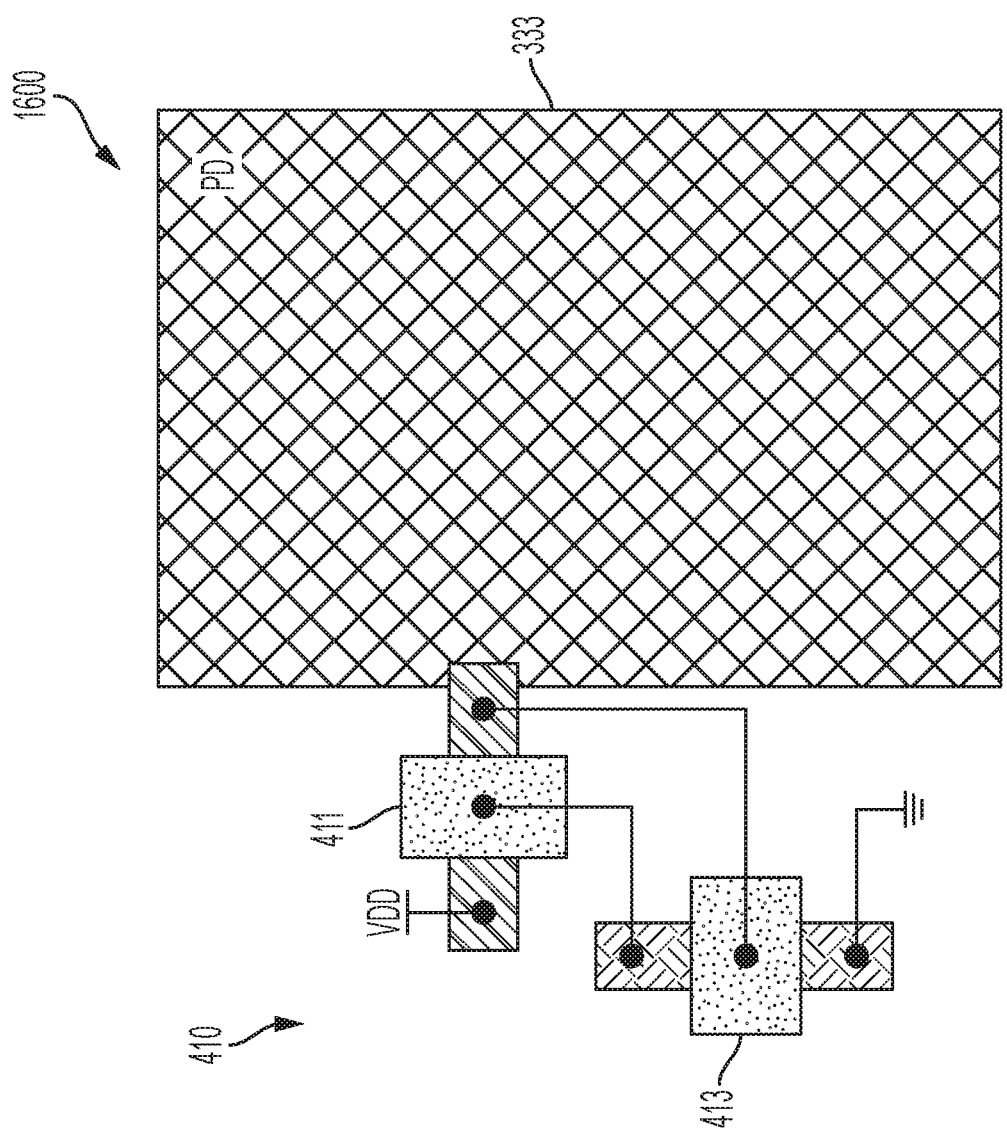
FIG. 16 is a plan view of an example layout for a portion of the converter and the photoelectric conversion region according to at least one example embodiment.

FIG. 16 is a plan view of an example layout 1600 for a portion of the converter 410 and the photoelectric conversion region 333 according to at least one example embodiment. Here, it should be appreciated that FIG. 16 illustrates a 2T configuration for the converter 410 where transistors 412 and 414 are omitted, as described above. As shown, transistor 411 is coupled to one side of the photoelectric conversion region 333 and located at a region that is offset from (e.g., above) a central region of the photoelectric conversion region 333 while transistor 413 is formed on one side of transistor 411 and extends in the second direction. The layout in FIG. 16 may be useful for applications that desire smaller pixels 310. In this case, transistor 411 may have the structure illustrated in FIG. 49.

Figure 17:
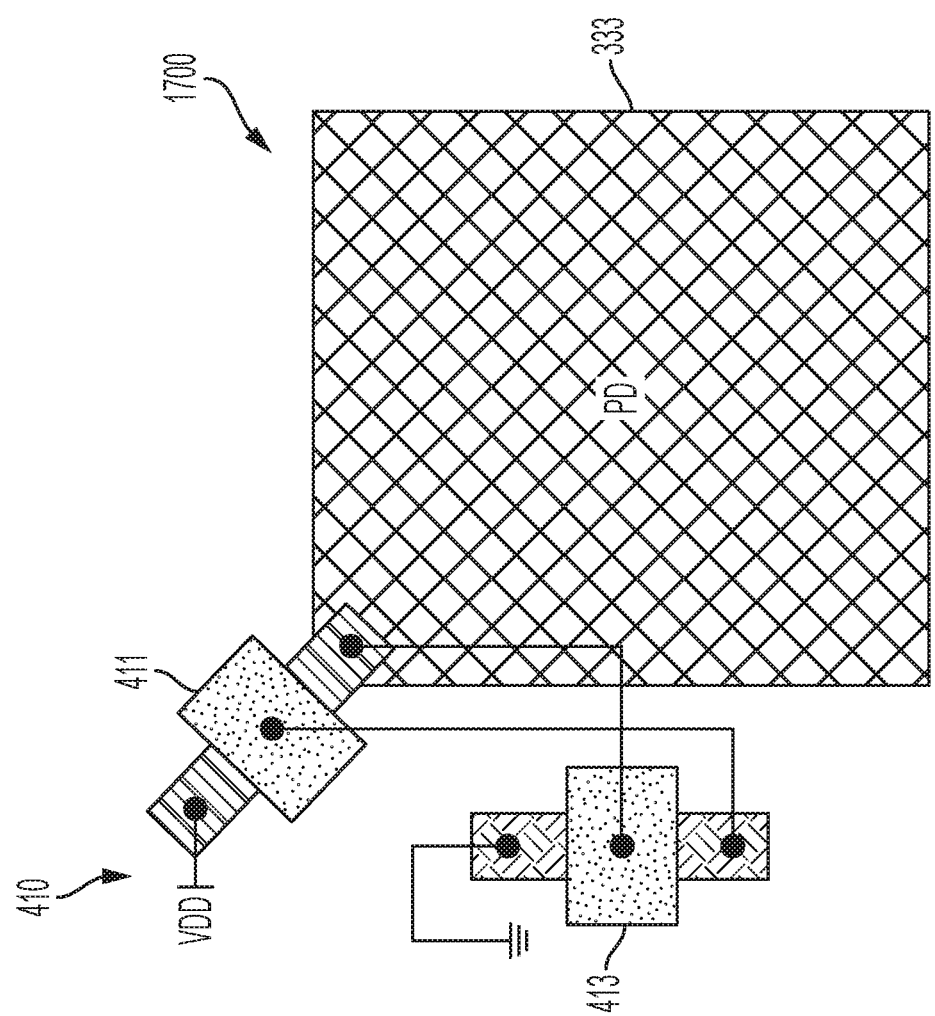
FIG. 17 is a plan view of an example layout for a portion of the converter and the photoelectric conversion region according to at least one example embodiment.

FIG. 17 is a plan view of an example layout 1700 for a portion of the converter 410 and the photoelectric conversion region 333 according to at least one example embodiment. Here, it should be appreciated that FIG. 17 illustrates a 2T configuration for the converter 410 where transistors 412 and 414 are omitted, as described above. As shown in FIG. 17, transistor 413 is located at one side of the photoelectric conversion region 333 and extends in the second direction while transistor 411 is coupled to a corner portion of the photoelectric converter region 333 and extends in a direction that forms an angle with the second direction. In this case, transistor 411 may have the structure illustrated in FIG. 49.

Figure 18:
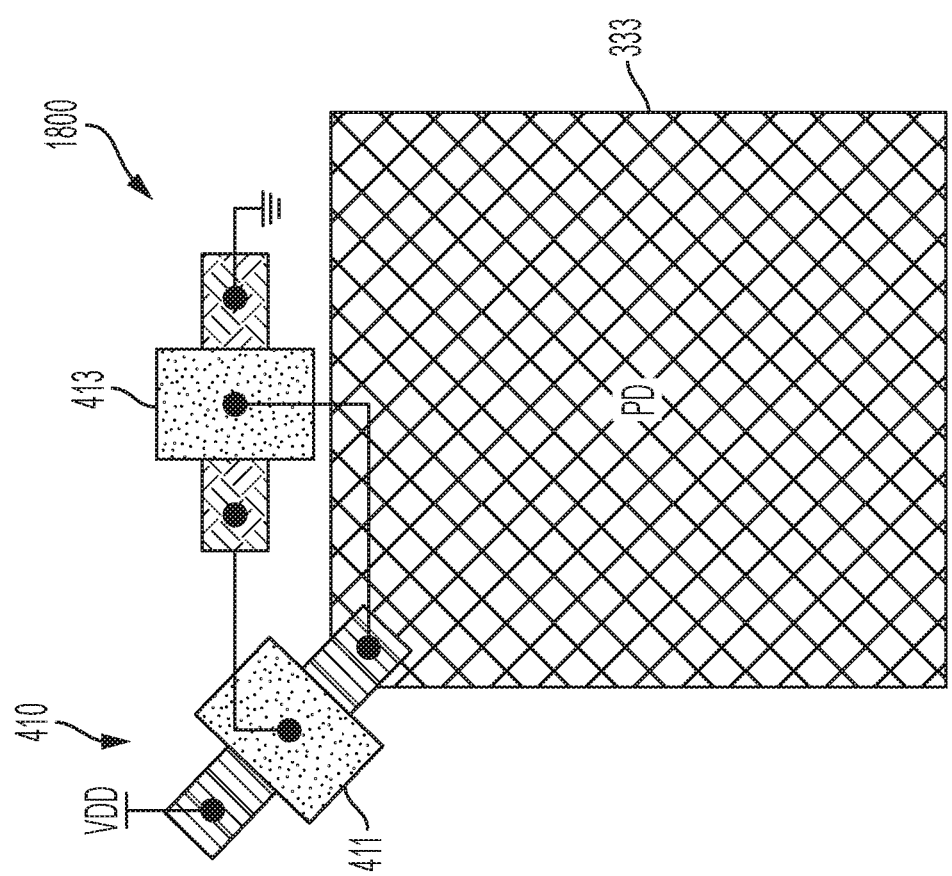
FIG. 18 is a plan view of an example layout for a portion of the converter and the photoelectric conversion region according to at least one example embodiment.

FIG. 18 is a plan view of an example layout 1800 for a portion of the converter 410 and the photoelectric conversion region 333 according to at least one example embodiment. Here, it should be appreciated that FIG. 18 illustrates a 2T configuration for the converter 410 where transistors 412 and 414 are omitted, as described above. As shown in FIG. 18, transistor 413 is located at one side of the photoelectric conversion region 333 and extends in the first direction while transistor 411 is coupled to a corner portion of the photoelectric converter region 333 and extends in a direction that forms an angle with the second direction. In this case, transistor 411 may have the structure illustrated in FIG. 49.

Figure 20:
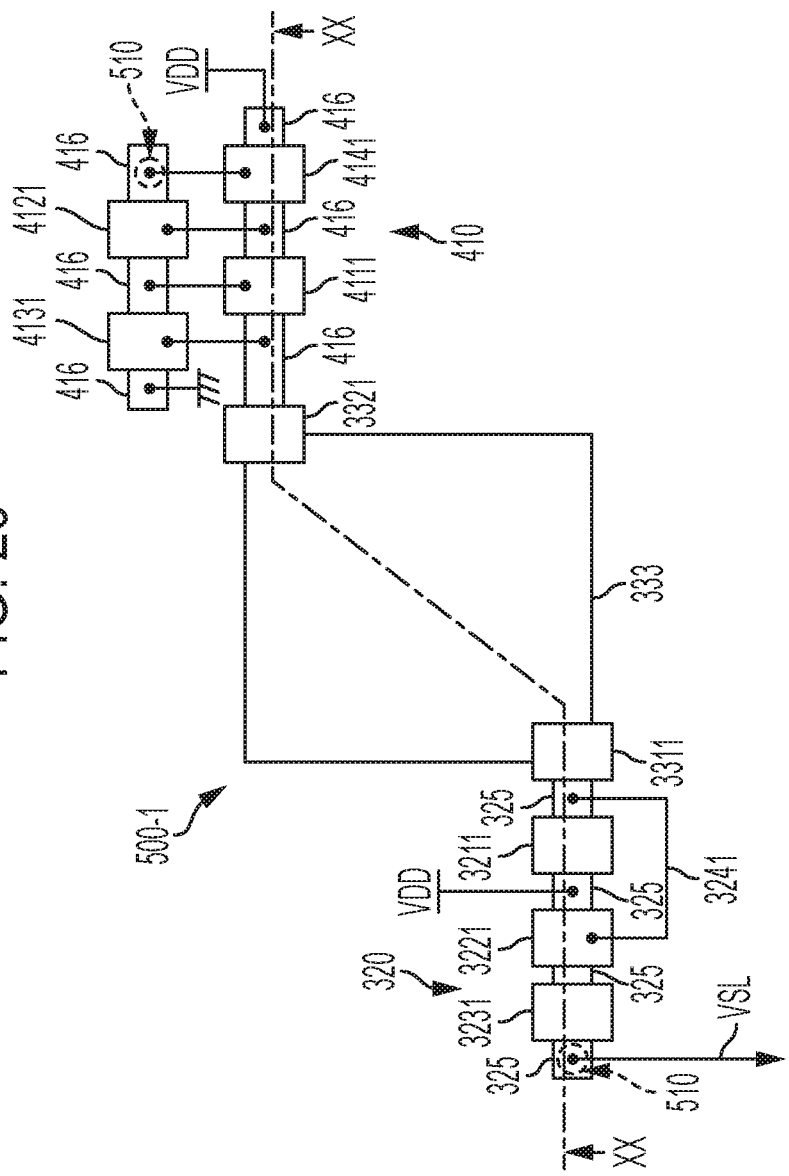
FIG. 20 is a top view illustrating a schematic configuration example of an upper layer circuit according to a first layout example of the first embodiment.
Figure 21:
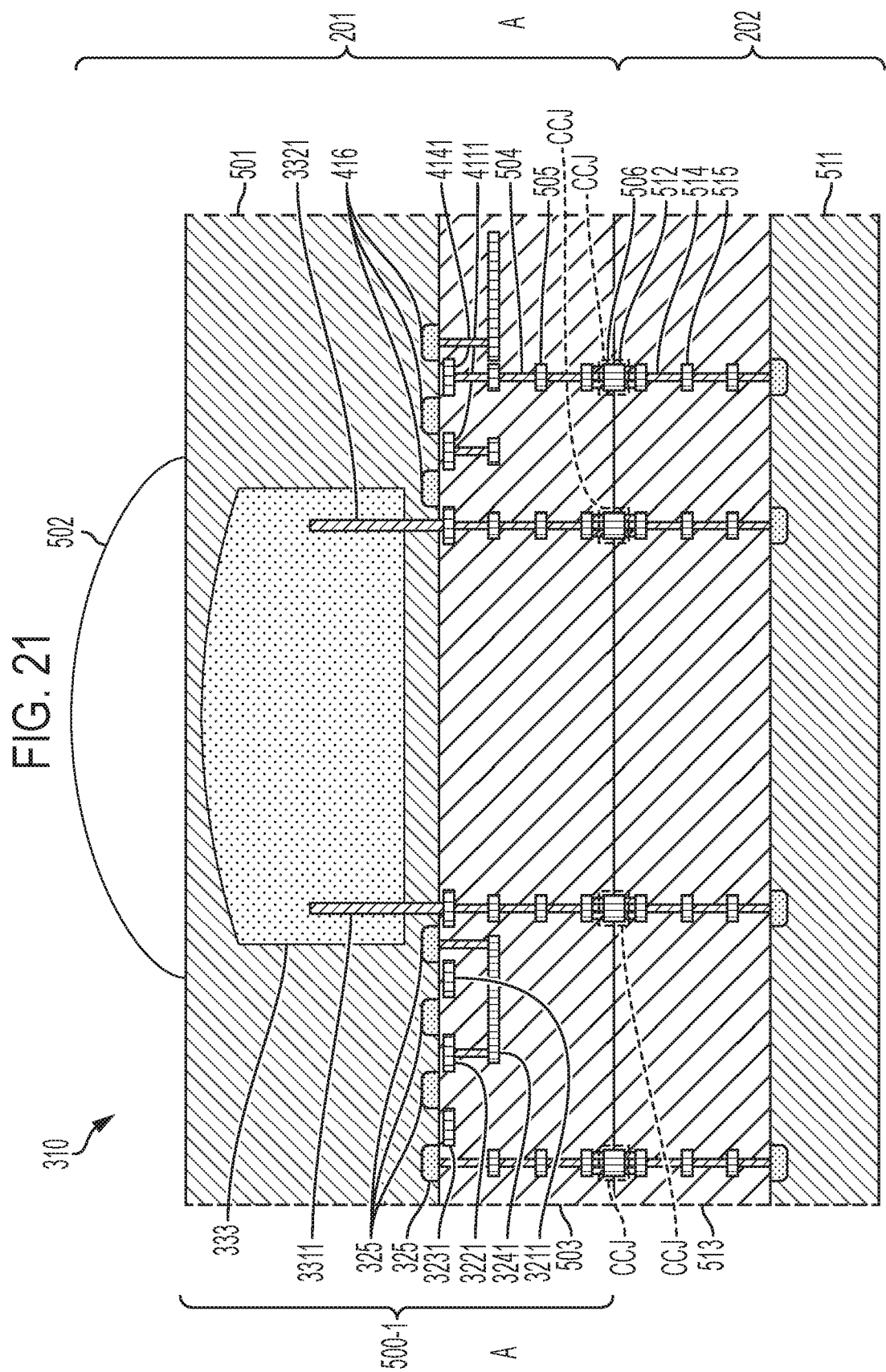
FIG. 21 is a view illustrating a cross-sectional structure example of a unit pixel in a case where the solid-state imaging device is cut out along plane XX-XX in FIG. 20.

Here, it should be understood that FIGS. 11-18 illustrate layouts from a plan view perspective where the transistors may include some portions formed in a same semiconductor substrate as the photoelectric conversion region 333 and other portions formed in a wiring layer attached to the semiconductor substrate (where the wiring layer and the semiconductor substrate are part of the light-receiving chip 201). For example, sources/drains of the transistors may be formed in a non-light receiving surface of the semiconductor substrate opposite to a light receiving surface of the semiconductor substrate while gates of transistors may be formed in a surface of the wiring layer that faces the non-light receiving surface of the semiconductor substrate. FIGS. 20 and 21 illustrate an example of the above.

FIG. 19A illustrates an example schematic of the converter 410 for each pixel 310 with a node 510 and an example layout 1900 of a bonding pad configuration to electrically connect circuitry in the logic chip 202 to the node 510 for each pixel 310 according to at least one example embodiment. As shown in FIG. 19A, the node 510 is an output node of the converter 410 (see, for example, FIG. 5). As further shown, the layout 1900 includes pixels 310, where each pixel 310 has a transistor region TR adjacent to a photoelectric conversion region 333, a bonding pad CC (e.g., CC1, CC2, CC3, CC4) for bonding to the logic chip 202, and vias V1 and V2 for making electrical connection between the bonding pad CC and the node 510. As shown in FIG. 19A, each bonding pad CC overlaps at least part of a respective pixel 310 and may have a rectangular shape (e.g., a square shape). For example, an entirety of each bonding pad CC is overlapped by a respective pixel 310. As further shown, the vias V1/V2 may be aligned with one another in the second direction at a central region of each bonding pad CC. Here it should be appreciated that more or fewer vias may be included as desired. The vias V1 and V2 may overlap the transistor region TR, but not the photoelectric conversion region 333. However, example embodiments are not limited thereto, and the relative locations of V1/V2 and the photoelectric conversion region 333 may be altered if desired.

FIG. 19A further illustrates an isolation region RFTI (rear full trench isolation) that isolates pixels 310 from one another by having a grid shape. Accordingly to at least one example embodiment the isolation region RFTI penetrates through the light-receiving chip 201 (i.e., full trench isolation). However, example embodiments are not limited thereto, and the isolation region RFTI may only partially penetrate the chip 201 (i.e., partial trench isolation).

Figure 19B:
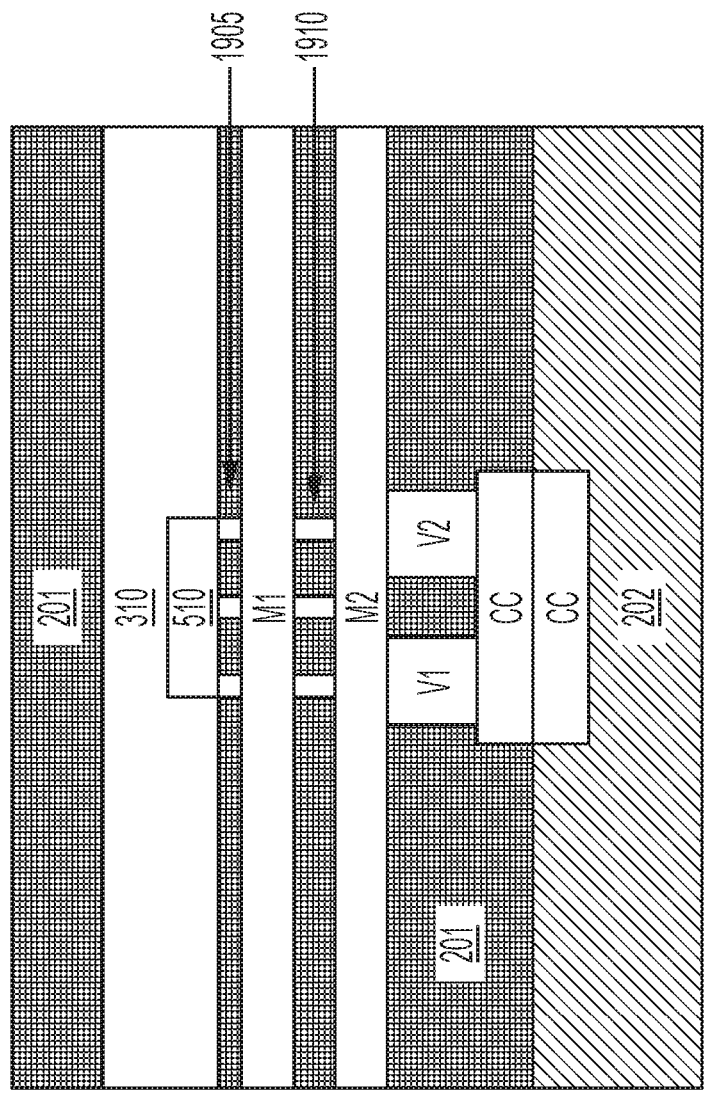
FIG. 19B illustrates a cross sectional view of FIG. 19A taken along line XIX-XIX.

FIG. 19B illustrates a cross sectional view of FIG. 19A taken along line XIX-XIX. FIG. 19B further illustrates the connection of the bonding pad CC in the light-receiving chip 201 to a bonding pad CC2 in the logic chip 202, contacts 1905, vias 1910, as well as one or more wiring layers M1/M2 (e.g., wiring layers comprising metal or other conductor) to make electrical connection to the pixel 310 (e.g., node 510 in FIG. 19A). Here, it should be understood that more or fewer metal wiring layers M1/M2 may exist if desired, and that the wiring layers M1/M2 may be formed in a wiring layer 503 of the chip 201. FIGS. 22-32 illustrate example layouts for wiring layers M1 and M2.

FIG. 20 is a top view illustrating an example layout 500-1 of the circuit 500 in FIG. 5A according to at least one example embodiment.

FIG. 21 is a view illustrating a cross-sectional structure example of a pixel 310 in a case where the imaging device is cut along plane XXI-XXI in FIG. 20.

As illustrated in FIG. 21, for example, the pixel 310 has a rear surface irradiation type structure in which a surface (hereinafter, referred to as "rear surface") opposite to an element forming surface (a lower surface in the drawing) of a semiconductor substrate 501 is set as a light incident surface. Here, the pixel 310 has a structure in which the light-receiving chip 201 including the semiconductor substrate 501 and an interlayer insulating film (or wiring layer) 503, and the logic chip 202 including a semiconductor substrate 511 and an interlayer insulating film (or wiring layer) 513 are joined by a Cu—Cu joint 510.

Circuit 500-1 is formed in the light-receiving chip 201. A microlens 502 is provided for every pixel 310 on a rear surface of the semiconductor substrate 501 in the light-receiving chip 201 to condense incident light to a photoelectric conversion element 333. Furthermore, although not illustrated in the drawing, for example, color filters arranged in a predetermined color filter array as illustrated in FIG. 4 may be disposed on the rear surface of the semiconductor substrate 501.

In addition, as illustrated in FIG. 20 and FIG. 21, the circuit 500-1 includes the photoelectric conversion element 333 that is formed by injecting an N-type dopant (donor) into the semiconductor substrate 501 in which a P-type dopant (acceptor) is diffused. A transmission gate 3311 of the transmission transistor 331, which is formed in a trench ranging from the element forming surface of the semiconductor substrate 501 to the photoelectric conversion element 333, is disposed at one corner portion of the photoelectric conversion element 333 in which a light-receiving surface has a rectangular shape. In addition, an OFG gate 3321 of the OFG transistor 332, which is formed in a trench ranging from the element forming surface of the semiconductor substrate 501 to the photoelectric conversion element 333, is formed at a corner portion that is diagonally located with respect to the corner portion at which the transmission gate 3311 is provided.

A reset gate 3211 of the reset transistor 321, an amplification gate 3221 of the amplification transistor 322, and a selection gate 3231 of the selection transistor 323 in the pixel signal generation unit 320 are linearly arranged in a line from the corner portion at which the transmission gate 3311 is disposed in parallel to a row direction. Furthermore, a gate insulating film is disposed between each of the reset gate 3211, the amplification gate 3221, and the selection gate 3231, and the semiconductor substrate 501.

In the semiconductor substrate 501, a diffusion region 325 that functions as a connection node is formed in a region between the transmission gate 3311 and the reset gate 3211. In addition, a diffusion region 325 that functions as a source and a drain is formed in each region between the reset gate 3211, the amplification gate 3221, and the selection gate 3231.

The diffusion region 325 between the transmission gate 3311 and the reset gate 3211, and the amplification gate 3221 are connected to each other by an interconnection 3241 that is formed in the interlayer insulating film 503 and functions as the floating diffusion layer 324. The diffusion region 325 between the reset gate 3211 and the amplification gate 3221 is connected to a power supply terminal VDD.

On the other hand, an LG gate 4111 of the LG transistor 411 and an LG gate 4141 of the LG transistor 414 in the converter 410 are linearly arranged in a line from the corner portion at which the OFG gate 3321 is disposed in parallel to the row direction on a side opposite to the pixel signal generation unit 320. In addition, an amplification gate 4121 of the amplification transistor 412 and an amplification gate 4131 of the amplification transistor 413 are arranged in parallel to the array of the LG gates 4111 and 4141. Furthermore, in FIG. 12, the amplification transistors 412 and 413 are omitted due to a cross-sectional position relationship. In addition, a gate insulating film is disposed between the LG gates 4111 and 4141 and the semiconductor substrate 501, and between the amplification gates 4121 and 4131 and the semiconductor substrate 501.

In the semiconductor substrate 501, a diffusion region 416 that functions as a connection node is formed in a region between the OFG gate 3321 and the LG gate 4111. In addition, a diffusion region 416 that functions as a source and a drain is formed in each of a region between the LG gate 4111 and the LG gate 4141 and a region between the amplification gate 4121 and the amplification gate 4131. In addition, a diffusion region 416 that functions as a drain of the LG transistor 414 is connected to a power supply terminal VDD, and a diffusion region 416 that functions as a drain of the amplification transistor 413 is grounded.

In addition, the diffusion region 416 between the OFG gate 3321 and the LG gate 4111 is connected to the amplification gate 4131, the diffusion region 416 between the LG gate 4111 and the LG gate 4141 is connected to the amplification gate 4121, the diffusion region 416 between the amplification gate 4121 and the amplification gate 4131 is connected to the LG gate 4111, and a diffusion region 416 that functions as a drain of the amplification transistor 412 is connected to the LG gate 4141.

In the above-described configuration, the diffusion region 325 that functions as a drain of the selection transistor 323, and the diffusion region 416 that functions as the drain of the amplification transistor 412 are each connected to a copper (Cu) pad 506 in a surface (a lower surface in the drawing) of the interlayer insulating film 503 through an interconnection 504 and a pad 505 which are formed in the interlayer insulating film 503. The Cu pad 506 is joined to a Cu pad 512 that is formed in a surface of the interlayer insulating film 513 on the semiconductor substrate 511 to form the Cu—Cu joint CCJ. The Cu—Cu joint CCJ functions as a connection portion that electrically connects the light-receiving chip 201 and the logic chip 202, and also functions as a joint for mechanically laminating the light-receiving chip 201 and the logic chip 202. Furthermore, the Cu pad 512 in the surface of the interlayer insulating film 513 is connected to the semiconductor substrate 511, for example, through an interconnection 514 and a pad 515 which are formed in the interlayer insulating film 513.

Accordingly, the diffusion region 325 that functions as the drain of the selection transistor 323 is connected to the vertical signal line VSL on the logic chip 202 side through the interconnection 504, the pad 505, and the Cu—Cu joint CCJ in the interlayer insulating film 503. In addition, the diffusion region 416 that functions as the drain of the amplification transistor 412 is connected to remaining circuit configurations of the current-voltage conversion unit 410 that is disposed on the logic chip 202 side through the interconnection 504, the pad 505, and the Cu—Cu joint CCJ in the interlayer insulating film 503.

In addition, although not illustrated in the drawing, as illustrated in FIG. 5A, the transmission gate 3311 and the OFG gate 3321 in the light-receiving unit 330, and the reset gate 3211 and the selection gate 3231 in the pixel signal generation unit 320 are connected to the drive circuit 211 of the logic chip 202 through the interconnection 504, the pad 505, and the Cu—Cu joint CCJ in the interlayer insulating film 503.

As described above, when the pixel signal generation unit 320 and the converter 410 are laid out to linearly extend from the corner portions of the photoelectric conversion element 333, respectively, it is possible to shorten an interconnection length. With this arrangement, it is possible to reduce the occupation ratio of the pixel signal generation unit 320 and the converter 410 on the light-receiving surface, and thus the occupation ratio of the photoelectric conversion element 333 increases. As a result, it is possible to improve light-reception efficiency.

In addition, it is possible to use an NMOS transistor as the respective transistors which constitute the pixel signal generation unit 320, and the respective transistors which constitute the converter 410. Accordingly, when disposing the transistors in the same light-receiving chip 201, it is possible to simplify a manufacturing process of the light-receiving chip 201.

In addition, a layout of the respective transistors which constitute the pixel signal generation unit 320, and a layout of the respective transistors which constitute the converter 410 are similar to each other, and thus when the configurations are disposed in the same light-receiving chip 201, it is also possible to make a layout design of the light-receiving chip 201 easy.

Although not explicitly shown, it should be understood that the layouts shown in FIGS. 22-32 may have the same or similar locations of transistors and photoelectric conversion elements in a cross sectional view. That is, the transistors in the following figures may be formed at a non-light receiving surface of a semiconductor substrate that includes the photoelectric conversion element 333.

Figure 22:
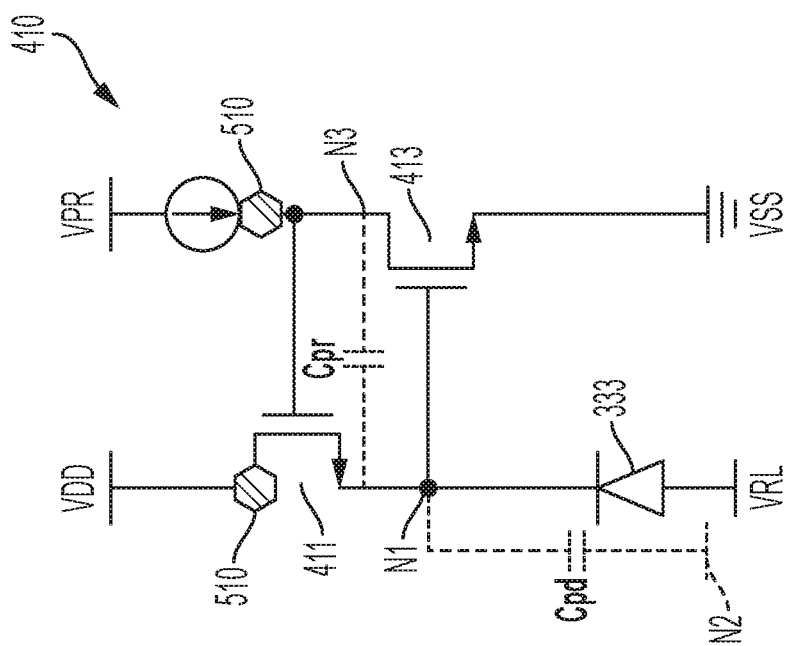
FIG. 22 is a view illustrating an example schematic of the layouts shown in FIGS. 14-18 according to at least one example embodiment.

FIG. 22 is a view illustrating an example schematic of the layouts shown in FIGS. 14-18 according to at least one example embodiment. As shown in FIG. 22, the converter 410 includes the transistors 411 and 413 coupled to the photoelectric conversion region 333. As discussed with respect to FIGS. 5A and 5B, nodes 510 indicate points of electrical contact made between the converter 410 and other elements (e.g., copper bonding pads). FIG. 22 further illustrates a first capacitance Cpd that exists between a first node N1 coupled to the photoelectric conversion region 333 and a second node N2 coupled to the photoelectric conversion region 333. FIG. 22 also shows a second capacitance Cpr that exists between the first node N1 and a third node N3 that is coupled to the transistors 411/413. Additionally or alternatively, the second capacitance Cpr may exist between the third node N3 and ground (VSS). The first node N1 is between a cathode of the photoelectric conversion region 333 and the first transistor 411, the second node N2 is an anode of the photoelectric conversion region 333 or a common node that receives a potential VRL, and the third node is between a gate of the first transistor 411 and the second transistor 413. A source of the transistor 411 may be connected to the photoelectric conversion region 333. For example, the source of transistor 411 may be connected to an edge or a center of the photoelectric conversion region 333 depending on a desired value of Cpd (see FIGS. 23-31 for edge connection and FIG. 32 for center connection).

The ratio of Cpr to Cpd may have an effect on a transfer function of charge from the photoelectric conversion region 333 to the converter 410. Accordingly, at least one example embodiment employs one or more wirings in wiring levels M1/M2 (e.g., made of metal) to stabilize the transfer function by controlling the ratio of Cpr to Cpd to be a desired ratio. For example, as illustrated in the figures discussed below, a first level of wirings M1 is arranged to adjust Cpd so that a ratio of Cpr to Cpd is about 0.32, which enables a stable transfer function with a positive phase margin. As shown in FIG. 22, a negative potential VRL may be applied to a well region (e.g., a P-well region) having the photoelectric conversion region 333 disposed therein to deplete the photoelectric conversion region and reduce a capacitance Cpd of the photoelectric conversion region 333.

Figure 23A:
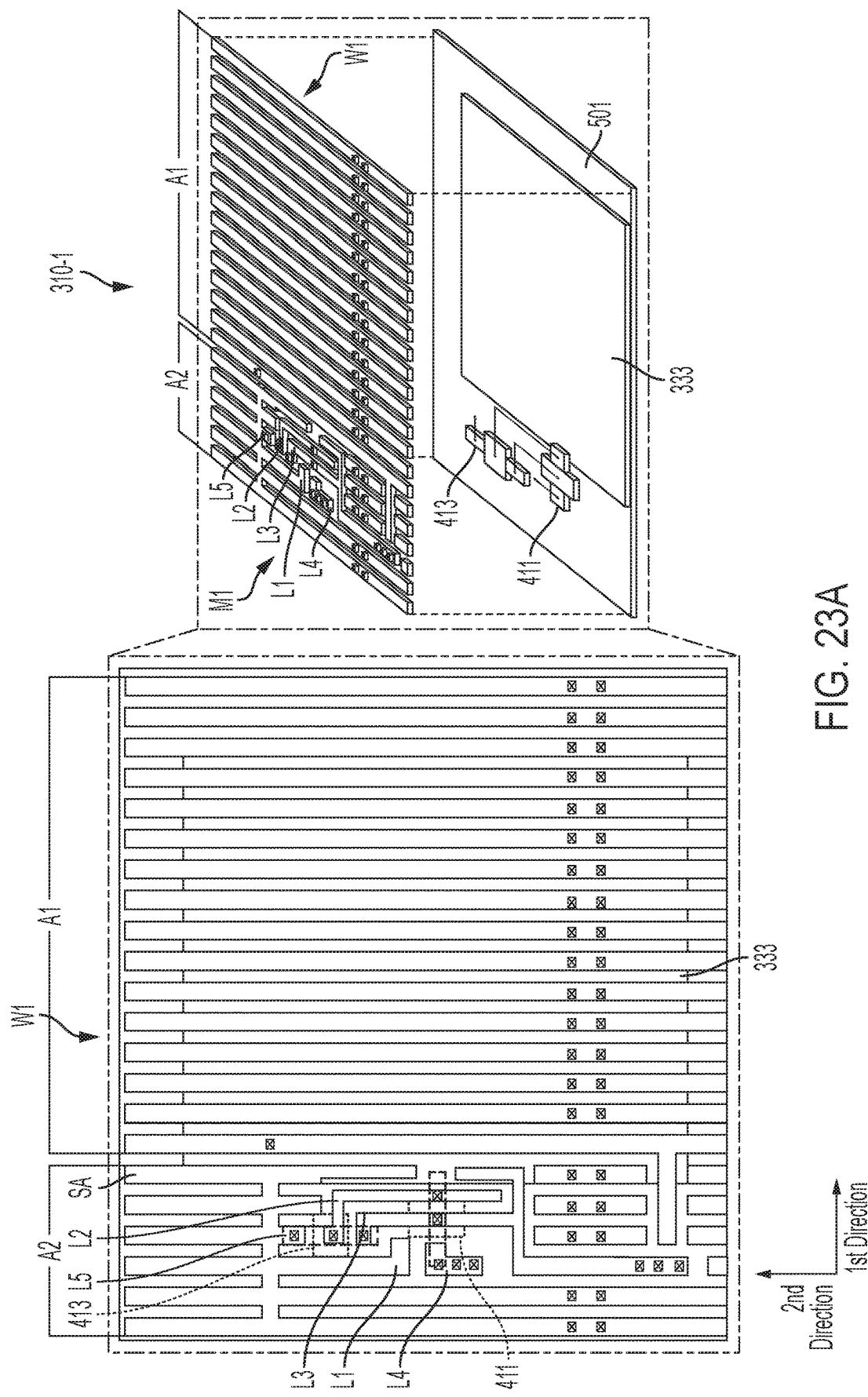
FIG. 23A illustrates a plan view and an exploded view of a pixel having an example wiring layout according to at least one example embodiment.

FIG. 23A illustrates a plan view and an exploded view of a pixel 310-1 having an example wiring layout according to at least one example embodiment. FIG. 23A illustrates a first substrate 501 (see FIG. 21) including a first pixel 310-1. The first pixel 310-1 includes a first photoelectric conversion region 333 disposed in the first substrate 501 and that converts incident light into first electric charges. The first pixel 310-1 includes a first readout circuit including a first converter 410 that converts the first electric charges into a first logarithmic voltage signal. The first converter 410 includes a first transistor 411 coupled to the first photoelectric conversion region 333 and a second transistor 413 coupled to the first transistor 411. The layout of the transistors 411/413 may be the same as or similar to that shown in FIG. 14.

As in FIG. 21, a wiring layer 503 may be on the first substrate 501. The wiring layer 503 may include a first level of wirings M1 arranged in a first arrangement A1 overlapping the first photoelectric conversion region 333 and in a second arrangement A2 overlapping the transistors 411 and 413. As shown, the second arrangement A2 is different than the first arrangement A1. For example, the first arrangement A1 includes linear wiring segments W1 positioned at regular intervals along a first direction. The wiring segments W1 extend in a second direction perpendicular to the first direction. The second arrangement A2 includes one or more non-linearly shaped wiring segments L1 to L4. As shown, the one or more non-linearly shaped wiring segments include a non-linearly shaped segment L3 overlapping and electrically connecting with a power supply terminal VPR, a gate of the first transistor 411 and a drain of the second transistor 413, and a non-linearly shaped segment L2 overlapping and electrically connecting with a source of the first transistor 411 and a gate of the second transistor 413. FIG. 23A further shows a non-linearly shaped segment L1, and a non-linearly shaped segment L4 that overlaps and electrically connects with a drain of the first transistor 411. In the instant description, it should be appreciated that referring to a segment as being non-linearly shaped may mean that the segment includes one or more portions that extend in the first direction and one or more portions that extend in the second direction. For example, non-linearly shaped segment L3 has a first L-shape located over the photoelectric conversion region 333 and another L-shape located over the substrate 501. A source of transistor 413 is electrically connected to ground (VSS) through wiring segment L5.

As further shown, transistor 413 is between segment L1 and segment L2 in the first direction. Segment L2 is between portions of segment L3 in the first direction. Segment L3 is between segment L1 and segment L2 in the first direction. Segment L4 is between segment L1 and segment L3 in the second direction. As shown, segment L3 and wiring segment SA end before a location where a source of the transistor 411 is coupled to the photoelectric conversion region 333 so that the source of the transistor 411 is not overlapped by any wiring segments.

The above described configuration of the first level of wirings M1 is arranged to adjust Cpd so that a ratio of Cpr to Cpd is about 0.32, which enables a stable transfer function with a positive phase margin. For example, the wiring segments in arrangement A2 contribute to adjusting Cpd to a desired ratio. It should be understood that wiring arrangements different from arrangement A2 may also be employed to achieve a same or similar ratio of Cpr to Cpd.

Here, it should be appreciated that the non-linearly shaped segments L1 to L5 may provide electrical connections to sources/drains/gates of transistors 411 and 413. For example, segment L3 may apply power supply signals from power supply terminals VDD and VPR to drains of transistors 411 and 413, respectively. Segment L4 may apply the power supply signal to a gate of transistor 411 through terminal VPR. Segment L2 may electrically connect the source of transistor 411 to the gate of transistor 413. One or more of the wiring segments L1 to L5 may include portions that extend beyond points of electrical connection to help control the capacitance Cpd (see, e.g., segment L2).

With reference to FIG. 21 and FIG. 23A, it should further be appreciated that the transistors 411 and 413 may be formed in the substrate 501 and/or the wiring layer 503 at a non-light incident side of the pixel 310-1. In addition, it should be understood that the metal layer M1 (and M2 in FIG. 23B) may be formed in the wiring layer 503 between the transistors 411/413 and the wiring layer 513 of the logic chip 202 (see also FIG. 19B).

As shown in FIG. 23A, some of the wiring segments in A1 and A2 include vias V for making electrical connections to other layers within the pixel 310-1 (not all vias V labeled, but indicated by boxes with an 'x' inside). More or fewer vias V may be included if desired. These connections are described in more detail below with reference to FIG. 23B.

Figure 23B:
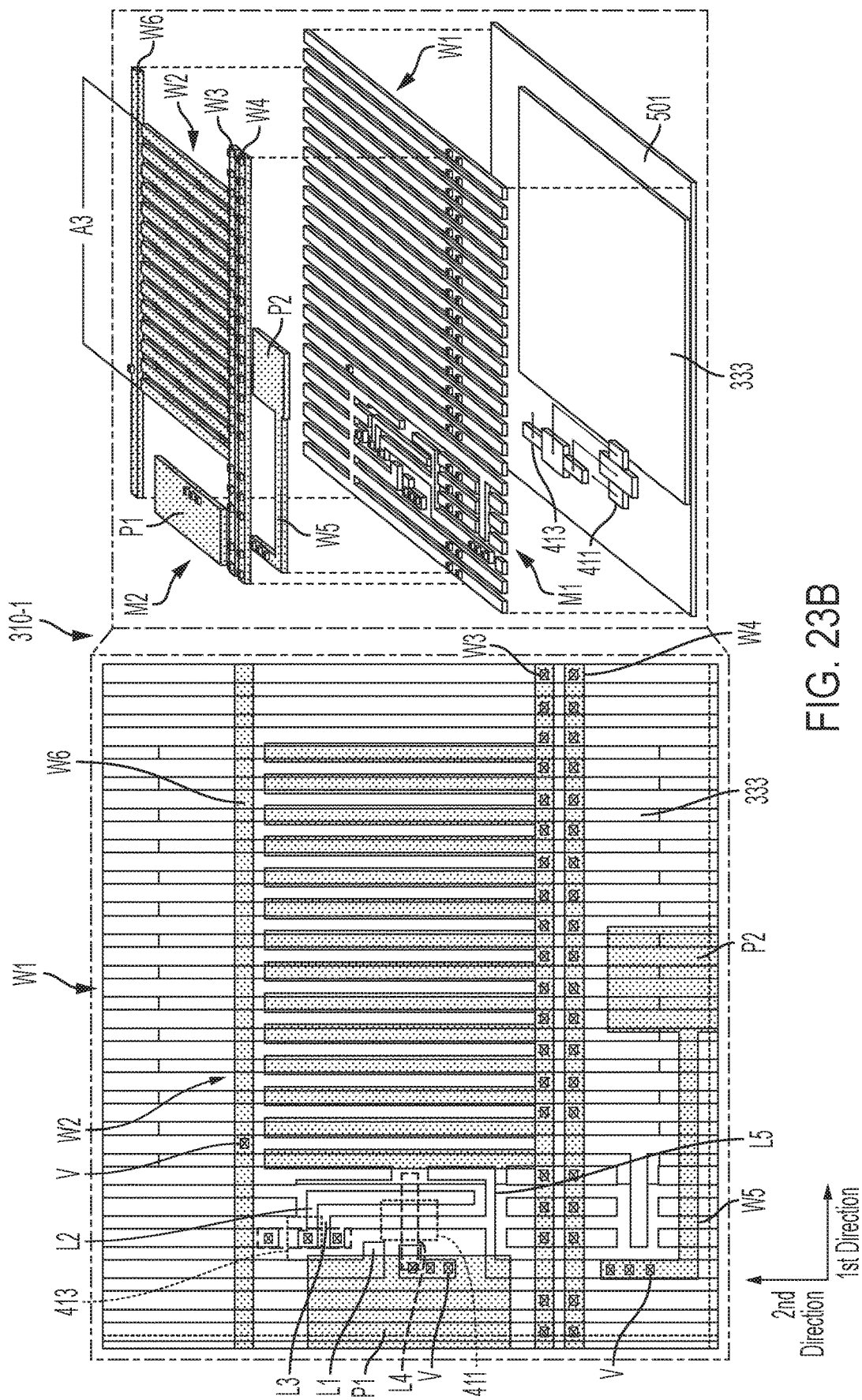
FIG. 23B illustrates a plan view and an exploded view of the pixel of FIG. 23A having an additional level of wirings according to at least one example embodiment.

FIG. 23B illustrates a plan view and an exploded view of the pixel 310-1 of FIG. 23A having an additional level of wirings according to at least one example embodiment. As shown in FIG. 23B, the pixel 310-1 of FIG. 23A may further include a second level of wirings M2 that overlap the pixel 310-1. The second level of wirings M2 includes third wirings W2 that overlap the first photoelectric conversion region 333 and that extend in the second direction in a third arrangement A3. As illustrated in FIG. 23B, the wirings W2 may occupy spaces between the wirings W1 in a plan view. The wirings W1 and W2 may serve a light shielding function to block light from passing through the wiring layer 503 to, for example, the logic chip 202. The second level of wirings M2 may further include pads P1 and P2 and wirings W3 to W6. The pads P1 and P2 may be conductive pads that receive the power supply signals for terminals VDD and VPR, respectively. Wirings W3 and W4 may extend in the first direction and be electrically connected to a node that receives a ground voltage VSS. Wiring W5 may include portions that extend in the first direction and the second direction, and may be electrically connected to the pad P2. The pad P2 may receive a power supply signal (e.g., from logic chip 202) that is fed to transistors 411 and 413 through vias V and segment L3. Wiring W6 may receive the negative potential VRL, which is applied to the well region of the substrate 501 through other vias V. The well region may correspond to a region of the substrate that does not include the photoelectric conversion region 333.

As shown, pad P1 may overlap some of the wirings in the arrangement A2, including portions of segments L1 and L4, and a drain of transistor 411. The pad P1 may include one or more vias V for making electrical contact to the transistor 411 through M1.

In general and with reference to FIG. 23A-32, wirings or wiring segments in M1 and/or M2 overlapping the photoelectric conversion region 333 are connected to ground (VSS) or a potential VRL (e.g., a negative potential). As shown, M1 and M2 in regions overlapping the photoelectric conversion region 333 are positioned in parallel or perpendicular to one another to achieve a desired optical shield. When position in parallel to one another, wirings in M2 may exist in spaces between wirings in M1 so that the wirings of M2 overlap or almost overlap portions of neighboring wirings in M1. On the other hand, metal wirings or wiring segments in M1 and M2 overlapping regions other than the photoelectric conversion region 333 are connected to VDD/VPR and/or are used for wiring between transistors. As noted above, level 1 metal (M1) and level 2 metal (M2) are designed to achieve a desired capacitance for the speed and stability of charge transfer from the photoelectric conversion region 333 to other circuitry. Also, in general, wiring segments that overlap sources, drains, and/or gates of transistors may also provide electrical connections to those regions of the transistors. Further still, transistors in FIGS. 23A-32 are indicated by dashed or dotted lines, with gates of each transistor being located in between sources and drains of each transistor.

Figure 24:
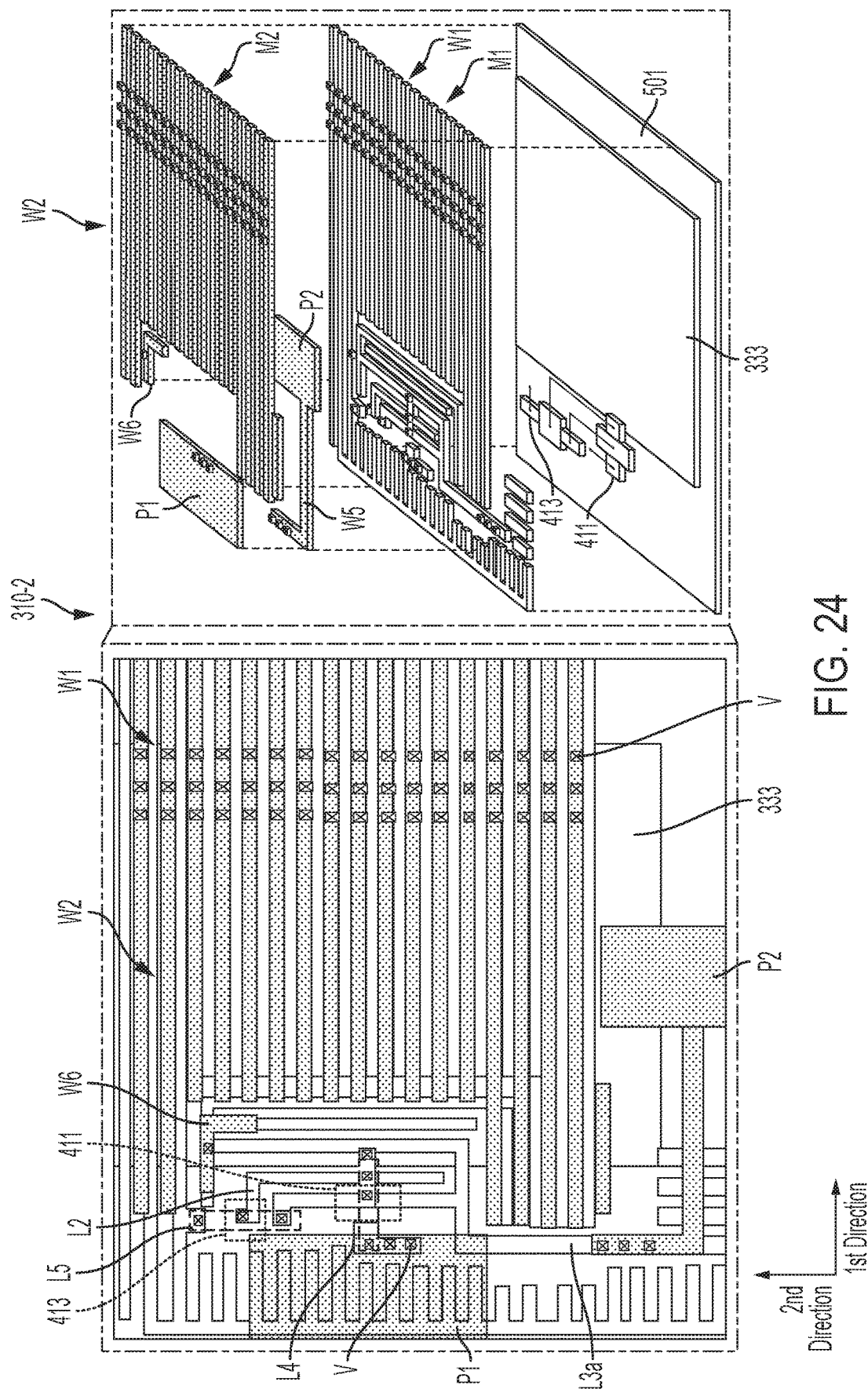
FIG. 24 illustrates a plan view and an exploded view of a pixel having an example wiring layout according to at least one example embodiment.

FIG. 24 illustrates a plan view and an exploded view of a pixel 310-2 having an example wiring layout according to at least one example embodiment. FIG. 24 illustrates an example embodiment of a pixel 310-2, and includes many of the same elements in the same locations as in FIGS. 23A and 23B. Accordingly, a description of these elements will not be repeated. However, in FIG. 24, the wirings W1 and W2 in the first and second levels of wirings M1 and M2 extend in the first direction to overlap the photoelectric conversion region 333. As in FIG. 23B, the wirings W2 may overlap neighboring wirings M1 and exist in spaces between the wirings W1 to serve as a light shield. Non-linearly shaped wiring segments L2 and L4 are in the same arrangement and serve the same functions as in FIGS. 23A and 23B. FIG. 24 includes a non-linearly shaped wiring segment L3a that overlaps the photoelectric conversion region 333 and which carries a power supply signal to a drain of transistor 413 through terminal VPR, P2 and W5. FIG. 24 further illustrates that each wiring in the wirings W1 and W2 include three vias V for making electrical connection to other layers (e.g., to ground voltage VSS). Wiring W6 is electrically connected to potential VRL, and a source of transistor 413 is connected to VSS through one of the wirings W1 closest to the source of transistor 413.

FIG. 25 illustrates a plan view and an exploded view of a pixel 310-3 having an example wiring layout according to at least one example embodiment. FIG. 25 illustrates an example embodiment of a pixel 310-3, and includes many of the same elements in the same locations as in FIGS. 23A and 23B. Accordingly, a description of these elements will not be repeated. As shown in FIG. 25, the wirings W1 extend in the second direction while the wirings W2 extend in the second direction. Having the wirings W1 and W2 perpendicular to one another may reduce crosstalk between lines carrying signals and also create multiple pathways for connection to the logic chip 202. Here, it should be understood that the extension directions for wirings W1 and W2 may be swapped if desired. For example, wirings W1 may extend in the first direction while wirings W2 may extend in the second direction. Non-linearly shaped wiring segments L2, L3, L4, and L5 are in the same arrangement and serve the same functions as in FIGS. 23A and 23B.

Figure 26A:
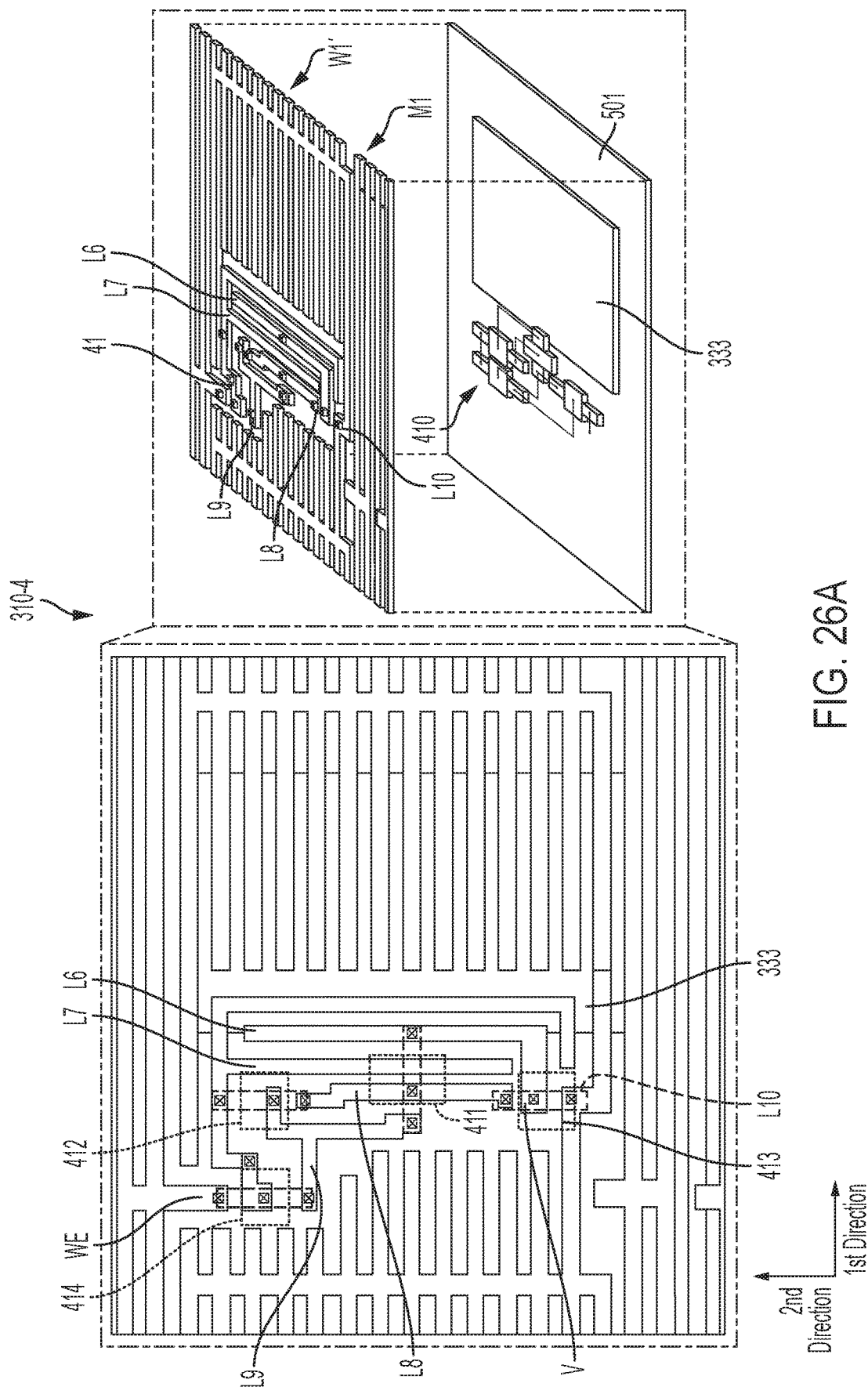
FIG. 26A illustrates a plan view and an exploded view of a pixel having an example wiring layout according to at least one example embodiment.

FIG. 26A illustrates a plan view and an exploded view of a pixel 310-4 having an example wiring layout according to at least one example embodiment. Compared to FIGS. 23A to 25, FIG. 26A illustrates a 4T configuration for the converter 410 (see also FIG. 5B). As shown, the first level of wirings M1 includes wirings W1' extending in the first direction. The first level of wirings M1 also includes one or more non-linearly shaped wiring segments L6 to L10 that overlap transistors 411, 412, 413, and 414 and provide electrical connections for the transistors. For example, wiring L6 may overlap a gate of transistor 413 and a source of the transistor 411, and electrically connect with the drain of the transistor 411, the gate of the transistor 413, and the photoelectric conversion region 333. Wiring L7 may overlap a gate of transistor 411, and overlap and electrically connect with a gate of transistor 414 and a drain of transistor 412. Wiring L7 may be electrically connected with a terminal VPR to receive a power supply signal. Wiring L8 may overlap and electrically connect to the gate of transistor 411, and overlap and electrically connect with a drain of transistor 413 and a source of transistor 412. Wiring L9 may overlap and electrically connect with a drain of the transistor 411, a source of transistor 414, and a gate of transistor 412. Wiring L10 may overlap and electrically connect with the source of the transistor 413. Wiring L10 may be electrically connected to ground (VSS). As in FIGS. 23A to 25, wirings L6 to L10 may have irregular (non-linear) shapes in order to adjust the capacitance Cpd to achieve a desired ratio between Cpr and Cpd. Wiring WE electrically connects to a drain of transistor 414 to terminal VDD for receiving a power supply signal. As shown in FIG. 26A, portions of one or more of the non-linear wiring segments L6 to L10 may extend beyond points of electrical connections to transistors in order to adjust the capacitance Cpd.

Figure 26B:
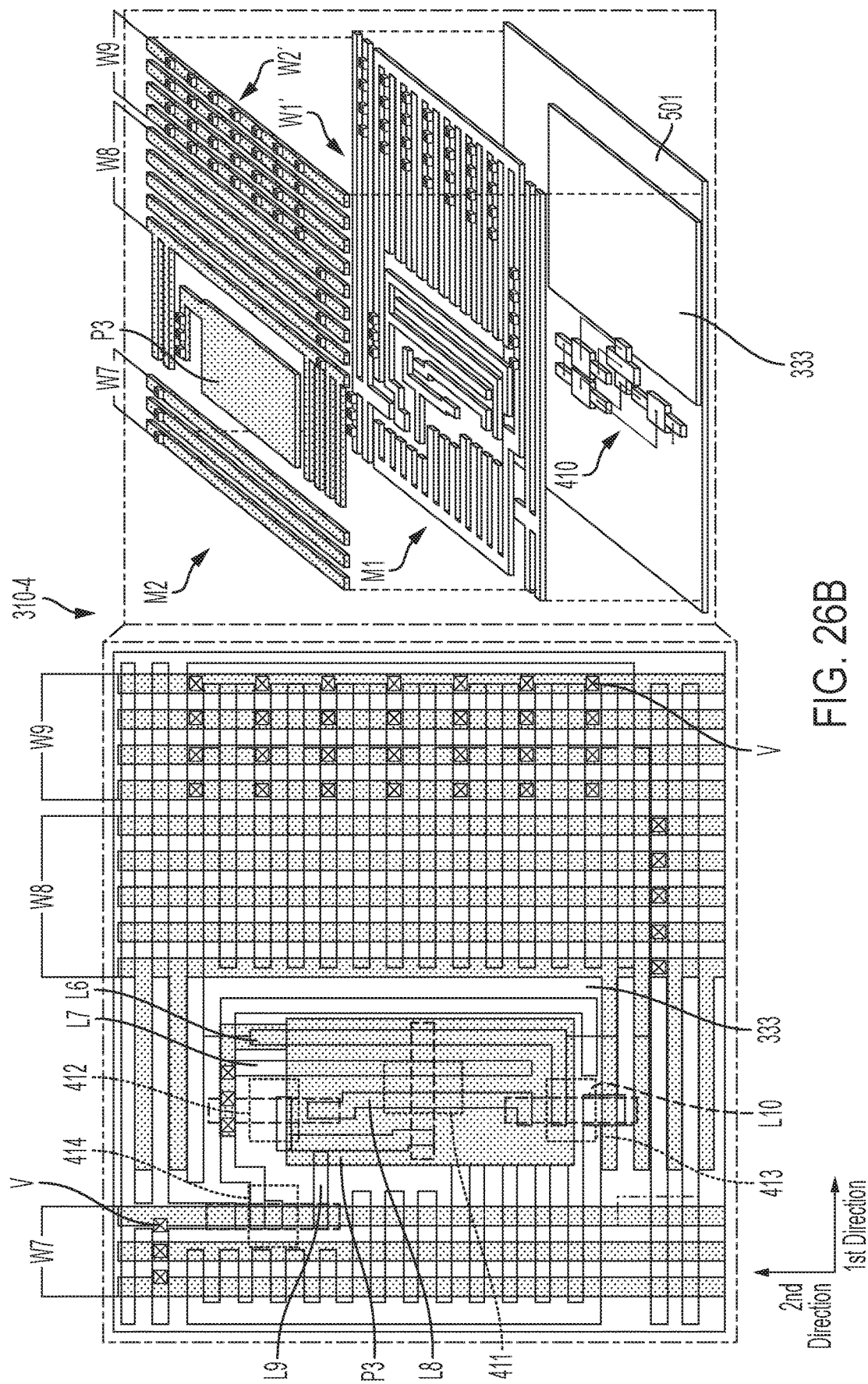
FIG. 26B illustrates a plan view and an exploded view of the pixel of FIG. 26A having an additional level of wirings according to at least one example embodiment.

FIG. 26B illustrates a plan view and an exploded view of the pixel 310-4 of FIG. 26A having an additional level of wirings according to at least one example embodiment. FIG. 26B shows the first level of wirings M1 from FIG. 26A and a second level of wirings M2. As shown, the second level of wirings M2 includes a pad P3 that receives a power supply signal and wirings W7 that also receive the power supply signal through, for example, terminal VPR. The pad P3 may overlap the transistor 411 and portions of the transistors 412 and 413. The wirings W2' include a portion of wirings W8 that receive the potential VRL, and another portion of wirings W9 that receive the ground potential VSS. As shown, the wirings W2' extend in the second direction. The wirings W1' and W2' may provide a light shielding function. Having the wirings W1' and W2' perpendicular to one another allows many possible pathways for connection to the logic chip 202, and in some cases, shorter pathways to the logic chip 202. Here, it should be understood that the extension directions for wirings W1' and W2' may be swapped if desired.

As further shown in FIGS. 26A and 26B, some wirings include vias V to make electrical connections (not all vias V labeled, but indicated by boxes with an 'x' inside). For example, pad P3 includes vias that electrically connect with a drain of transistor 412 through M1. In addition, wirings W7 include vias that electrically connect with a power supply signal and the drain of transistor 414 through M1. More or fewer vias may be included in FIGS. 26A and 26B if desired.

Figure 27:
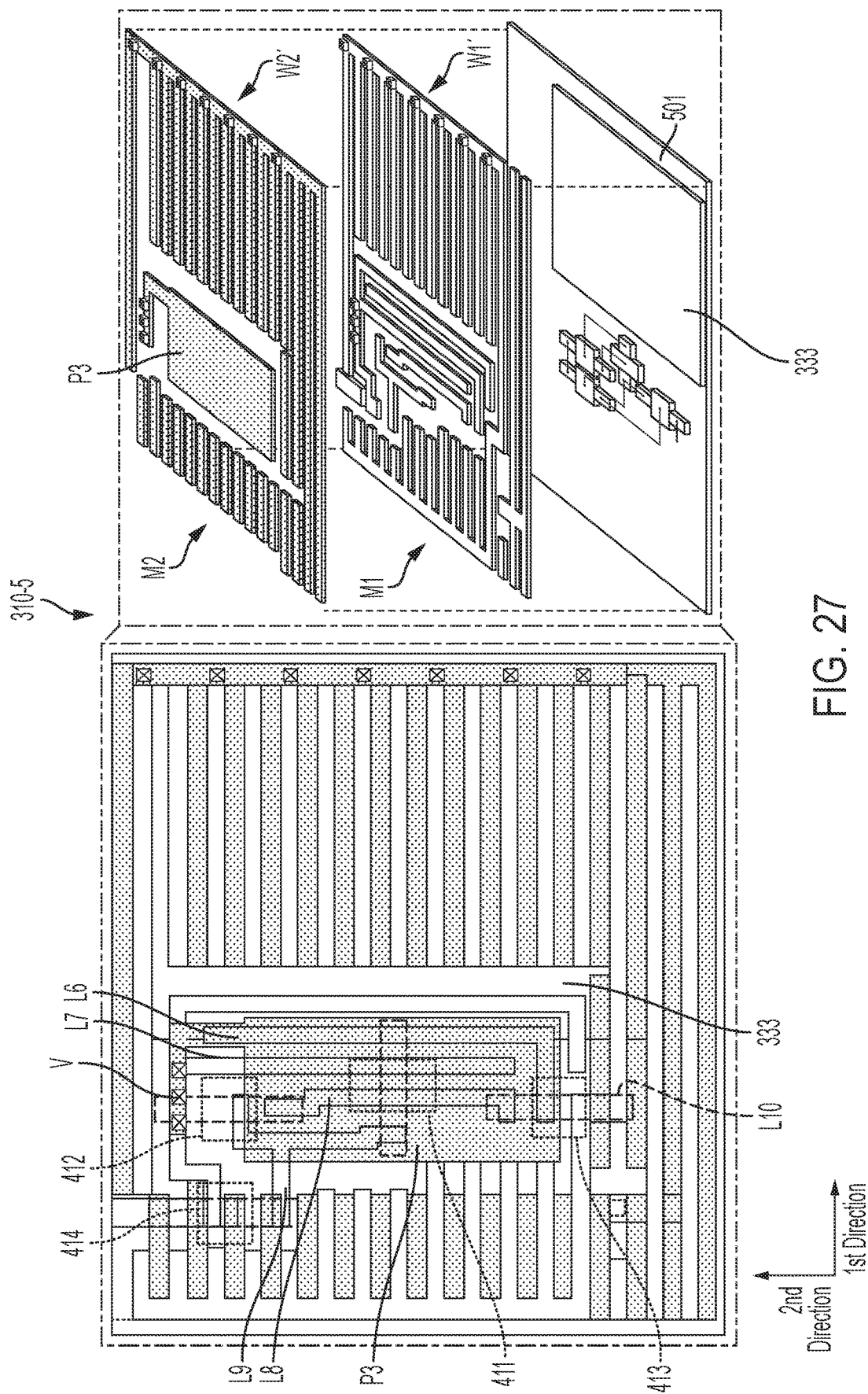
FIG. 27 illustrates a plan view and an exploded view of a pixel having an example wiring layout according to at least one example embodiment.

FIG. 27 illustrates a plan view and an exploded view of a pixel 310-5 having an example wiring layout according to at least one example embodiment. FIG. 27 illustrates a wiring layout for a pixel 310-5, and includes many of the same elements in the same locations as in FIGS. 26A and 26B. Accordingly, a description of these elements will not be repeated. In FIG. 27, however, wirings W1' and W2' extend in the first direction. Wirings W2' may exist in spaces between wirings W1' to provide a light blocking function. It should be understood that M2 provides electrical connection between sections of M1 and terminals VPR and/or VDD where needed. That is, portions of M2 carry power supply signals from terminals VDD and/or VPR to portions of M1 that are connected to the appropriate areas of each transistor (e.g., transistors 414 and 412).

Figure 28:
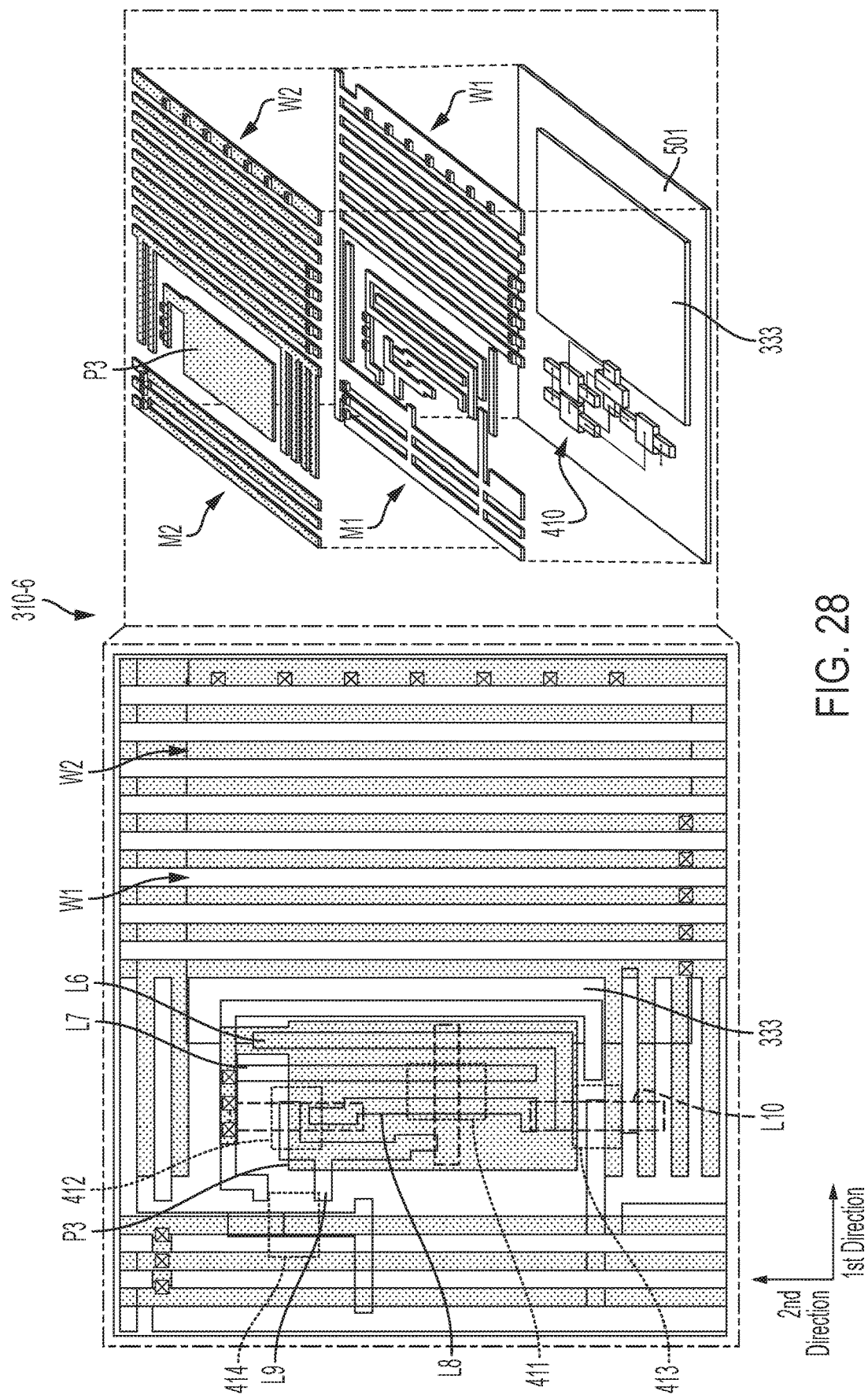
FIG. 28 illustrates a plan view and an exploded view of a pixel having an example wiring layout according to at least one example embodiment.

FIG. 28 illustrates a plan view and an exploded view of a pixel 310-6 having an example wiring layout according to at least one example embodiment. FIG. 28 illustrates a wiring layout for a pixel 310-6, and includes many of the same elements in the same locations as in FIGS. 26A and 26B. Accordingly, a description of these elements will not be repeated. In FIG. 28, however, wirings W1' and W2' extend in the second direction. Wirings W2' may exist in spaces between wirings W1' to provide a light blocking function.

Figure 29A:
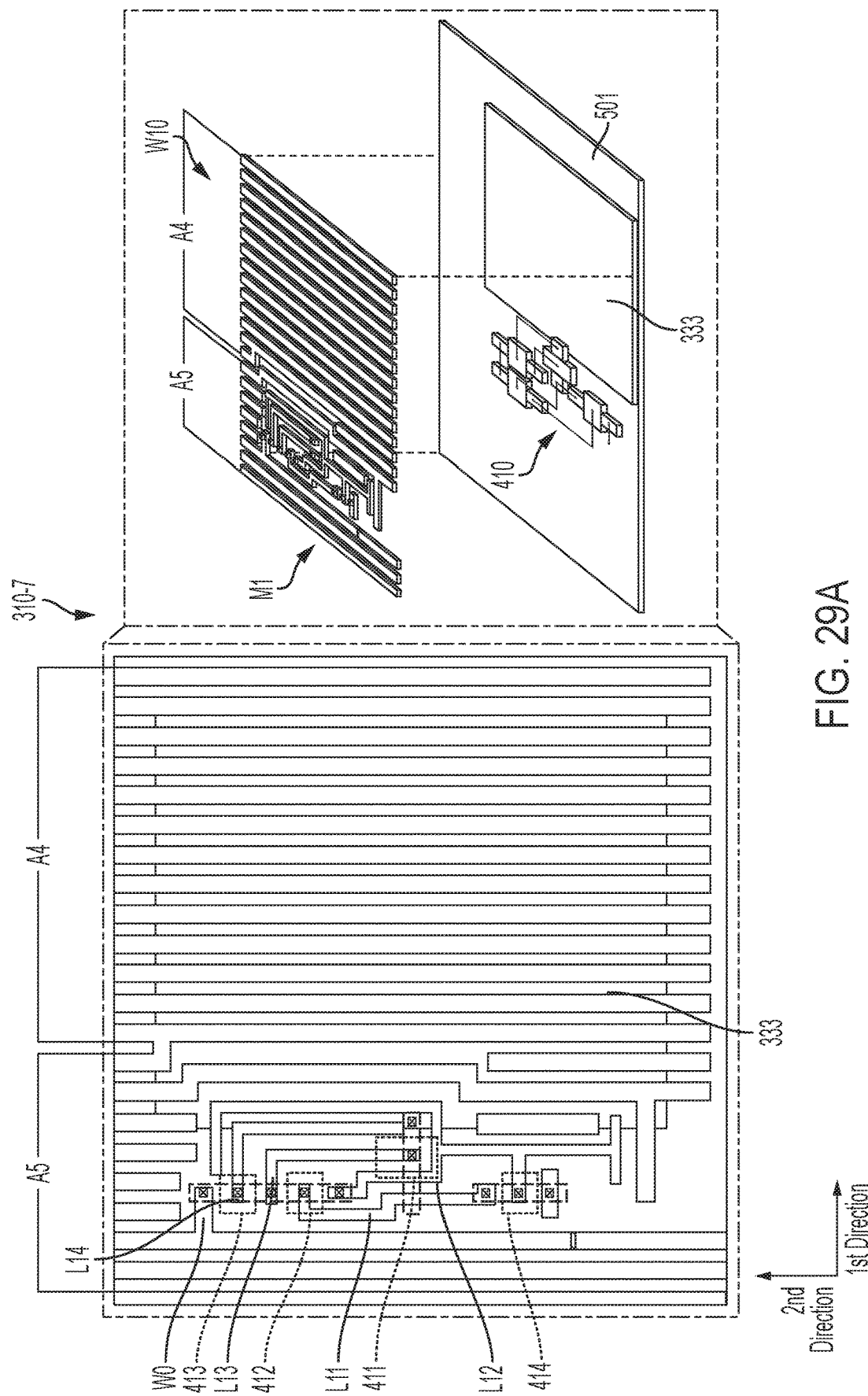
FIG. 29A illustrates a plan view and an exploded view of a pixel having an example wiring layout according to at least one example embodiment.

FIG. 29A illustrates a plan view and an exploded view of a pixel 310-7 having an example wiring layout according to at least one example embodiment.

The layout of the transistors 411, 412, 413, and 414 in FIG. 29A is the same as or similar to that shown in FIG. 12. FIG. 29A further illustrates wirings W10 in an arrangement A4, where the wirings W10 are linear and extend in the in the second direction and are spaced apart from one another at regular intervals. As shown, an arrangement A5 of wirings includes non-linear wirings or wiring segments L11 to L14 and WD, which are positioned to adjust capacitance Cpd in accordance with example embodiments described above. As shown, segment L11 overlaps and electrically connects with a gate of transistor 412, a drain of transistor 411, and a source of transistor 414. The segment L12 overlaps and electrically connects with a drain of transistor 412. The segment L12 may also overlap the gate of transistor 411 and receive a power supply signal through terminal VPR. The segment L13 overlaps and electrically connects with a source of transistor 412, a drain of transistor 413, and the gate of transistor 411. The segment L14 overlaps and is electrically connected to the gate of transistor 413 and a source of transistor 411. The segment WD overlaps and electrically connects with a drain of transistor 414 while receiving a power supply signal through terminal VDD.

Figure 29B:
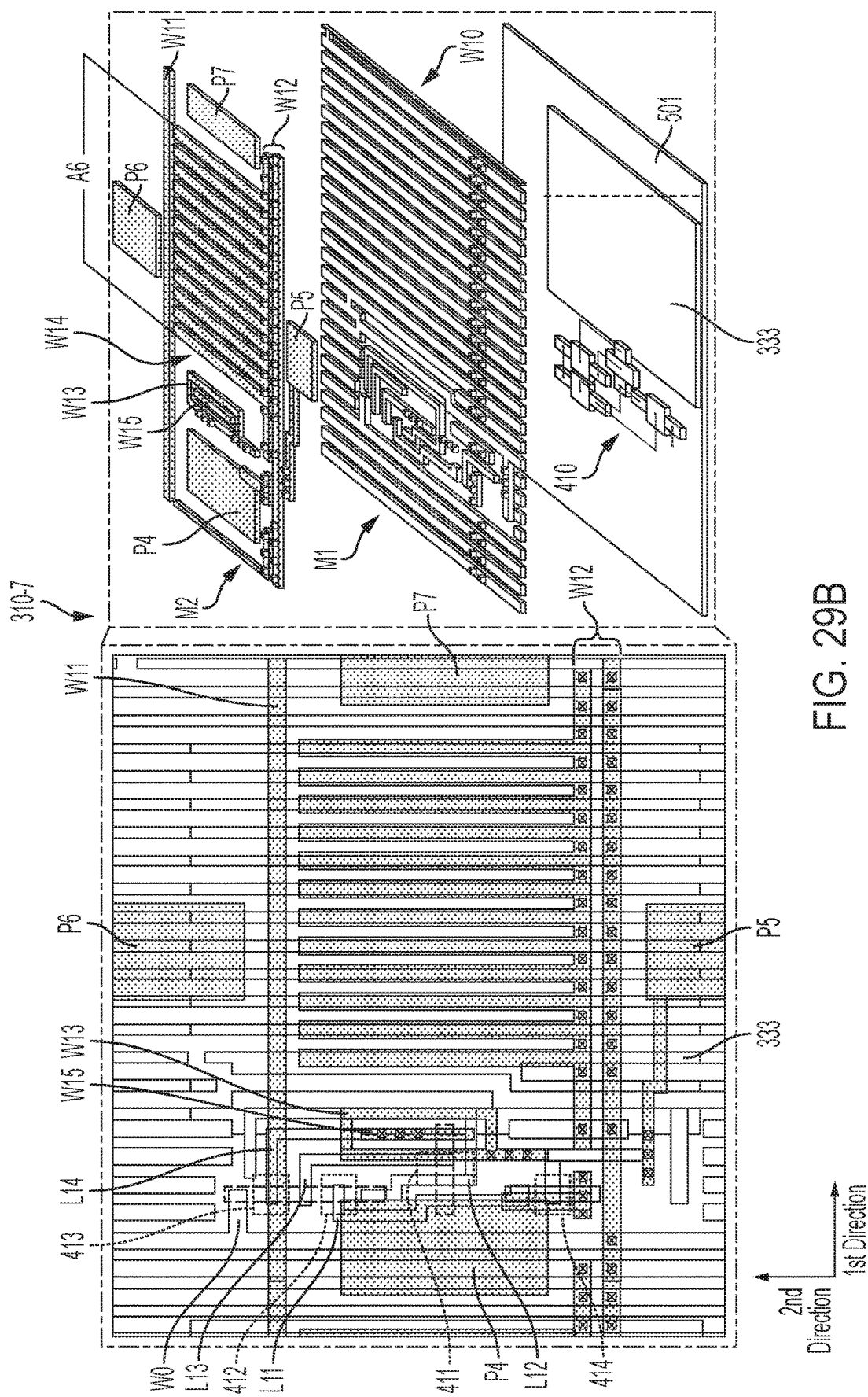
FIG. 29B illustrates a plan view and an exploded view of the pixel of FIG. 29A having an additional level of wirings according to at least one example embodiment.

FIG. 29B illustrates a plan view and an exploded view of the pixel 310-7 of FIG. 29A having an additional level of wirings according to at least one example embodiment. As shown in FIG. 29B includes many of the same elements in the same locations as in FIG. 29A. Accordingly, a description of these elements will not be repeated. FIG. 29B illustrates a second level of wirings M2 that includes a pad P4, a pad P5, a pad P6, and a pad P7. Pads P4 and P7 may be connected to a terminal VDD for respective pixels. That is, pad P4 is connected to a terminal VDD for the pixel 310-7 while the pad P7 is connected to a terminal VDD for a pixel neighboring pixel 310-7. Pads P5 and P6 may be connected to a terminal VPR for respective pixels. For example, pad P5 is connected to a terminal VPR for pixel 310-7 while pad P6 is connected to a terminal VPR for a pixel neighboring pixel 310-7. Wiring W11 in M2 may be electrically connected to a terminal that receives the potential VRL.

The second level of wirings M2 includes an arrangement A6 of wirings W14 that extend in the second direction. The wirings W14 may exist in spaces between wirings W10 to provide a light blocking function for the pixel 310-7. The second level of wirings M2 includes wirings W12 and W13. Wirings W12 may be connected to a ground signal VSS, and wirings W13 may be connected to a terminal VPR through pad P5 and segment L13. The wirings W13 may further be connected to the drain of transistor 412 and the gate of transistor 411 through the connection to segment L13. The second level of wirings M2 may further include wiring W15 surrounded by wiring W14. Wiring W15 may be connected to a source of transistor 411 and a gate of transistor 413 through segment L14. As shown, wiring W13 surrounds wiring W15 in the plan view.

Figure 30:
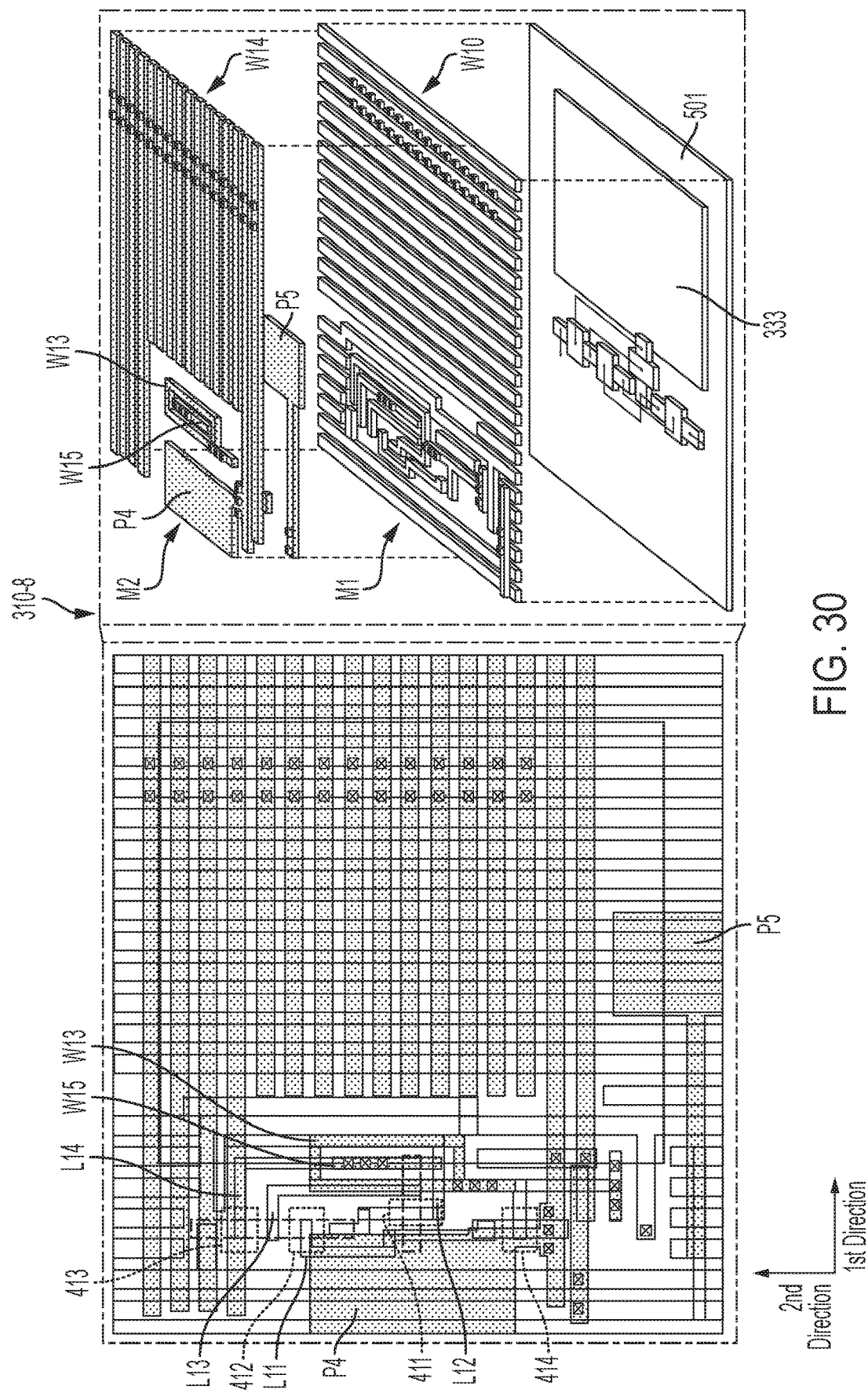
FIG. 30 illustrates a plan view and an exploded view of a pixel having an example wiring layout according to at least one example embodiment.

FIG. 30 illustrates a plan view and an exploded view of a pixel 310-8 having an example wiring layout according to at least one example embodiment. FIG. 30 includes many of the same elements in the same locations as in FIGS. 29A and 29B. Accordingly, a description of these elements will not be repeated. However, FIG. 30 illustrates that wirings W14 extend in the second direction, which may reduce cross talk between wiring levels M1 and M2 and/or create multiple pathways for the pixel 310-8 to connect to the logic chip 202.

Figure 31:
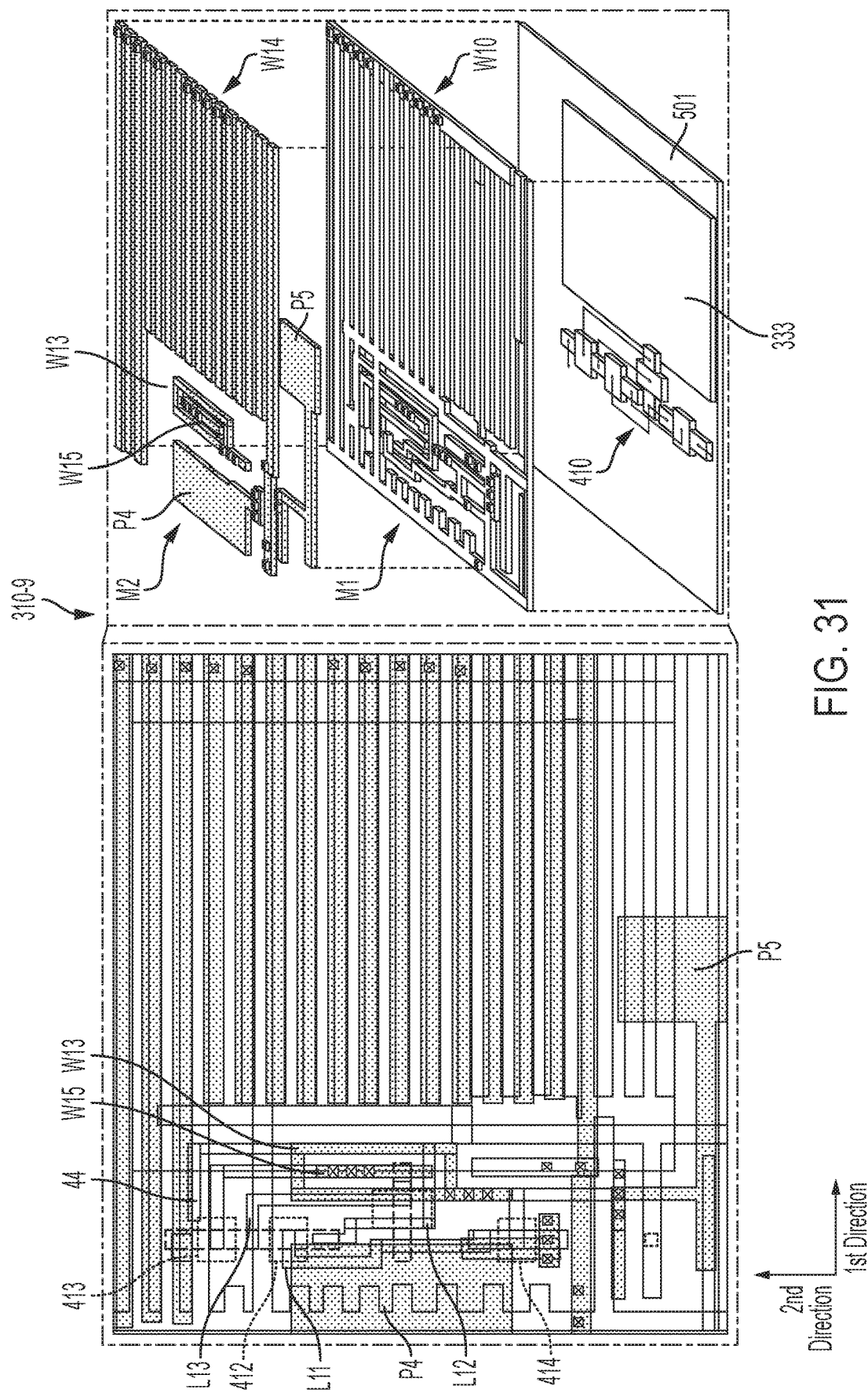
FIG. 31 illustrates a plan view and an exploded view of a pixel having an example wiring layout according to at least one example embodiment.

FIG. 31 illustrates a plan view and an exploded view of a pixel 310-9 having an example wiring layout according to at least one example embodiment. FIG. 31 includes many of the same elements in the same locations as in FIGS. 29A and 29B. Accordingly, a description of these elements will not be repeated. However, in FIG. 31, wirings W10 and W14 extend in the first direction. In this case, wirings W14 exist in spaces between wirings W10 to provide a light blocking function for the pixel 310-9.

Figure 32:
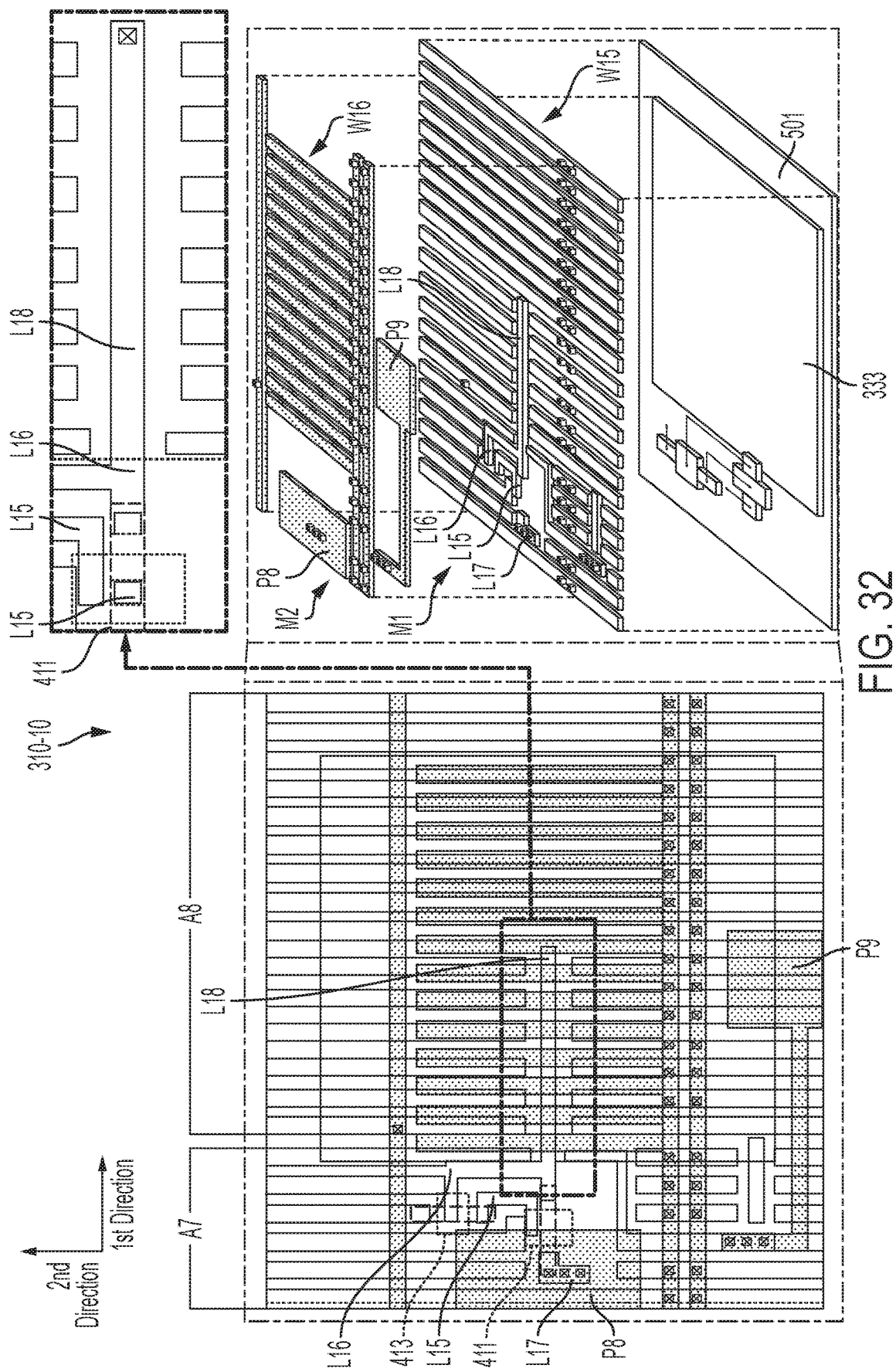
FIG. 32 illustrates a plan view and an exploded view of a pixel having an example wiring layout according to at least one example embodiment.

FIG. 32 illustrates a plan view and an exploded view of a pixel 310-10 having an example wiring layout according to at least one example embodiment. FIG. 32 illustrates an example where the source of the transistor 411 is electrically connected to a central region of the photoelectric conversion region 333. FIG. 32 includes a 2T configuration of transistors 411 and 413 laid out in the same or similar manner as that shown in FIGS. 23A-25.

As shown in FIG. 32, the pixel 310-10 includes a first level of wirings M1 and a second level of wirings M2. An arrangement A7 of wirings in M1 includes non-linear wiring segments L15, L16, L17, and L18 that overlap an area that includes the transistors 411 and 413, and an arrangement A8 includes wrings W10. For example, segment L15 overlaps and electrically connects with a gate of transistor 411 and a drain of transistor 413. The segment L16 overlaps and electrically connects with a gate of transistor 413, and electrically connects with a source of transistor 411 through segment L18. Segment L17 overlaps and electrically connects with a drain of transistor 411 and a pad P8 that receives a power supply signal through terminal VDD. Segment L18 is an extension of segment L16 that extends to a central region of the photoelectric conversion region 333 to electrically connect with the photoelectric conversion region 333 through a via V. In the example of FIG. 32, the wirings W15 and W16 extend in the second direction so that wirings W16 exist in spaces between wirings W15 to provide a light blocking function. However, example embodiments are not limited thereto and the M1 and M2 may be oriented in either of the first direction or the second direction depending on design choice.

Here it should be understood that FIGS. 23A-32 are not limited to the orientations of wirings in M1 and M2 that overlap the photoelectric conversion region 333, and that these wirings may be oriented in either of the first direction or the second direction depending on design choice.

Figure 33:
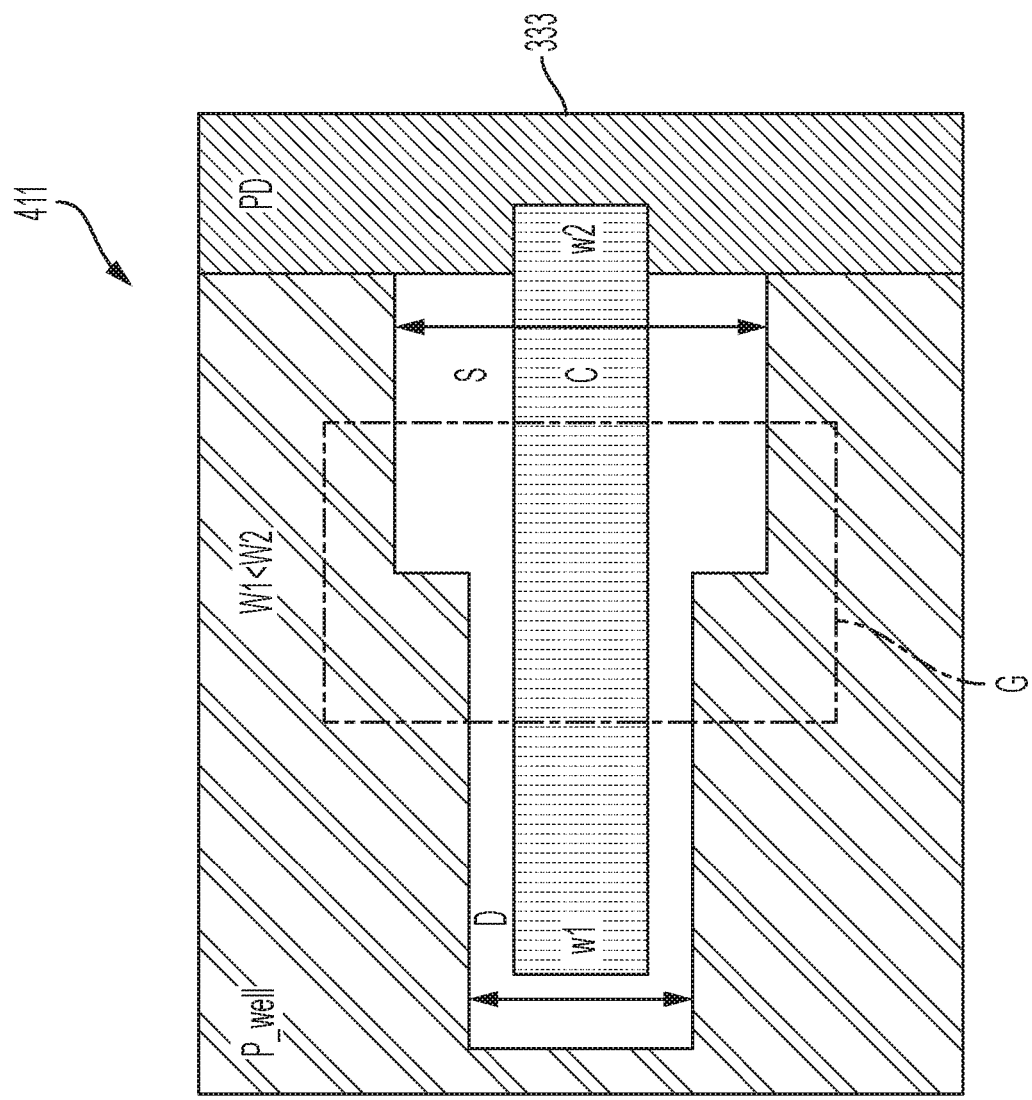
FIG. 33 illustrates an example structure of a transistor according to at least one example embodiment.

FIG. 33 illustrates an example structure of the transistor 411 according to at least one example embodiment. As illustrated in FIG. 33, a portion of the transistor 411 (e.g., a source S) that is coupled to the photoelectric conversion region 333 has a larger width W2 than a portion comprising the drain D of the transistor 411 having a width W1. FIG. 33 further illustrates that the portion at width W2 may extend underneath the gate G of the transistor 411. This structure for the transistor 411 may reduce dark current. The structure for the transistor 411 may be employed for one or more of the example embodiments described herein.

Figure 34:
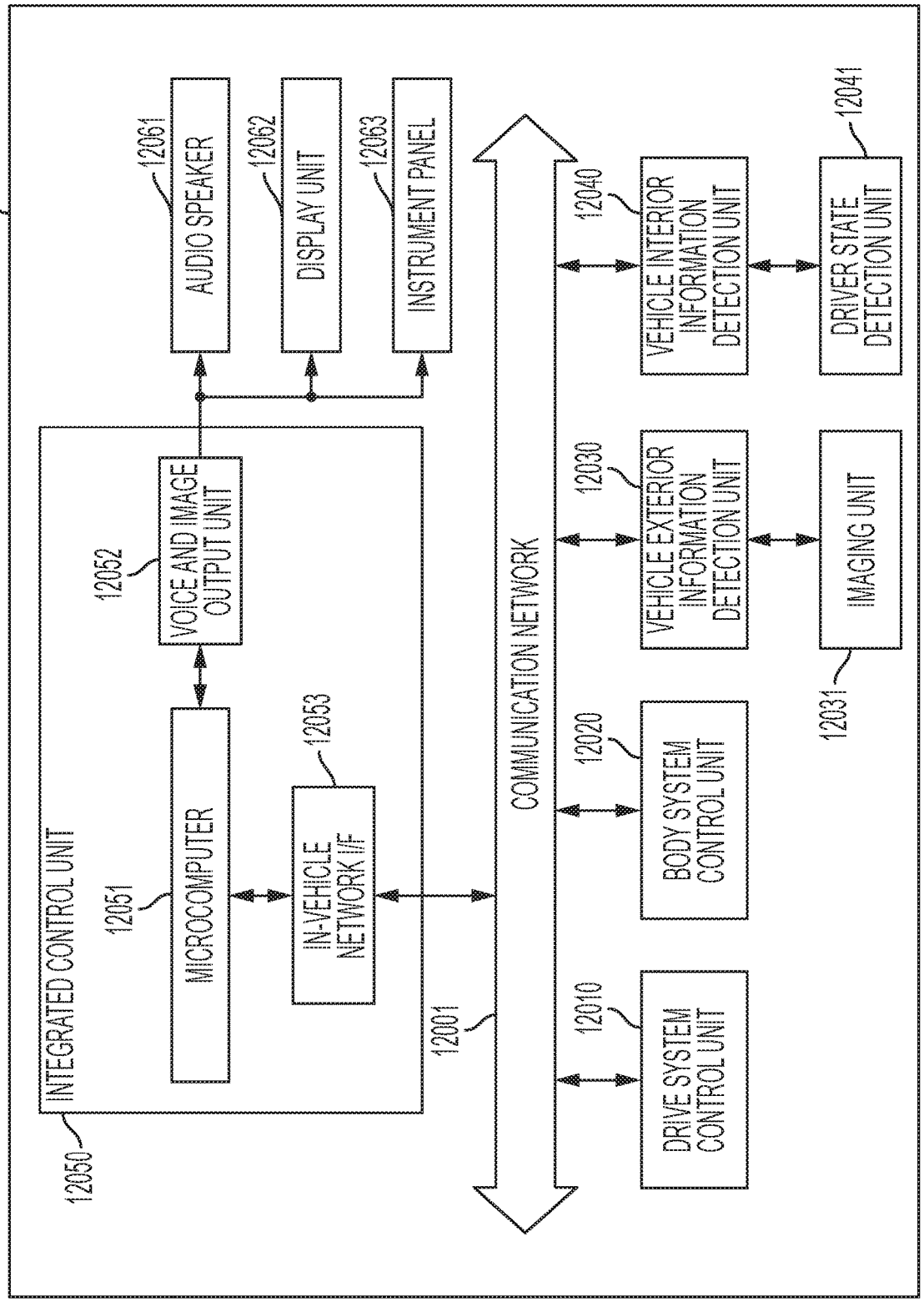
FIG. 34 is a block diagram illustrating an example of a schematic configuration of a vehicle control system.

FIG. 34 is a block diagram illustrating a schematic configuration example of a vehicle control system that is an example of a moving body control system to which the technology according to the present disclosure is applicable.

A vehicle control system 12000 includes a plurality of electronic control units which are connected to each other through a communication network 12001. In the example illustrated in FIG. 34, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an in-vehicle network I/F (interface) 12053 are illustrated in the drawing.

The drive system control unit 12010 controls an operation of a device relating to the drive system of the vehicle in accordance with various programs. For example, the drive system control unit 12010 functions as a control device of a drive force generation device such as an internal combustion engine and a drive motor which generate a drive force of the vehicle, a drive force transmission mechanism that transmits the drive force to wheels, a steering mechanism that adjusts a steering angle of the vehicle, and a braking device that generates a braking force of the vehicle, and the like.

The body system control unit 12020 controls an operation of various devices which are mounted to a vehicle body in accordance with various programs. For example, the body system control unit 12020 functions as a control device of a keyless entry system, a smart key system, a power window device, and various lamps such as a head lamp, a back lamp, a brake lamp, a blinker, and a fog lamp. In this case, an electric wave that is transmitted from a portable device that substitutes for a key, or signals of various switches can be input to the body system control unit 12020. The body system control unit 12020 receives input of the electric wave or the signals, and controls a door lock device, a power window device, a lamp, and the like of the vehicle.

The vehicle exterior information detection unit 12030 detects information regarding an outer side of the vehicle on which the vehicle control system 12000 is mounted. For example, an imaging unit 12031 is connected to the vehicle exterior information detection unit 12030. The vehicle exterior information detection unit 12030 allows the imaging unit 12031 to capture a vehicle exterior image, and receives the captured image. The vehicle exterior information detection unit 12030 may perform object detection processing of a person, a vehicle, an obstacle, a sign, a character on a load, or the like or distance detection processing on the basis of the image that is received.

The imaging unit 12031 is an optical sensor that receives light and outputs an electric signal corresponding to a light-reception amount. The imaging unit 12031 may output the electric signal as an image or as distance measurement information. In addition, light received by the imaging unit 12031 may be visible light, or invisible light such as infrared rays.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that images a driver, and the vehicle interior information detection unit 12040 may calculate the degree of fatigue or the degree of concentration of a driver on the basis of detection information that is input from the driver state detection unit 12041, or may determine whether or not the driver drowses.

The microcomputer 12051 calculates a control target value of the drive force generation device, the steering mechanism, or the braking device on the basis of vehicle interior or exterior information that is acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or impact mitigation of the vehicle, following travel based on an inter-vehicle distance, vehicle speed maintenance travel, vehicle collision alarm, vehicle lane deviation alarm, and the like.

In addition, the microcomputer 12051 can perform a cooperative control for automatic driving and the like in which the vehicle autonomously travels without depending on an operation of a driver by controlling the drive force generation device, the steering mechanism, the braking device, and the like on the basis of information in the vicinity of the vehicle which is acquired by the vehicle exterior information detection unit 12030 or the vehicle interior information detection unit 12040.

In addition, the microcomputer 12051 can output a control command to the body system control unit 12020 on the basis of the vehicle exterior information acquired by the vehicle exterior information detection unit 12030. For example, the microcomputer 12051 can perform a cooperative control to realize glare protection such as switching of a high beam into a low beam by controlling the head lamp in correspondence with a position of a preceding vehicle or an oncoming vehicle which is detected by the vehicle exterior information detection unit 12030.

The voice and image output unit 12052 transmits at least one output signal between a voice and an image to an output device capable of visually or aurally notifying a passenger in a vehicle or an outer side of the vehicle of information. In the example in FIG. 34, as the output device, an audio speaker 12061, a display unit 12062, and an instrument panel 12063 are exemplified. For example, the display unit 12062 may include at least one of an on-board display or a head-up display.

Figure 35:
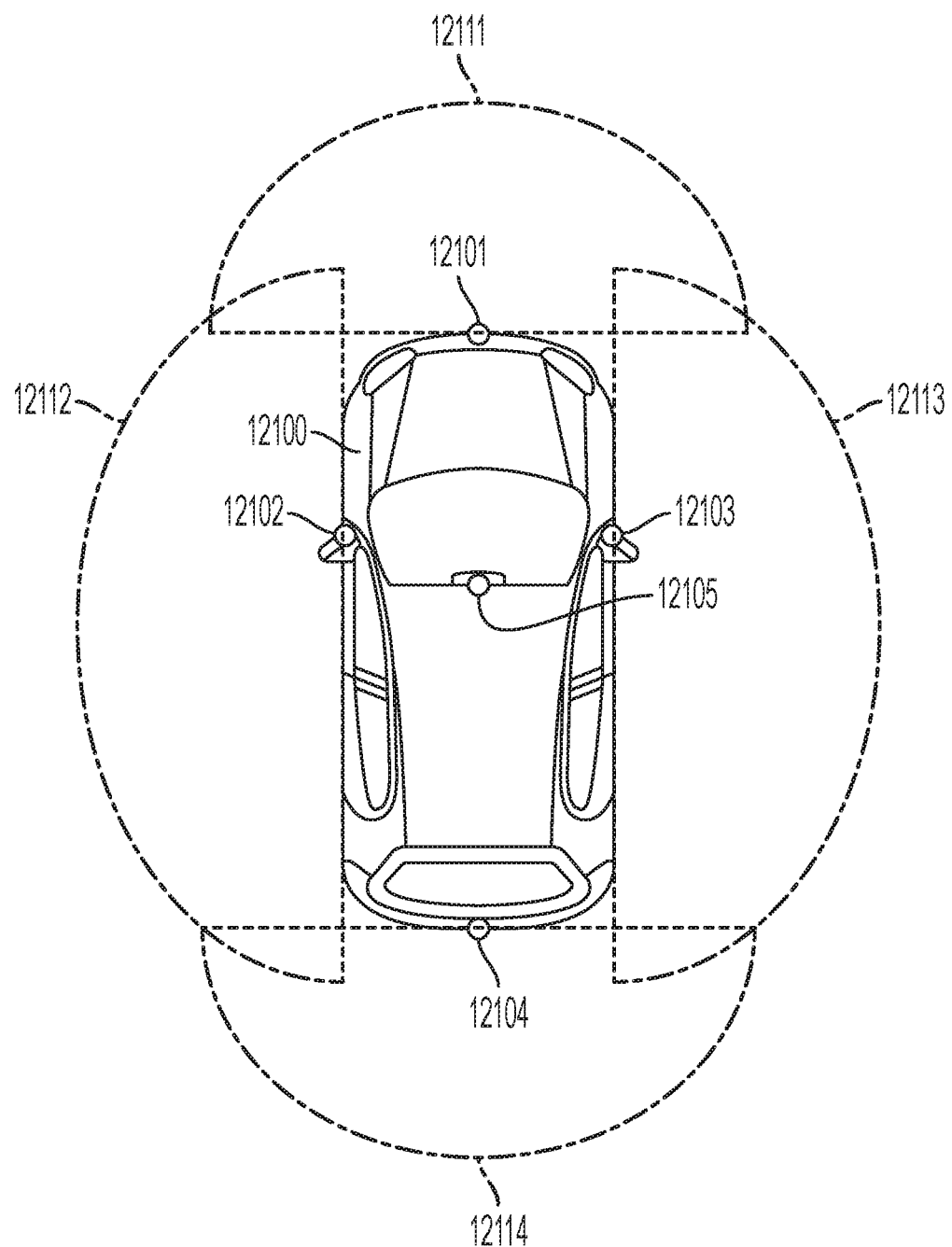
FIG. 35 is a view illustrating an example of an installation position of an out-of-vehicle information detection unit and an imaging unit.

FIG. 35 is a view illustrating an example of an installation position of the imaging unit 12031.

In FIG. 35, as the imaging unit 12031, imaging units 12101, 12102, 12103, 12104, and 12105 are provided.

For example, the imaging units 12101, 12102, 12103, 12104, and 12105 are installed at positions such as a front nose, a side-view mirror, a rear bumper, a back door, and an upper side of a windshield in a vehicle room, of the vehicle 12100. The imaging unit 12101 provided at the front nose, and the imaging unit 12105 that is provided on an upper side of the windshield in a vehicle room mainly acquire images on a forward side of the vehicle 12100. The imaging units 12102 and 12103 which are provided in the side-view mirror mainly acquire images on a lateral side of the vehicle 12100. The imaging unit 12104 that is provided in the rear bumper or the back door mainly acquires images on a backward side of the vehicle 12100. The imaging unit 12105 that is provided on an upper side of the windshield in the vehicle room can be mainly used to detect a preceding vehicle, a pedestrian, an obstacle, a traffic signal, a traffic sign, a vehicle lane, and the like.

Furthermore, FIG. 35 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view mirrors, an image capturing range 12114 represents an image capturing range of the imaging unit 12104 that is provided in the rear bumper or the back door. For example, when a plurality of pieces of image data captured by the imaging units 12101 to 12104 are superimposed on each other, it is possible to obtain an overlooking image when the vehicle 12100 is viewed from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform a cooperative control for automatic driving in which a vehicle autonomously travels without depending on an operation by a driver, and the like.

For example, the microcomputer 12051 can extract three-dimensional object data relating to a three-dimensional object by classifying a plurality of pieces of the three-dimensional object data into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult for the driver to visually recognize. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the driver through the audio speaker 12061 or the display unit 12062, or by performing compulsory deceleration or avoidance steering through the drive system control unit 12010.

At least one of the imaging units 12101 to 12104 may be an infrared camera that detects infrared rays. For example, the microcomputer 12051 can recognize a pedestrian by determining whether or not the pedestrian exists in images captured by the imaging units 12101 to 12104. For example, the pedestrian recognition is performed by a procedure of extracting a specific point in the images captured by the imaging units 12101 to 12104 as an infrared camera, and a procedure of performing pattern matching processing for a series of specific points indicating a contour line of an object to determine whether or not the object is a pedestrian. When the microcomputer 12051 determines that a pedestrian exists on the images captured by the imaging units 12101 to 12104, and recognizes the pedestrian, the voice and image output unit 12052 controls the display unit 12062 to overlap and display a quadrangular contour line for emphasis on the pedestrian who is recognized. In addition, the voice and image output unit 12052 may control the display unit 12062 to display an icon indicating the pedestrian or the like at a desired position.

Hereinbefore, description has been given of an example of the vehicle control system to which the technology according to the present disclosure is applicable. The technology according to the present disclosure is applicable to the imaging unit 12031, the driver state detection unit 12041, and the like among the above-described configurations.

Hereinbefore, embodiments of the present disclosure have been described, but the technical range of the present disclosure is not limited to the above-described embodiments, and various modifications can be made in a range not departing from the gist of the present disclosure. In addition, constituent elements in other embodiments and modification examples may be appropriately combined. Further, various embodiments may be combined with one another if desired.

In addition, the effects in the embodiments described in this specification are illustrative only, and other effects may exist without limitation.

Furthermore, the present technology can employ the following configurations.

(1) An imaging device, comprising:
 a first pixel including a first photoelectric conversion region disposed in a first substrate and that converts incident light into first electric charges;
 a first readout circuit including a first converter that converts the first electric charges into a first logarithmic voltage signal, the first converter including a first transistor coupled to the first photoelectric conversion region and a second transistor coupled to the first transistor; and
 a wiring layer on the first substrate and including a first level of wirings arranged in a first arrangement overlapping the first photoelectric conversion region and in a second arrangement overlapping the first and second transistors, the second arrangement being different than the first arrangement.

(2) The imaging device of (1), wherein a first capacitance exists between a first node coupled to the first photoelectric conversion region and a second node coupled to the first photoelectric conversion region, wherein a second capacitance exists at least between the first node and a third node that is coupled to the first and second transistors, and wherein the second arrangement achieves a desired ratio of the second capacitance to the first capacitance.

(3) The imaging device of one or more of (1) to (2), wherein the desired ratio of the second capacitance to the first capacitance is about 0.32.

(4) The imaging device of one or more of (1) to (3), wherein the first node is between a cathode of the photoelectric conversion region and the first transistor, wherein the second node is between an anode of the photoelectric conversion region and a common node that receives a potential, and wherein the third node is between a gate of the first transistor and the second transistor.

(5) The imaging device of one or more of (1) to (4), wherein the potential is a negative potential, wherein a source of the first transistor is coupled to the first photoelectric conversion region, and wherein the source is wider than a drain of the first transistor in a plan view.

(6) The imaging device of one or more of (1) to (5), wherein the first arrangement includes linear wiring segments positioned at regular intervals that extend in a first direction or a second direction perpendicular to the first direction, and wherein the second arrangement includes one or more non-linearly shaped wiring segments.

(7) The imaging device of one or more of (1) to (6), wherein the one or more non-linearly shaped segments include a first non-linearly shaped segment overlapping a gate of the first transistor and a drain of the second transistor, and a second non-linearly shaped segment overlapping a drain of the first transistor and a gate of the second transistor.

(8) The imaging device of one or more of (1) to (7), wherein the wiring layer further comprises:
 a second level of wirings that overlap the first pixel, the second level of wirings including third wirings that overlap the first photoelectric conversion region and that extend in the first direction or the second direction.

(9) The imaging device of one or more of (1) to (8), further comprising:
 a second substrate bonded to the first substrate and including a logic circuit for processing the first logarithmic voltage signal, wherein the first wirings of the first level of wirings and the third wirings of the second level of shield the second substrate from light that has passed through the photoelectric conversion region.

(10) The imaging device of one or more of (1) to (9), wherein, in a plan view, the third wirings exist in spaces between the first wirings.

(11) The imaging device of one or more of (1) to (10), wherein the first converter further comprises:
 a third transistor and a fourth transistor.

(12) The imaging device of one or more of (1) to (11), wherein the first level of wirings and the second level of wirings receive at least one signal for the first converter.

(13) The imaging device of one or more of (1) to (12), wherein the at least one signal includes one or more of a power supply signal, a ground signal, and a common signal with a negative potential.

(14) The imaging device of one or more of (1) to (13), further comprising:
 a second pixel including a second photoelectric conversion region disposed in the first substrate and that converts incident light into second electric charges;
 a second readout circuit including a second converter that converts the second electric charges into a second logarithmic voltage signal, the second converter including a third transistor coupled to the second photoelectric conversion region and a fourth transistor coupled to the third transistor, wherein a third capacitance exists between a fourth node coupled to the second photoelectric conversion region and a fifth node coupled to the second photoelectric conversion region, and wherein a fourth capacitance exists between the fourth node and a sixth node that is coupled to the third and fourth transistors; and an isolation structure between the first pixel and the second pixel,
wherein the first level of wirings overlap the second pixel and are arranged to achieve a desired ratio of the third capacitance to the fourth capacitance.

(15) An imaging device, comprising:
a first pixel including a first photoelectric conversion region disposed in a first substrate and that converts incident light into first electric charges;
a first readout circuit including a first converter that converts the first electric charges into a first logarithmic voltage signal, the first converter including a first transistor coupled to the first photoelectric conversion region and a second transistor coupled to the first transistor; and
a wiring layer on the first substrate and including a first level of wirings, the first level of wirings including a first wiring arrangement including linearly shaped wiring segments overlapping the first photoelectric conversion region, and a second wiring arrangement including one or more non-linearly shaped wiring segments overlapping the first and second transistors.

(16) The imaging device of (15), wherein the linearly shaped wiring segments are arranged at regular intervals and extend in a first direction or a second direction perpendicular to the first direction.

(17) The imaging device of one or more of (15) to (16), wherein the wiring layer further comprises:
a second level of wirings further away from the first photoelectric conversion region than the first level of wirings and overlapping spaces between the first level of wirings.

(18) The imaging device of one or more of (15) to (17), wherein the second wiring arrangement makes electrical connections to the first and second transistors.

(19) The imaging device of one or more of (15) to (18), further comprising:
a second substrate bonded to the first substrate, the second substrate including a logic circuit electrically connected to the first converter through the first level of wirings.

(20) An imaging device, comprising:
a first substrate including a first pixel, the first pixel including:
a first photoelectric conversion region disposed in the first substrate and that converts incident light into first electric charges; and
a first readout circuit including a first converter that converts the first electric charges into a first logarithmic voltage signal, the first converter including a first transistor coupled to the first photoelectric conversion region and a second transistor coupled to the first transistor;
a wiring layer on the first substrate and including a first level of wirings arranged in a first arrangement overlapping the first photoelectric conversion region and in a second arrangement overlapping the first and second transistors, the second arrangement being different than the first arrangement; and
a second substrate bonded to the first substrate and including a logic circuit for processing the first logarithmic voltage signal.

It is claimed:

1. An imaging device, comprising:
a first pixel including a first photoelectric conversion region disposed in a first substrate and that converts incident light into first electric charges;
a first readout circuit including a first converter that converts the first electric charges into a first logarithmic voltage signal, the first converter including a first transistor coupled to the first photoelectric conversion region and a second transistor coupled to the first transistor; and
a wiring layer on the first substrate and including a first level of wirings laid out in a first arrangement overlapping the first photoelectric conversion region in a plan view and laid out in a second arrangement overlapping the first and second transistors in the plan view, the second arrangement being different than the first arrangement.

2. The imaging device of claim 1, wherein a first capacitance exists between a first node coupled to the first photoelectric conversion region and a second node coupled to the first photoelectric conversion region, wherein a second capacitance exists at least between the first node and a third node that is coupled to the first and second transistors, and wherein the second arrangement achieves a desired ratio of the second capacitance to the first capacitance.

3. The imaging device of claim 2, wherein the desired ratio of the second capacitance to the first capacitance is about 0.32.

4. The imaging device of claim 2, wherein the first node is between a cathode of the photoelectric conversion region and the first transistor, and wherein the second node is between an anode of the photoelectric conversion region and a common node that receives a potential, and wherein the third node is between a gate of the first transistor and the second transistor.

5. The imaging device of claim 4, wherein the potential is a negative potential, wherein a source of the first transistor is coupled to the first photoelectric conversion region, and wherein the source is wider than a drain of the first transistor in the plan view.

6. The imaging device of claim 1, wherein the first arrangement includes linear wiring segments positioned at regular intervals that extend in a first direction or a second direction perpendicular to the first direction, and wherein the second arrangement includes one or more non-linearly shaped wiring segments.

7. The imaging device of claim 6, wherein the one or more non-linearly shaped segments include a first non-linearly shaped segment overlapping a gate of the first transistor and a drain of the second transistor, and a second non-linearly shaped segment overlapping a drain of the first transistor and a gate of the second transistor.

8. The imaging device of claim 1, wherein the wiring layer further comprises:
a second level of wirings that overlap the first pixel, the second level of wirings including third wirings that overlap the first photoelectric conversion region and that extend in the first direction or the second direction.

9. The imaging device of claim 8, further comprising:
a second substrate bonded to the first substrate and including a logic circuit for processing the first logarithmic voltage signal, wherein the first wirings of the first level of wirings and the third wirings of the second level of wirings shield the second substrate from light that has passed through the photoelectric conversion region.

10. The imaging device of claim 9, wherein, in the plan view, the third wirings exist in spaces between the first wirings.

11. The imaging device of claim 9, wherein the first converter further comprises:
a third transistor and a fourth transistor.

12. The imaging device of claim 11, wherein the first level of wirings and the second level of wirings receive at least one signal for the first converter.

13. The imaging device of claim 12, wherein the at least one signal includes one or more of a power supply signal, a ground signal, and a common signal with a negative potential.

14. The imaging device of claim 1, further comprising:
a second pixel including a second photoelectric conversion region disposed in the first substrate and that converts incident light into second electric charges;
a second readout circuit including a second converter that converts the second electric charges into a second logarithmic voltage signal, the second converter including a third transistor coupled to the second photoelectric conversion region and a fourth transistor coupled to the third transistor, wherein a third capacitance exists between a fourth node coupled to the second photoelectric conversion region and a fifth node coupled to the second photoelectric conversion region, and wherein a fourth capacitance exists between the fourth node and a sixth node that is coupled to the third and fourth transistors; and
an isolation structure between the first pixel and the second pixel,
wherein the first level of wirings overlap the second pixel and are arranged to achieve a desired ratio of the third capacitance to the fourth capacitance.

15. An imaging device, comprising:
a first pixel including a first photoelectric conversion region disposed in a first substrate and that converts incident light into first electric charges;
a first readout circuit including a first converter that converts the first electric charges into a first logarithmic voltage signal, the first converter including a first transistor coupled to the first photoelectric conversion region and a second transistor coupled to the first transistor; and
a wiring layer on the first substrate and including a first level of wirings, the first level of wirings including a first wiring arrangement including linearly shaped wiring segments overlapping the first photoelectric conversion region, and a second wiring arrangement including one or more non-linearly shaped wiring segments overlapping the first and second transistors.

16. The imaging device of claim 15, wherein the linearly shaped wiring segments are arranged at regular intervals and extend in a first direction or a second direction perpendicular to the first direction.

17. The imaging device of claim 16, wherein the wiring layer further comprises:
a second level of wirings further away from the first photoelectric conversion region than the first level of wirings and overlapping spaces between the first level of wirings.

18. The imaging device of claim 15, wherein the second wiring arrangement makes electrical connections to the first and second transistors.

19. The imaging device of claim 15, further comprising:
a second substrate bonded to the first substrate, the second substrate including a logic circuit electrically connected to the first converter through the first level of wirings.

20. An imaging device, comprising:
a first substrate including a first pixel, the first pixel including:
a first photoelectric conversion region disposed in the first substrate and that converts incident light into first electric charges; and
a first readout circuit including a first converter that converts the first electric charges into a first logarithmic voltage signal, the first converter including a first transistor coupled to the first photoelectric conversion region and a second transistor coupled to the first transistor;
a wiring layer on the first substrate and including a first level of wirings laid out in a first arrangement overlapping the first photoelectric conversion region in a plan view and laid out in a second arrangement overlapping the first and second transistors in the plan view, the second arrangement being different than the first arrangement; and
a second substrate bonded to the first substrate and including a logic circuit for processing the first logarithmic voltage signal.

* * * * *